US007732002B2

(12) United States Patent
Kodas et al.

(10) Patent No.: US 7,732,002 B2
(45) Date of Patent: Jun. 8, 2010

(54) METHOD FOR THE FABRICATION OF CONDUCTIVE ELECTRONIC FEATURES

(75) Inventors: Toivo T. Kodas, Albuquerque, NM (US); Mark J. Hampden-Smith, Albuquerque, NM (US); Karel Vanheusden, Placitas, NM (US); Hugh Denham, Albuquerque, NM (US); Aaron D. Stump, Albuquerque, NM (US); Allen B. Schult, Albuquerque, NM (US); Paolina Atanassova, Albuquerque, NM (US); Klaus Kunze, Half Moon Bay, CA (US)

(73) Assignee: Cabot Corporation, Boston, MA (US)

( * ) Notice: Subject to any disclaimer, the term of this patent is extended or adjusted under 35 U.S.C. 154(b) by 1595 days.

(21) Appl. No.: 10/274,495

(22) Filed: Oct. 18, 2002

(65) Prior Publication Data

US 2010/0112195 A1 May 6, 2010

Related U.S. Application Data

(60) Provisional application No. 60/348,223, filed on Oct. 19, 2001.

(51) Int. Cl.
*B05D 5/12* (2006.01)
*B05D 3/00* (2006.01)
*C23C 8/00* (2006.01)

(52) U.S. Cl. .................. 427/58; 427/123; 427/124; 427/125; 427/561; 427/585

(58) Field of Classification Search .................. 427/58, 427/561, 584, 585, 123–126.6
See application file for complete search history.

(56) References Cited

U.S. PATENT DOCUMENTS

| | | | |
|---|---|---|---|
| 3,313,632 A | 4/1967 | Langley et al. ................ 106/1 |
| 3,683,382 A | 8/1972 | Ballinger ..................... 346/74 |
| 4,105,483 A | 8/1978 | Lin ............................. 156/154 |
| 4,122,062 A | 10/1978 | Monte et al. ............. 260/42.14 |
| 4,130,671 A | 12/1978 | Nagesh et al. ............. 427/125 |
| 4,211,668 A | 7/1980 | Tate ........................... 252/316 |
| 4,255,291 A | 3/1981 | Needes et al. .............. 252/578 |
| 4,333,966 A | 6/1982 | Deffeyes et al. ............. 427/96 |
| 4,381,945 A | 5/1983 | Nair ......................... 106/1.14 |
| 4,407,674 A | 10/1983 | Ehrreich ..................... 75/251 |
| 4,416,932 A | 11/1983 | Nair ........................... 428/209 |
| 4,418,099 A | 11/1983 | Cuevas et al. .............. 427/229 |
| 4,419,383 A | 12/1983 | Lee ............................. 427/47 |
| 4,463,030 A | 7/1984 | Deffeyes et al. ............ 427/216 |
| 4,487,811 A | 12/1984 | Eichelberger et al. ....... 428/546 |
| 4,517,252 A | 5/1985 | Hugh ......................... 428/553 |
| 4,539,041 A | 9/1985 | Figlarz et al. ................ 75/0.5 |
| 4,548,879 A | 10/1985 | St. John et al. ............... 427/96 |
| 4,599,277 A | 7/1986 | Brownlow et al. .......... 428/552 |
| 4,650,108 A | 3/1987 | Gallagher ................... 228/124 |
| 4,775,439 A | 10/1988 | Seeger, Jr. et al. .......... 156/231 |
| 4,808,274 A | 2/1989 | Nguyen ....................... 204/15 |
| 4,859,241 A | 8/1989 | Grundy ..................... 106/1.14 |
| 4,891,242 A | 1/1990 | Ito et al. .................... 437/53.1 |
| 4,931,323 A | 6/1990 | Manitt et al. .............. 427/53.1 |
| 4,948,623 A | 8/1990 | Beach et al. ................. 427/35 |
| 4,959,430 A | 9/1990 | Jonas et al. ................ 526/257 |
| 5,028,473 A | 7/1991 | Vitriol et al. ............... 428/137 |
| 5,039,552 A | 8/1991 | Riemer ........................ 427/96 |
| 5,045,141 A | 9/1991 | Salensky et al. ........... 156/240 |
| 5,049,434 A | 9/1991 | Wasulko .................... 428/202 |
| 5,057,363 A | 10/1991 | Nakanishi ................ 428/321.5 |
| 5,059,242 A | 10/1991 | Firmstone et al. ......... 106/1.23 |
| 5,075,262 A | 12/1991 | Nguyen et al. ............... 501/19 |
| 5,121,127 A | 6/1992 | Toriyama .................... 343/700 |
| 5,139,818 A | 8/1992 | Mance ...................... 427/54.1 |
| 5,153,023 A | 10/1992 | Orlowski et al. ........... 427/555 |
| 5,173,330 A | 12/1992 | Asano et al. ............... 427/558 |
| 5,176,744 A | 1/1993 | Muller ...................... 106/1.26 |
| 5,183,784 A | 2/1993 | Nguyen et al. ............... 501/19 |
| 5,216,207 A | 6/1993 | Prabhu et al. ............. 174/256 |
| 5,244,538 A | 9/1993 | Kumar ...................... 156/643 |
| 5,250,229 A | 10/1993 | Hara et al. ................. 252/518 |
| 5,312,480 A | 5/1994 | Lotze et al. ............... 106/1.13 |
| 5,312,674 A | 5/1994 | Haertling et al. ........... 428/210 |
| 5,332,646 A | 7/1994 | Wright et al. .............. 430/137 |
| 5,366,760 A | 11/1994 | Fujii et al. ................... 427/96 |

(Continued)

FOREIGN PATENT DOCUMENTS

EP 1 323 793 7/2003

(Continued)

OTHER PUBLICATIONS

ITT Cuts Costs of PC Board Manufacturing, Kenneth Dreyfack, Electronics, vol. 52, No. 17, (Aug. 16, 1979).
Preparation of Colloidal Silver Dispersions by the Polyal Process Part 2—Mechanism of Particle Formation, Silvert et al. (J. Mater. Chem, 1997, 7(2), pp. 293-299).
"Advanced Materials Systems for Ultra-Low-Temperature, Digital, Direct-Write Technologies, Digital, Direct Write Technologies", Vanheusden et al.; in Direct-Write Technologies for Rapid Prototyping Applications, pp. 123-173 (Oct. 2001).
Liquid Ink Jet Printing With MOD Inks for Hybrid Microcircuits K.F. Teng, and Robert W. Vest, IEEE Transactions on Components, Hybrids and Manufacturing Technology, vol. CHMT-12(4), 545-549 (1987).

(Continued)

*Primary Examiner*—Brian K Talbot
(74) *Attorney, Agent, or Firm*—Marsh Fischmann & Breyfogle LLP

(57) ABSTRACT

Precursor compositions in the form of a tape that can be transferred to a substrate and converted to an electronic feature at a relatively low temperature, such as not greater than about 200° C. The tape composition can be disposed on a carrier to form a ribbon structure that is flexible and can be handled in a variety of industrial processes.

37 Claims, No Drawings

U.S. PATENT DOCUMENTS

| | | | |
|---|---|---|---|
| 5,378,408 A | 1/1995 | Carroll et al. | 252/514 |
| 5,378,508 A | 1/1995 | Castro et al. | 427/556 |
| 5,395,452 A | 3/1995 | Kobayashi et al. | 118/715 |
| 5,421,926 A | 6/1995 | Yukinobu et al. | 156/83 |
| 5,433,893 A | 7/1995 | Jost et al. | 252/514 |
| 5,444,453 A | 8/1995 | Lalezari | 343/700 |
| 5,463,057 A | 10/1995 | Graetzel et al. | 546/4 |
| 5,494,550 A | 2/1996 | Benge | 156/268 |
| 5,599,046 A | 2/1997 | Behm et al. | 283/83 |
| 5,601,638 A | 2/1997 | Fukuda et al. | 106/19 |
| 5,604,027 A | 2/1997 | Sheridon | 428/323 |
| 5,604,673 A | 2/1997 | Washburn et al. | 363/147 |
| 5,645,932 A | 7/1997 | Uchibori | 428/347 |
| 5,665,472 A | 9/1997 | Tanaka et al. | 428/402 |
| 5,712,673 A | 1/1998 | Hayashi et al. | 347/217 |
| 5,716,663 A | 2/1998 | Capote et al. | 427/96 |
| 5,767,810 A | 6/1998 | Hagiwara et al. | 343/700 |
| 5,781,158 A | 7/1998 | Ko et al. | 343/700 |
| 5,801,108 A | 9/1998 | Huang et al. | 501/32 |
| 5,826,329 A * | 10/1998 | Roth | 29/846 |
| 5,828,271 A | 10/1998 | Stitzer | 333/24.1 |
| 5,846,615 A | 12/1998 | Sharma et al. | 427/597 |
| 5,882,722 A * | 3/1999 | Kydd | 427/98.4 |
| 5,894,038 A | 4/1999 | Sharma et al. | 427/554 |
| 5,909,083 A | 6/1999 | Asano et al. | 313/584 |
| 5,930,026 A | 7/1999 | Jacobson et al. | 359/296 |
| 5,932,280 A * | 8/1999 | Roth | 427/102 |
| 5,953,037 A | 9/1999 | Hayashi et al. | 347/172 |
| 5,992,320 A | 11/1999 | Kosaka et al. | 101/401.1 |
| 5,997,044 A | 12/1999 | Behm et al. | 283/83 |
| 5,998,085 A | 12/1999 | Isberg et al. | 430/200 |
| 6,019,926 A | 2/2000 | Southward et al. | 264/216 |
| 6,025,026 A | 2/2000 | Smith et al. | 427/316 |
| 6,027,762 A | 2/2000 | Tomita et al. | 427/96 |
| 6,036,889 A * | 3/2000 | Kydd | 252/512 |
| 6,074,725 A | 6/2000 | Kennedy | 428/188 |
| 6,103,393 A | 8/2000 | Kodas et al. | 428/570 |
| 6,124,851 A | 9/2000 | Jacobson | 345/206 |
| 6,133,147 A | 10/2000 | Rhee et al. | 438/677 |
| 6,143,356 A | 11/2000 | Jablonski | 427/96 |
| 6,177,151 B1 | 1/2001 | Chrisey et al. | 427/596 |
| 6,197,366 B1 | 3/2001 | Takamatsu | 427/125 |
| 6,200,405 B1 | 3/2001 | Nakazawa et al. | 156/248 |
| 6,207,268 B1 | 3/2001 | Kosaka et al. | 428/325 |
| 6,214,520 B1 | 4/2001 | Wolk et al. | 430/273.1 |
| 6,238,734 B1 | 5/2001 | Senzaki et al. | 427/226 |
| 6,274,412 B1 | 8/2001 | Kydd et al. | 438/149 |
| 6,294,401 B1 | 9/2001 | Jacobson et al. | 438/99 |
| 6,317,023 B1 | 11/2001 | Felten | 338/254 |
| 6,329,899 B1 | 12/2001 | Hunt et al. | 338/308 |
| 6,338,809 B1 | 1/2002 | Hampden-Smith et al. | 264/7 |
| 6,372,158 B1 | 4/2002 | Hashimoto et al. | 252/514 |
| 6,379,742 B1 | 4/2002 | Behm et al. | 427/7 |
| 6,379,745 B1 | 4/2002 | Kydd et al. | 427/96 |
| 6,395,053 B1 | 5/2002 | Fau et al. | 75/362 |
| 6,399,230 B1 | 6/2002 | Tormey et al. | 428/702 |
| 6,402,579 B1 | 6/2002 | Pichler et al. | 445/24 |
| 6,410,201 B2 | 6/2002 | Wolk et al. | 430/200 |
| 6,433,358 B1 | 8/2002 | Beierlein | 257/40 |
| 6,503,831 B2 | 1/2003 | Speakman | 438/674 |
| 6,892,441 B2 * | 5/2005 | Debraal | 29/601 |
| 7,045,015 B2 * | 5/2006 | Renn et al. | 118/686 |
| 2002/0058143 A1 | 5/2002 | Hunt et al. | 428/412 |
| 2002/0150678 A1 | 10/2002 | Cramer et al. | 427/212 |
| 2002/0151161 A1 | 10/2002 | Furusawa | 438/597 |
| 2003/0070569 A1 | 4/2003 | Bulthaup et al. | 101/127 |
| 2003/0073042 A1 | 4/2003 | Cernigliaro et al. | 430/321 |
| 2003/0082485 A1 | 5/2003 | Bulthaup et al. | 430/312 |
| 2003/0096056 A1 | 5/2003 | Kawamura et al. | 427/66 |
| 2003/0108664 A1 | 6/2003 | Kodas et al. | 427/125 |
| 2003/0124259 A1 | 7/2003 | Kodas et al. | 427/376.6 |
| 2003/0148024 A1 | 8/2003 | Kodas et al. | 427/125 |
| 2003/0161959 A1 | 8/2003 | Kodas et al. | 427/376.2 |
| 2003/0175411 A1 | 9/2003 | Kodas et al. | 427/58 |
| 2003/0180451 A1 | 9/2003 | Kodas et al. | 427/123 |
| 2005/0156991 A1* | 7/2005 | Renn | 347/21 |

FOREIGN PATENT DOCUMENTS

| | | | |
|---|---|---|---|
| JP | 63278983 | | 5/1987 |
| JP | 2000-011875 | | 1/2000 |
| JP | 2000-182889 | | 6/2000 |
| WO | WO 98/37133 | | 8/1998 |
| WO | WO 99/16601 | | 4/1999 |
| WO | WO 00/29208 | | 5/2000 |
| WO | WO 00/69235 | | 11/2000 |
| WO | WO 00/72224 | | 11/2000 |
| WO | WO-0072224 | * | 11/2000 |
| WO | WO 01/54203 | | 7/2001 |
| WO | WO 01/56736 A2 | | 8/2001 |
| WO | WO 01/82315 | | 11/2001 |
| WO | WO 01/87503 | | 11/2001 |
| WO | WO 03/018645 | | 3/2003 |

OTHER PUBLICATIONS

"Physical Mechanisms Governing Pattern Fidelity in Microscale Offset Printing"; Darhuber et al.; Journal of Applied Physics; vol. 90, No. 7; pp. 3602-3609; Oct. 2001.

"Site Selective Copper and Silver Electroless Metallization Facilitated by a Photolithographically Patterned Hydrogen Silsesquioxane Mediated Seed Layer"; Harness et al.; American Chemical Society.

* cited by examiner

METHOD FOR THE FABRICATION OF CONDUCTIVE ELECTRONIC FEATURES

CROSS-REFERENCE TO RELATED APPLICATIONS

This application claims the benefit of U.S. Provisional Application No. 60/348,223 filed Oct. 19, 2001, the disclosure of which is incorporated herein by reference in its entirety.

BACKGROUND OF THE INVENTION

1. Field of the Invention

The present invention relates to precursor compositions in the form of a tape that are useful for the deposition of electronic features such as conductors, resistors and dielectrics by transferring the tape to a substrate. The tape materials can also have a low conversion temperature to enable low-temperature treatment of the tape to form electronic features on a variety of substrates. The tape compositions can also be disposed on a carrier to form a mechanically robust ribbon structure.

2. Description of Related Art

The electronics, display and energy industries rely on the formation of coatings and patterns of various materials such as conductors, dielectrics and resistors, to form circuits on organic and inorganic substrates. The primary methods for generating these patterns are screen printing for features larger than about 100 µm and thin film and etching methods for features smaller than about 100 µm. Other subtractive methods to attain fine feature sizes include photo-patternable pastes and laser trimming.

Another method that is known in the art is the transfer of material from one surface (a carrier) to another surface (a substrate) by some force, such as mechanical force.

For example, U.S. Pat. Nos. 6,177,151 by Chrisey et al. and 6,025,026 by Smith et al. disclose the use of laser transfer from a tape to fabricate a variety of electronic end products. The tape includes a composition that increases in volatility during transfer.

U.S. Pat. No. 5,645,932 by Uchibori discloses the use of a tape with an adhesive to attach conducting layers with stamping for patterning. A method to overcome the need for etching to provide layers is also disclosed.

U.S. Pat. No. 5,494,550 by Benge discloses a web driven approach for handling of tape. U.S. Pat. No. 5,211,984 by Wilson discloses decals and decal transfer methods for fuel cell component assembly. The decals are formed on a surface with a release layer and then laminated to another surface and separated from the backing. U.S. Pat. No. 4,826,554 by McIntyre et al. discloses methods for laminating to make fuel cell layers. U.S. Pat. No. 4,383,010 by Spaepen discloses rolling methods to make coatings for fuel cells and the like.

U.S. Pat. No. 6,207,268 by Kosaka et al. discloses a transfer sheet including a thermoplastic resin, a protective cover and a release layer. A resist is used to obtain patterns. The use of laser transfer and thermal heads is also disclosed.

U.S. Pat. No. 6,214,520 by Wolk et al. discloses thermal transfer and laser transfer for electroluminescent (EL) lamp manufacture. Light is used to heat a conversion layer to accomplish transfer. Conductor compositions disclosed include ATO, ITO, carbon and graphite.

U.S. Pat. No. 5,932,280 by Roth discloses thermally active coatings on ribbon. Transfer to a printed circuit board is accomplished by thermal processing. The use of precursors in the coating is not disclosed.

U.S. Pat. No. 5,826,329 by Roth discloses polymer thick film conductors formed from tape. U.S. Pat. No. 5,909,083 by Asano et al. discloses patterning tapes by etching through masks, particularly for glasses in plasma display applications. U.S. Pat. No. 5,992,320 by Kosaka et al. discloses transfer sheets and the details of their construction. U.S. Pat. No. 5,712,673 by Hayashi et al. discloses color transfer sheets. U.S. Pat. No. 4,105,483 by Lin discloses the transfer of material from printed paper. A solvent is applied, pressure is applied, and material is dissolved and removed to achieve transfer.

U.S. Pat. No. 5,665,472 by Tanaka et al. discloses the use of Bi—B—Si—O glass tapes and hot melt tape transfer to form patterns for plasma displays.

U.S. Pat. No. 5,998,085 by Isberg et al. discloses organic electroluminescent lamp fabrication methods. The deposition of phosphors by laser transfer is disclosed. Optional interlayers, thermal transfer layers and adhesive coatings are also disclosed.

U.S. Pat. No. 6,074,725 by Kennedy discloses applications of tape fabrication in microfluidics. Laminates are formed comprising structures between channels. The structures can be printed by laser, screen printing, ink-jet printing, precursor chemistry, and other approaches.

U.S. Pat. No. 5,953,037 by Hayashi et al. discloses tapes for color applications.

There is a need for compositions that provide electronic materials at low processing temperatures to allow deposition of the materials onto organic substrates with a fine minimum feature size, such as less than 200 µm, while still providing electronic features with adequate properties.

Precursor compositions for electronic materials such as conductors have been described by R. W. Vest (Metallo-Organic Materials for Improved Thick Film Reliability, Nov. 1, 1980, Final Report, Contract #N00163-79-C-0352, National Avionic Center). The compositions disclosed by Vest included a precursor and a solvent for the precursor. These compositions were not designed for processing at low temperatures, and as a result the processing temperatures were relatively high, such as greater than 250° C.

U.S. Pat. Nos. 5,882,722 and 6,036,889 by Kydd disclose conductor precursor compositions that contain particles, a precursor and a vehicle and are capable of forming pure conductors at low temperatures on organic substrates. However, the formulations are designed for screen printing of thick film electronic components. Materials to form transferable ribbon materials are not disclosed.

Polymer thick film materials containing particles in a polymerizable organic vehicle have also been disclosed in the prior art. These compositions are processable at low temperatures, such as less than 200° C., allowing deposition onto organic substrates. The compositions contain particles, usually flakes, at high loading and have a high viscosity. Ribbon and tape applications designed for transfer onto a substrate are not disclosed.

Attempts have been made to produce metal-containing compositions at low temperatures by using a composition containing a polymer and a precursor to a metal. See, for example, U.S. Pat. No. 6,019,926 by Southward et al. However, the deposits were chosen for optical properties and were either not conductive or were poorly conductive.

U.S. Pat. Nos. 5,846,615 and 5,894,038, both by Sharma' et al., disclose precursors to Au and Pd that have low reaction temperatures thereby conceptually enabling processing at low temperatures to form metals. It is disclosed that an ink jet can be used to apply the precursors.

U.S. Pat. No. 5,332,646 by Wright et al. discloses a method of making colloidal palladium and/or platinum metal dispersions by reducing a palladium and/or platinum metal of a metallo-organic palladium and/or platinum metal salt which lacks halide functionality. However, formulations for depositing electronic features are not disclosed.

U.S. Pat. No. 5,176,744 by Muller discloses the use of Cu-formate solutions for the direct laser writing of copper metal. The solutions prevent' crystallization of copper formate during drying.

U.S. Pat. No. 5,997,044 by Behm et al. discloses a document, such as a lottery ticket, having simple circuitry deposited thereon. The circuitry can be formed from inks containing conductive carbon and other additives as well as metallic particles. It is disclosed that the inks can be deposited by methods such as gravure printing.

U.S. Pat. No. 6,238,734 by Senzaki et al. is directed to compositions for the chemical vapor deposition of mixed metal or metal compound layers. The method uses a solventless common ligand mixture of metals in a liquid state for deposition by direct liquid injection.

The ideal tape composition and its associated deposition technique for the fabrication of electronic features such as a conductor would combine a number of attributes. The conductor would have high conductivity, preferably close to that of a dense, pure metal. The processing temperature would be low enough to allow formation of conductors on organic substrates. The deposition technique would allow deposition onto surfaces that are non-planar (e.g., not flat). The conductor would have high resistance to electromigration, solder leaching and oxidation. The conductor metal would be capable of forming an alloy with useful properties.

In the case of conductors derived from ribbon compositions containing combinations of precursors and particulates, a variety of criteria would be met. In one embodiment, the ribbon would be stable under ambient conditions, preventing compositional changes such as drying, enabling storage for extended times prior to transfer and processing. In another embodiment, the ribbon could be rolled and stored on a tape roll. The deposited material would not spread once deposited, to maintain the feature dimensions. The transferred material would have a high yield of conductor. In some cases where conductivity is the most desired characteristic, the final conductor would not contain polymers or other non-conductive materials. The deposit would adhere strongly to the surface and would be compatible with the substrate and other materials in contact with the conductor. The deposit would be flexible and mechanically strong. In cases where ease of processing is most critical, UV curable compositions would be desirable.

Further, there is a need for electronic circuit elements and complete electronic circuits fabricated on inexpensive, thin and flexible substrates such as paper using high volume printing techniques such as reel-to-reel printing. Recent developments in organic thin film transistor (TFT) technology have accelerated this need. These organic transistors will become key components of organic circuitry and low cost, disposable devices. This development highlights the emerging need for complimentary circuit elements that can be deposited directly onto low cost substrates. Such elements include conductive interconnects, electrodes, conductive contacts and via fills, resistors, capacitors, inductors, transformers, photoconductors, transparent electrodes, antennas, memory elements, electro-optical devices, optical modulators, optical wave guides, high frequency filters and modulators, rectifiers and a wide variety of sensors.

DESCRIPTION OF THE INVENTION

The present invention is directed to tape compositions that can be deposited onto a substrate by a transfer mechanism. For example, the compositions can be transferred from a supporting carrier to a substrate. The transferred compositions preferably have a low decomposition temperature, thereby enabling the formation of electronic features on a variety of substrates, including organic substrates. The tape compositions can include various combinations of molecular precursors, solvents, micron-size particles, nanoparticles, binders, vehicles, reducing agents and other additives. The compositions can be transferred onto a substrate and reacted to form electronic materials including conductors, resistors and dielectrics.

The tape compositions according to the present invention can be formulated to have a wide range of properties and a wide range of relative cost. For example, in high volume applications that do not require well-controlled properties, inexpensive tape compositions can be deposited on cellulose-based materials, such as paper, to form simple disposable circuits.

On the other hand, the tape compositions of the present invention can be utilized to form complex and high precision circuitry having good electrical properties. For example, the compositions and methods of the present invention can be utilized to form features on a substrate, wherein the features have a minimum feature size (i.e, average width of the smallest dimension) of not greater than about 200 µm, more preferably not greater than about 100 µm and even more preferably not greater than about 75 µm. In one embodiment, the minimum feature size is not greater than about 50 µm, such as not greater than about 25 µm and even not greater than about 10 µm.

The electronic features formed according to the present invention can have good electrical properties. For example, the conductive features fabricated according to the present invention can have a resistivity that is not greater than 1000 times the resistivity of the bulk conductor, such as not greater than 100 times the resistivity of the bulk conductor. In one embodiment, the conductive features have a resistivity that is not greater than 20 times the resistivity of the bulk conductor, such as not greater than 10 times the resistivity of the bulk conductor, preferably not greater than 6 times the resistivity of the bulk conductor, more preferably not greater than 4 times the resistivity of the bulk conductor and even more preferably not greater than 2 times the resistivity of the bulk conductor.

The method for forming the electronic features according to the present invention can also make use of relatively low processing temperatures. Depending upon the materials included in the precursor tape composition, the conversion temperature can be not greater than 1000° C., such as not greater than about 600° C. In one embodiment, the conversion temperature is not greater than about 300° C., such as not greater than about 200° C., preferably not greater than 175° C., more preferably not greater than about 150° C., such as not greater than 125° C. The conversion temperature can even be not greater than 100° C. The heating time can also be very short, such as not greater than about 5 minutes, more preferably not greater than about 1 minute and even more preferably not greater than about 10 seconds.

Definitions

As used herein, the term tape or tape composition refers to a layer of material, continuous or discrete, that is adapted to be transferred to a substrate and that can optionally be supported by a backing or carrier. As used herein, a ribbon is the combination of the tape and its supporting carrier. In cases where the tape is self-supporting or the entire ribbon is transferred to the substrate, the terms tape and ribbon can be used interchangeably.

The term substrate refers to a solid material onto which the tape is deposited. The substrate can be almost any material and does not have to be flat. The term tape transfer refers to the act of moving the tape, or portions thereof, to the substrate. The tape can be transferred, for example, from the supporting carrier. Alternatively, the entire ribbon can be transferred or laminated onto the substrate. The transfer mechanism can include the use of heat, light (including conventional and laser, IR, UV, or other types of radiation), mechanical force, electric and/or magnetic force, or some combination of these. The tape material and substrate can be in intimate contact during transfer or the tape material can travel across a gap to the substrate. The gap can be a vacuum, or more preferably can be filled with a medium such as air, vapor, or liquid.

The term molecular precursor refers to a molecular compound that includes a metal atom. Examples include organometallics (molecules with carbon-metal bonds), metal organics (molecules containing organic ligands with metal bonds to other types of elements such as oxygen, nitrogen or sulfur) and inorganic compounds such as metal nitrates, metal halides and other metal salts.

In addition to molecular precursors, the tape compositions can include particulates of one or several materials. The particulates can fall in two size ranges referred to herein as nanoparticles and micron-size particles. Nanoparticles have an average size of not greater than about 100 nanometers, and typically have an average size ranging from about 10 to 80 nanometers. Micron-size particles have an average particle size of greater than about 0.1 µm, typically greater than about 0.5 µm such as from about 0.5 µm to 5 µm. Nanoparticles and micron-size particles are collectively referred to herein as particles, particulates or powders.

In addition, the formulations used to make the tape compositions can include a solvent for the molecular precursor. A solvent is a chemical that is capable of dissolving at least a portion of the molecular precursor. None, some or all of the solvent may be present in the tape composition before transfer.

The tape composition can also include a binder to provide mechanical strength to the tape or ribbon, to facilitate cohesiveness during transfer, and to limit spreading of the transferred material. As will be appreciated from the following discussion, the same chemical can have multiple functions, such as a chemical that functions as both a solvent and a binder.

Other chemicals, referred to simply as additives, can also be included in the tape compositions of the present invention. As is discussed hereinbelow, such additives can include, but are not limited to, crystallization inhibitors, polymers, polymer precursors (monomers), reducing agents, dispersants, surfactants, thickening agents, defoamers and the like.

Depending on the relative ratios of particles, solvents, vehicle, binder, and other components in the final tape composition, a distinction can be made between dry tape and wet tape. A dry tape typically is dry to the touch, and has a high relative content of particles and binder. A wet tape is wet to the touch and has rheology characteristics that are similar to a film of ink or paste material. A tape can also have a composition that lies in between a wet tape and a dry tape.

Tape Compositions

As is discussed above, the tape compositions according to the present invention can include particulates in the form of micron-size particles and/or nanoparticles.

Nanoparticles have an average size of not greater than about 100 nanometers, such as from about 10 to 80 nanometers. Particularly preferred for tape compositions are nanoparticles having an average size of not greater than about 75 nanometers, such as in the range of from about 25 to 75 nanometers.

Nanoparticles that are particularly preferred for use in the tape compositions of the present invention are not substantially agglomerated. Preferred nanoparticle compositions include $Al_2O_3$, $CuO_x$, $SiO_2$, $ZnO$ and $TiO_2$, conductive metal oxides such as $In_2O_3$, indium-tin oxide (ITO) and antimony-tin oxide (ATO), silver, palladium, copper, gold, platinum, nickel, alloys thereof, and composites thereof and core-shell structures thereof (coated particles). For low cost applications, particle compositions can be selected from the group of copper aluminum, tungsten, molybdenum, zinc, nickel, iron, tin, indium, solder, and lead. Other conductive particles can also be used such as titanium nitride, various forms of carbon such as graphite and amorphous carbon, and intrinsically conductive polymer particles. Other useful nanoparticles of metal oxides include pyrogenous silica such as HS-5 or M5 or others (Cabot Corp., Boston, Mass.) and AEROSIL 200 or others (Degussa AG, Dusseldorf, Germany) or surface modified silica such as TS530 or TS720 (Cabot Corp., Boston, Mass.) and AEROSIL 380 (Degussa AG, Dusseldorf, Germany). In one embodiment of the present invention, the nanoparticles are composed of the same metal that is contained in the metal precursor compound, discussed below. Nanoparticles can be fabricated using a number of methods and one preferred method, referred to as the Polyol process, is disclosed in U.S. Pat. No. 4,539,041 by Figlarz et al., which is incorporated herein by reference in its entirety.

The tape compositions according to the present invention can also include micron-size particles, having an average size of at least about 0.1 µm. Preferred compositions of micron-size particles are similar to the compositions described above with respect to nanoparticles. The shape of the particles can be varied from completely spherical, such as those produced by spray pyrolysis to flakes that are leaf-like in shape with very large aspect ratios. Particles can also be any oblong shape in between spheres and flakes. When substantially spherical particles are described, the particle size refers to the particle diameter. When flakes are described, the particle size refers to the largest dimension measure across such a particle. In the present tape formulations, flake content, flake particle size, flake agglomeration, and surface morphology are all well controlled to achieve the desired electrical performance as well as the desired physical characteristics after transfer, including cohesiveness, uniformity and resolution. In one preferred embodiment, the tape compositions according to the present invention do not include any flakes.

Generally, the volume median particle size of the micron-size particles is at least about 0.1 µm, such as at least about 0.3 µm. Further, the median particle size is preferably not greater than about 20 µm. For most applications, the volume median particle size is more preferably not greater than about 10 µm and even more preferably not greater than about 5 µm. A particularly preferred median particle size is from about 0.3 µm to about 3 µm. According to one embodiment of the present invention, it is preferred that the volume median particle size of the micron-size particles is at least 5 times smaller than the minimum feature size of the electronic features after transfer of the tape material, such as not greater than about 5 µm for a minimum feature size of 25 µm.

According to a preferred embodiment of the present invention, the particles (nanoparticles and micron-size particles) also have a narrow particle size distribution, such that the majority of particles are about the same size. This will result in more uniform tape material, which will improve the minimum feature size resolution that can ultimately be obtained. Preferably, at least about 70 volume percent and more preferably at least about 80 volume percent of the particles within the same size classification (nanoparticles or micron-size particles) are not larger than twice the average particle size. For example, when the average particle size of micron-size particles is about 2 µm, it is preferred that at least about 70 volume percent of the micron-size particles are not larger than 4 µm and it is more preferred that at least about 80 volume percent of the micron-size particles are not larger than 4 µm. Further, it is preferred that at least about 70 volume percent and more preferably at least about 80 volume percent of the particles are not larger than about 1.5 times the average particle size. Thus, when the average particle size of the micron-size particles is about 2 µm, it is preferred that at least about 70 volume percent of the micron-size particles are not larger than 3 µm and it is more preferred that at least about 80 volume percent of the micron-size particles are not larger than 3 µm.

It is known that micron-size particles and nanoparticles often form soft agglomerates as a result of their relatively high surface energy, as compared to larger particles. It is also known that such soft agglomerates may be dispersed easily by treatments such as exposure to ultrasound in a liquid medium, sieving, high shear mixing and 3-roll milling. The average particle size and particle size distributions described herein are measured by mixing samples of the powders in a liquid medium, such as water and a surfactant, and exposing the suspension to ultrasound through either an ultrasonic bath or horn. The ultrasonic treatment supplies sufficient energy to disperse the soft agglomerates into primary particles. The primary particle size and size distribution are then measured by light scattering in a MICROTRAC instrument. Thus, the references to particle size herein refer to the primary particle size, such as after lightly dispersing soft agglomerates of the particles.

It is also possible to provide micron-size particles or nanoparticles having a bimodal particle size distribution. That is, the particles can have two distinct and different average particle sizes. Preferably, each of the distinct particle size distributions will meet the foregoing size distribution limitations. A bimodal or trimodal particle size distribution can advantageously enhance the packing efficiency of the particles when deposited according to the present invention. In one embodiment, the larger mode includes hollow or porous particles while the smaller mode includes dense particles. The two modes can include particles of different composition. In one embodiment, the two modes have average particle sizes at about 1 µm and about 5 µm, and in another embodiment the two modes have an average particle size of about 0.5 µm and about 2.5 µm. The bimodal particle size distribution can also be achieved using nanoparticles. In one embodiment, the larger mode has an average particle size of from about 1 µm to 10 µm and the smaller mode has an average particle size of from about 10 to 100 nanometers.

The particles that are useful in the tape compositions according to the present invention also have a high degree of purity and it is preferred that the particles include not greater than about 1.0 atomic percent impurities and more preferably not greater than about 0.1 atomic percent impurities and even more preferably not greater than about 0.01 atomic percent impurities. Impurities are those materials that are not intended in the final product and that negatively affect the properties of the final product. For many electronically conductive features, the most critical impurities to avoid are Na, K, and Cl, S and F. As is discussed below, it will be appreciated that the particles can include composite particles having one or more second phases. Such second phases are not considered impurities.

The particles for use in the tape compositions according to the present invention can also be coated particles wherein the particle includes a surface coating surrounding the particle core. Coatings can be generated on the particle surface by a number of different mechanisms. One preferred mechanism is spray pyrolysis. In another embodiment, one or more coating precursors can vaporize and fuse to the hot particle surface and thermally react resulting in the formation of a thin film coating by chemical vapor deposition (CVD). Preferred coatings deposited by CVD include metal oxides and elemental metals. Further, the coating can be formed by physical vapor deposition (CVD) wherein a coating material physically deposits on the surface of the particles. Preferred coatings deposited by PVD include organic materials and elemental metals. Alternatively, a gaseous precursor can react in the gas phase forming small particles, for example, less than about 5 nanometers in size, which then diffuse to the larger particle surface and sinter onto the surface, thus forming a coating. This method is referred to as gas-to-particle conversion (GPC). Whether such coating reactions occur by CVD, PVD or GPC is dependent on the reactor conditions, such as temperature, precursor partial pressure, water partial pressure and the concentration of particles in the gas steam. Another possible surface coating method is surface conversion of the particles by reaction with a vapor phase reactant to convert the surface of the particles to a different material than that originally contained in the particles.

In addition, a volatile coating material such as lead oxide, molybdenum oxide or vanadium oxide can be introduced into the reactor such that the coating deposits on the particles by condensation. Further, the particles can be coated using other techniques. For example, soluble precursors to both the particle and the coating can be used in the precursor solution. In another embodiment, a colloidal precursor and a soluble precursor can be used to form a particulate colloidal coating on the composite particle. It will be appreciated that multiple coatings can be deposited on the surface of the particles if such multiple coatings are desirable.

The coatings are preferably as thin as possible while maintaining conformity about the particles such that the core of the particle is not substantially exposed. For example, the coatings on a micron-size particle can have an average thickness of not greater than about 200 nanometers, preferably not greater than about 100 nanometers and more preferably not more than about 50 nanometers. For most applications, the coating has an average thickness of at least about 5 nanometers.

For example, copper particles can be coated with another metal such as silver to stabilize the surface against oxidation during heat treatment of the transferred material. Alternatively, silver particles can be coated with one or more metals such as copper, silver/palladium or silver/platinum to increase the solder leach resistance while maintaining high conductivity. Another preferred example of a coated particle is a silver particle with a silica coating. This will prevent particle agglomeration during production and formulation into a Jape. The coating can act as a sintering delay barrier in certain applications. When formulated into a silver tape, the silica coating can have a positive impact on ribbon uniformity and the minimum feature size of the conductive traces formed using this ribbon.

In addition to the foregoing, the particles can be coated after tape transfer to the substrate by a molecular precursor, such as a metallo-organic precursor, contained in the tape composition. In this case, the coating will form during heat treatment of the transferred tape.

Nanoparticles can also be coated using the coating methods described above. In addition, it may be advantageous to coat nanoparticles with materials such as with a polymer, to prevent agglomeration of the nanoparticles due to high surface energy. This is described by P. Y. Silvert et al. (Preparation of colloidal silver dispersions by the polyol process, Journal of Material Chemistry, 1997, volume 7(2), pp. 293-299). In another embodiment, the particles can be coated with an intrinsically conductive polymer, preventing agglomeration during tape formation and providing a conductive path after solidification of the transferred ribbon. In yet another embodiment, the polymer can decompose during heating enabling the nanoparticles to sinter together. In one embodiment, the nanoparticles are generated in-situ and are coated with a polymer. Preferred coatings for nanoparticles according to the present invention include sulfonated perfluorohydrocarbon polymer (e.g., NAFION, available from E.I. duPont deNemours, Wilmington, Del.), polystyrene, polystyrene/methacrylate, polyvinyl pyrolidone, sodium bis(2-ethylhexyl)sulfosuccinate, tetra-n-octyl-ammonium bromide and alkane thiolates.

The particles that are useful with the present invention can also be "capped" with other compounds. The term "capped" refers to having compounds bonded to the outer surface of the particles without necessarily creating a coating over the outer surface. The particles used with the present invention can be capped with any functional group including organic compounds such as polymers, organometallic compounds and metal organic compounds. These capping agents can serve a variety of functions including the prevention of agglomeration of the particles, prevention of oxidation, and enhancement of bonding of the particles to a surface. Preferred capping agents that are useful with the particles of the present invention include amine compounds, organometallic compounds, and metal organic compounds.

The particulates in accordance with the present invention can also be composite particles wherein the particles include a first phase and a second phase associated with the first phase. Preferred composite particulates include carbon-metal, carbon-polymer, carbon-ceramic, carbon1-carbon2, ceramic-ceramic, ceramic-metal, metal1-metal2, metal-polymer, ceramic-polymer, and polymer1-polymer2. Also preferred are certain 3-phase combinations such as metal-carbon-polymer. In one embodiment, the second phase is uniformly dispersed throughout the first phase. The second phase can be a conductive compound or it can be a non-conductive compound. For example, sintering inhibitors such as metal oxides can be included as a second phase in a first phase of a metallic material, such as silver metal to inhibit sintering of the metal without substantially affecting the conductivity. Metal-carbon composite particles comprising platinum or other precious metals such as Ru are preferred.

As a further example, the particles can be electrocatalyst particles, such as those composed of a metal dispersed on a support such as carbon. Such particles are disclosed in U.S. Pat. No. 6,103,393 by Kodas et al., which is incorporated herein by reference in its entirety.

The particulates according to a preferred embodiment of the present invention are also substantially spherical in shape. That is, the particulates are not jagged or irregular in shape. Spherical particles are particularly advantageous because they are able to disperse more evenly in a tape composition and enable better resolution. This allows higher loadings by weight and volume of particles and also allows more uniform, defect-free tapes. Spherical particles are also less abrasive than jagged particles.

Micron-size particles in accordance with the foregoing can be produced, for example, by spray pyrolysis. Spray pyrolysis for production of micron-size particles is described in U.S. Pat. No. 6,338,809 by Hampden-Smith, et al., which is incorporated herein by reference in its entirety.

In addition to the foregoing, the tape compositions according to the present invention can also include carbon particles, such as graphitic carbon particles. Depending upon the other components in the tape composition, carbon particle loading up to about 75 volume percent can be obtained in the compositions. The average particle size of the carbon particles is preferably not greater than about 1 µm and the carbon particles can advantageously have a bimodal or trimodal particle size distribution. Graphitic carbon has a bulk resistivity of about 1375 µΩ-cm and is particularly useful in conductor compositions that require a relatively low cost, as well as in resistor compositions that require a relatively low cost. The carbon can also be a high surface area carbon with surface area greater than 50 $m^2/g$, such as greater than 100 $m^2/g$, preferably greater than 150 $m^2/g$ and more preferably greater than 200 $m^2/g$.

One method according to the present invention for formulating compositions for the fabrication of conductive, resistive and dielectric circuit components utilizes suitable molecular precursors that can be converted to functional materials. Some progress has been made in the development of metal organic precursors for printing conductors, dielectrics and resistors. See, for example, "Chemical aspects of solution routes to perovskite-phase mixed-metal oxides from metal-organic precursors," C. D. Chandler, C Roger, and M. J. Hampden-Smith, Chem. Rev. 93, 1205-1241 (1993). The chemical precursor to the functional phase should convert to the final material at a low temperature. The formulations should be easy to synthesize, be environmentally benign, provide clean elimination of inorganic or organic ligands and be compatible with other precursor constituents. Other factors are solubility in various solvents, stability during the delivery process, homogeneous film formation, good adhesion to the substrate, high yield and long shelf life. If a laser is used for precursor conversion, the precursor composition should be highly absorptive at the laser wavelength being used to promote efficient laser energy coupling allowing for decomposition at low laser power. This will prevent substrate damage during laser processing.

The metal-ligand bond is a key factor in selecting the metal organic precursors. For conductive phases in low-ohm resistors, this bond should be reactive enough to permit complete elimination of the ligand during formation of metallic features for conductors like silver, gold, nickel, platinum, copper, palladium or alloys of these elements. Preferred precursor families include metal carboxylates, alkoxides, and diketonates including at least one metal oxygen bond. Depending on the metal, thiolates and amines can be specifically tailored to the required characteristics Deposition of electro-ceramic materials for dielectric, ferrite, and resistor applications requires precursors that undergo clean and low temperature transformation to single oxides or mixed oxides. This is required to mimic the high-fire compositions currently being used in the electronic industry. Typical reaction mechanisms involved for these metal oxide based formulations are condensation, polymerization, or elimination reactions of alkoxides typically used in sol gel processes. Other reaction routes involve ether, carboxylic anhydride, or ester elimination.

The present invention is also directed to combinations of precursors, additives and solvents for the conversion of the tape material at low temperatures. Even if a conversion at low temperature with complete elimination of byproducts can be achieved, metal oxide materials may still need some higher temperature treatment for proper crystallization and consolidation. In contrast, important metals like silver, gold, palladium and copper can be deposited according to the present invention and, using carefully designed precursor compositions, can be converted to conductive features at temperatures below 200° C., in some cases even below 150° C. or even below 125° C., with good adhesion to polymeric substrates, such as polyimide substrates. The lower deposition temperatures required for complex mixed metal oxides would result in structures with materials that have controlled stoichiometries and in some cases would afford kinetic routes to new meta-stable crystal structures.

Particularly preferred precursor compositions for conductive, dielectric and resistive features are described more fully below.

The tape compositions according to the present invention can include molecular precursors, either alone or in combination with particulates. Preferred examples of metallic phases, such as for conductive features or low-ohm resistors, include precursors to silver (Ag), nickel (Ni), platinum (Pt), gold (Au), palladium (Pd), copper (Cu), indium (In), antimony, (Sb), and tin (Sn). Other molecular precursors can include precursors to aluminum (Al), zinc (Zn), iron (Fe), tungsten (W), molybdenum (Mo), ruthenium (Ru), lead (Pb), bismuth (Bi) and similar metals. The molecular precursors can be either soluble or insoluble in the tape composition.

In general, metal precursor compounds that eliminate ligands by a radical mechanism upon conversion to metal are preferred especially if the species formed are stable radicals and therefore lower the decomposition temperature of that precursor.

Furthermore, molecular precursors containing ligands that upon precursor conversion eliminate cleanly and escape completely from the substrate (or the formed functional structure) are preferred because they are not susceptible to carbon contamination or contamination by anionic species such as nitrates. Therefore, preferred precursors for metals used for conductors are carboxylates, alkoxides or combinations thereof that would convert to metals, metal oxides or mixed metal oxides by eliminating small molecules such as carboxylic acid anhydrides, ethers or esters. Metal carboxylates, particularly halogenocarboxylates such as fluorocarboxylates, are particularly preferred metal precursors due to their high solubility. The precursors can be present in the tape composition in the form of crystallites of precursor, be bound to or associated at least partially with the binder, be present in amorphous form, or can be associated at least partially with another compound such as particles, polymers, solvents and additives.

The molecular precursors can be utilized in an aqueous-based solvent or an organic solvent. The main role of the solvent is to assist in the deposition of the tape material on the carrier or to otherwise aid in the formation of the ribbon structure. When the ribbon structure is complete, the solvent may be partially or completely removed as part of the ribbon fabrication process. Organic solvents are typically used for tape fabrication.

Examples of silver precursors that can be used in the tape compositions according to the present invention are illustrated in Table 1.

TABLE 1

Silver Precursor Molecular Compounds and Salts

| General Class | Examples | Chemical Formula |
|---|---|---|
| Nitrates | Silver nitrate | $AgNO_3$ |
| Nitrites | Silver nitrite | $AgNO_2$ |
| Oxides | Silver oxide | $Ag_2O, AgO$ |
| Carbonates | Silver carbonate | $Ag_2CO_3$ |
| Oxalates | Silver oxalate | $Ag_2C_2O_4$ |
| (Pyrazolyl)borates | Silver trispyrazolylborate | $Ag[(N_2C_3H_3)_3]BH$ |
|  | Silver tris(dimethylpyrazolyl)borate | $Ag[((CH_3)_2N_2C_3H_3)_3]BH$ |
| Azides | Silver azide | $AgN_3$ |
| Fluoroborates | Silver tetrafluoroborate | $AgBF_4$ |
| Carboxylates | Silver acetate | $AgO_2CCH_3$ |
|  | Silver propionate | $AgO_2CC_2H_5$ |
|  | Silver butanoate | $AgO_2CC_3H_7$ |
|  | Silver ethylbutyrate | $AgO_2CCH(C_2H_5)C_2H_5$ |
|  | Silver pivalate | $AgO_2CC(CH_3)_3$ |
|  | Silver cyclohexanebutyrate | $AgO_2C(CH_2)_3C_6H_{11}$ |
|  | Silver ethylhexanoate | $AgO_2CCH(C_2H_5)C_4H_9$ |
|  | Silver neodecanoate | $AgO_2CC_9H_{19}$ |
| Halogenocarboxylates | Silver trifluoroacetate | $AgO_2CCF_3$ |
|  | Silver pentafluoropropionate | $AgO_2CC_2F_5$ |
|  | Silver heptafluorobutyrate | $AgO_2CC_3F_7$ |
|  | Silver trichloroacetate | $AgO_2CCCl_3$ |
|  | Silver 6,6,7,7,8,8,8-heptafluoro-2,2-dimethyl-3,5-octanedionate | AgFOD |
| Hydroxycarboxylates | Silver lactate | $AgO_2CH(OH)CH_3$ |
|  | Silver citrate | $Ag_3C_6H_5O_7$ |
|  | Silver glycolate | $AgOOCCH(OH)CH_3$ |

TABLE 1-continued

Silver Precursor Molecular Compounds and Salts

| General Class | Examples | Chemical Formula |
|---|---|---|
| Aminocarboxylates | Silver glyconate | |
| Aromatic and nitro and/or fluoro substituted aromatic Carboxylates | Silver benzoate | $AgO_2CCH_2C_6H_5$ |
| | Silver phenylacetate | $AgOOCCH_2C_6H_5$ |
| | Silver nitrophenylacetates | $AgOOCCH_2C_6H_4NO_2$ |
| | Silver dinitrophenylacetate | $AgOOCCH_2C_6H_3(NO_2)_2$ |
| | Silver difluorophenylacetate | $AgOOCCH_2C_6H_3F_2$ |
| | Silver 2-fluoro-5-nitrobenzoate | $AgOOCC_6H_3(NO_2)F$ |
| Beta diketonates | Silver acetylacetonate | $Ag[CH_3COCH=C(O-)CH_3]$ |
| | Silver hexafluoroacetylacetonate | $Ag[CF_3COCH=C(O-)CF_3]$ |
| | Silver trifluoroacetylacetonate | $Ag[CH_3COCH=C(O-)CF_3]$ |
| Silver sulfonates | Silver tosylate | $AgO_3SC_6H_4CH_3$ |
| | Silver triflate | $AgO_3SCF_3$ |

In addition to the foregoing, complex silver salts containing neutral inorganic or organic ligands can also be used as precursors. These salts usually come in the form of nitrates, halides, perchlorates, hydroxides and tetrafluoroborates. Examples are listed in Table 2.

TABLE 2

Complex Silver Salt Precursors

| Class | Examples (Cation) |
|---|---|
| Amines | $[Ag(RNH_2)_2]^+$, $Ag(R_2NH)_2]^+$, $[Ag(R_3N)_2]^+$, R = aliphatic or aromatic |
| N-Heterocycles | $[Ag(L)_x]^+$, (L = aziridine, pyrrol, indol, piperidine, pyridine, aliphatic substituted and amino substituted pyridines, imidazole, pyrimidine, piperazine, triazoles, etc.) |
| Amino alcohols | $[Ag(L)_x]^+$, L = Ethanolamine |
| Amino acids | $[Ag(L)_x]^+$, L = Glycine |
| Acid amides | $[Ag(L)_x]^+$, L = Formamides, acetamides |
| Nitriles | $[Ag(L)_x]^+$, L = Acetonitriles |

The molecular metal precursors can be utilized in an aqueous-based solvent or an organic solvent. Preferred molecular precursors for silver in an organic solvent include Ag-nitrate, Ag-neodecanoate, Ag-trifluoroacetate Ag-acetate, Ag-lactate, Ag-cyclohexanebutyrate, Ag-carbonate, Ag-oxide, Ag-ethylhexanoate, Ag-acetylacetonate, Ag-ethylbutyrate, Ag-pentafluoropropionate, Ag-benzoate, Ag-citrate, Ag-heptafluorobutyrate, Ag-salicylate, Ag-decanoate and Ag-glycolate. Among the foregoing, particularly preferred molecular precursors for silver include Ag-acetate, Ag-nitrate, Ag-trifluoroacetate and Ag-neodecanoate. Most preferred among the foregoing silver precursors are Ag-trifluoroacetate and Ag-neodecanoate. The preferred precursors generally have a high solubility and high metal yield. For example, Ag-trifluoroacetate has a solubility in dimethylacetamide of about 78 wt. % and Ag-trifluoroacetate is a particularly preferred silver precursor according to the present invention.

Preferred molecular silver precursors for aqueous-based solvents include Ag-nitrates, Ag-fluorides such as silver fluoride or silver hydrogen fluoride ($AgHF_2$), Ag-thiosulfate, Ag-trifluoroacetate and soluble diamine complexes of silver salts.

Silver precursors in solid form that decompose at a low temperature, such as not greater than about 200° C., can also be used. Examples include Ag-oxide, Ag-nitrite, Ag-carbonate, Ag-lactate, Ag-sulfite and Ag-citrate.

When a more volatile molecular silver precursor is desired, such as for spray deposition, the precursor can be selected from alkene silver betadiketonates, $R_2(CH)_2Ag$ ([R'COCH=C(O-)CR"] where R=methyl or ethyl and R', R"=$CF_3$, $C_2F_5$, $C_3F_7$, $CH_3$, $C_mH_{2m+1}$ (m=2 to 4), or trialkylphosphine and triarylphosphine derivatives of silver carboxylates, silver beta diketonates or silver cyclopentadienides.

Molecular metal precursors for nickel that are preferred according to the present invention are illustrated in Table 3. A particularly preferred nickel precursor for use with an aqueous-based solvent is Ni-acetylacetonate.

TABLE 3

Molecular Metal Precursors For Nickel

| General Class | Example | Chemical Formula |
|---|---|---|
| Inorganic Salts | Ni-nitrate | $Ni(NO_3)_2$ |
| | Ni-sulfate | $NiSO_4$ |
| | Nickel amine complexes | $[Ni(NH_3)_6]^{n+}$ (n = 2,3) |
| | Ni-tetrafluoroborate | $Ni(BF_4)_2$ |
| Metal Organics (Alkoxides, Beta-diketonates, Carboxylates, Fluorocarboxylates | Ni-oxalate | $NiC_2O_4$ |
| | Ni-isopropoxide | $Ni(OC_3H_7)_2$ |
| | Ni-methoxyethoxide | $Ni(OCH_2CH_2OCH_3)_2$ |
| | Ni-acetylacetonate | $[Ni(acac)_2]_3$ or $Ni(acac)_2(H_2O)_2$ |
| | Ni-hexafluoro-acetylacetonate | $Ni[CF_3COCH=C(O-)CF_3]_2$ |
| | Ni-formate | $Ni(O_2CH)_2$ |
| | Ni-acetate | $Ni(O_2CCH_3)_2$ |
| | Ni-octanoate | $Ni(O_2CC_7H_{15})_2$ |
| | Ni-ethylhexanoate | $Ni(O_2CCH(C_2H_5)C_4H_9)_2$ |
| | Ni-trifluoroacetate | $Ni(OOCCF_3)_2$ |

Various molecular precursors can be used for platinum metal. Preferred molecular precursors include ammonium salts of platinum such as ammonium hexachloro platinate $(NH_4)_2PtCl_6$, and ammonium tetrachloro platinate $(NH_4)_2PtCl_4$; sodium and potassium salts of halogeno, pseudohalogeno or nitrito platinates such as potassium hexachloro platinate $K_2PtCl_6$, sodium tetrachloro platinate $Na_2PtCl_4$, potassium hexabromo platinate $K_2PtBr_6$, potassium tetranitrito platinate $K_2Pt(NO_2)_4$; dihydrogen salts of hydroxo or halogeno platinates such as hexachloro platinic acid $H_2PtCl_6$, hexabromo platinic acid $H_2PtBr_6$, dihydrogen hexahydroxo platinate $H_2Pt(OH)_6$; diamine and tetraamine platinum compounds such as diamine platinum chloride $Pt(NH_3)_2Cl_2$, tetraamine platinum chloride [Pt(NH$_3$)$_4$]Cl$_2$, tetraamine platinum hydroxide [Pt(NH$_3$)$_4$](OH)$_2$, tetraamine platinum nitrite [Pt(NH$_3$)$_4$](NO$_2$)$_2$, tetramine platinum nitrate Pt(NH$_3$)$_4$(NO$_3$)$_2$, tetraamine platinum bicarbonate [Pt(NH$_3$)$_4$](NCO$_3$)$_2$, tetraamine platinum tetrachloroplatinate [Pt(NH$_3$)$_4$]PtCl$_4$; platinum diketonates such as platinum (II) 2,4-pentanedionate Pt(C$_5$H$_7$O$_2$)$_2$; platinum nitrates such as dihydrogen hexahydroxo platinate H$_2$Pt(OH)$_6$ acidified with nitric acid; other platinum salts such as Pt-sulfite, Pt-oxalate; and platinum salts comprising other N-donor ligands such as [Pt(CN)$_6$]$^{4+}$.

Platinum precursors compounds useful in organic-based solutions include Pt-carboxylates or mixed carboxylates. Examples of carboxylates include Pt-formate, Pt-acetate, Pt-propionate, Pt-benzoate, Pt-stearate, Pt-neodecanoate. Other precursors useful in organic vehicles include aminoorgano platinum compounds including Pt(diaminopropane)(ethylhexanoate). Preferred combinations of platinum precursors and solvents include: PtCl$_4$ in H$_2$O; Pt-nitrate solution from H$_2$Pt(OH)$_6$; H$_2$Pt(OH)$_6$ in H$_2$O; H$_2$PtCl$_6$ in H$_2$O; and [Pt(NH$_3$)$_4$](NO$_3$)$_2$ in H$_2$O.

Gold precursors useful for aqueous based systems include Au-chloride (AuCl$_3$) and tetrachloric auric acid (HAuCl$_4$).

Gold precursors useful for organic based formulations include: Au-thiolates, Au-carboxylates such as Au-acetate Au(O$_2$CCH$_3$)$_3$; aminoorgano gold carboxylates such as imidazole gold ethylhexanoate; mixed gold carboxylates such as gold hydroxide acetate isobutyrate; Au-thiocarboxylates and Au-dithiocarboxylates.

In general, preferred gold molecular precursors for low temperature conversion are compounds comprising a set of different ligands such as mixed carboxylates or mixed alkoxo metal carboxylates. As one example, gold acetate isobutyrate hydroxide decomposes at 155° C., a lower temperature than gold acetate. As another example, gold acetate neodecanoate hydroxide decomposes to gold metal at even lower temperature, 125° C. Still other examples can be selected from gold acetate trifluoroacetate hydroxide, gold bis(trifluoroacetate) hydroxide and gold acetate pivalate hydroxide.

Other useful gold precursors include Au-azide and Au-isocyanide. When a more volatile molecular gold precursor is desired, such as for spray deposition, the precursor can be selected from:

dialkyl and monoalkyl gold carboxylates, R$_{3-n}$Au(O$_2$CR')$_n$ (n=1,2)
R=methyl, ethyl; R'=CF$_3$, C$_2$F$_5$, C$_3$F$_7$, CH$_3$, C$_m$H$_{2m+1}$ (m=2-9)
dialkyl and monoalkyl gold beta diketonates, R$_{3-n}$Au[R'COCH=C(O—)CR"]$_n$ (n=1,2), R=methyl, ethyl; R', R"=CF$_3$, C$_2$F$_5$, C$_3$F$_7$, CH$_3$, C$_m$H$_{2m+1}$ (m=2-4)
dialkyl and monoalkyl gold alkoxides, R$_{3-n}$Au(OR')$_n$ (n=1, 2)
R=methyl, ethyl; R'=CF$_3$, C$_2$F$_5$, C$_3$F$_7$, CH$_3$, C$_m$H$_{2m+1}$ (m=2-4), SiR$_3$" (R"=methyl, ethyl, propyl, isopropyl, n-butyl, isobutyl, tert. Butyl)
phosphine gold complexes:
RAu(PR'$_3$) R, R'=methyl, ethyl, propyl, isopropyl, n-butyl, isobutyl, tert. Butyl,
R$_3$Au(PR'$_3$) R, R'=methyl, ethyl, propyl, isopropyl, n-butyl, isobutyl, tert. butyl.

Particularly useful precursors to palladium for organic based precursor compositions according to the present invention include Pd-carboxylates including Pd-fluorocarboxylates such as Pd-acetate, Pd-propionate, Pd-ethylhexanoate, Pd-neodecanoate and Pd-trifluoroacetate as well as mixed carboxylates such as Pd(OOCH)(OAc), Pd(OAc)(ethylhexanoate), Pd(ethylhexanoate)$_2$, Pd(OOCH)$_{1.5}$ (ethyl hexanoate)$_{0.5}$, Pd(OOCH)(ethylhexanoate), Pd(OOCCH(OH)CH(OH)COOH)$_m$ (ethylhexanoate), Pd(OPr)$_2$, Pd(OAc)(OPr), Pd oxalate, Pd(OOCCHO)$_m$(OOCCH$_2$OH)$_n$= (Glyoxilic palladium glycolate) and Pd-alkoxides. A particularly preferred palladium precursor is Pd-trifluoroacetate.

Palladium precursors useful for aqueous based compositions include: tetraamine palladium hydroxide [Pd(NH$_3$)$_4$](OH)$_2$; Pd-nitrate Pd(NO$_3$)$_2$; Pd-oxalate Pd(O$_2$CCO$_2$)$_2$; Pd-chloride PdCl$_2$; Di- and tetraamine palladium chlorides, hydroxides or nitrates such as tetraamine palladium chloride [Pd(NH$_3$)$_4$]Cl$_2$, tetraamine palladium hydroxide [Pd(NH$_3$)$_4$](OH)$_2$, tetraamine palladium nitrate [Pd(NH$_3$)$_4$](NO$_3$)$_2$, diamine palladium nitrate [Pd(NH$_3$)$_2$](NO$_3$)$_2$ and tetraamine palladium tetrachloropalladate [Pd(NH$_3$)$_4$][PdCl$_4$].

When selecting a molecular copper precursor compound, it is desired that the compound react during processing to metallic copper without the formation of copper oxide or other species that are detrimental to the conductivity of the conductive copper feature. Some copper molecular precursors form copper by thermal decomposition at elevated temperatures. Other molecular copper precursors require a reducing agent to convert to copper metal. Reducing agents are materials that are oxidized, thereby causing the reduction of another substance. The reducing agent loses one or more electrons and is referred to as having been oxidized.

The introduction of the reducing agent can occur in the form of a chemical agent (e.g., formic acid) that is soluble in the precursor composition to afford a reduction to copper in the tape composition before or after deposition. In some cases, the ligand of the molecular copper precursor has reducing characteristics, such as in Cu-formate or Cu-hypophosphite, leading to reduction to copper metal. However, formation of metallic copper or other undesired side reactions that occur prematurely in the precursor composition should be avoided. Accordingly, the ligand can be an important factor in the selection of suitable copper molecular precursors. During thermal decomposition or reduction of the precursor, the ligand needs to leave the system cleanly, preferably without the formation of carbon or other residues that could be incorporated into the copper feature. Copper precursors containing inorganic ligands are preferred in cases where carbon contamination is detrimental. Other desired characteristics for molecular copper precursors are low decomposition temperature or processing temperature for reduction to copper metal, high solubility in the selected solvent/vehicle to increase metallic yield and achieve dense features and the compound should be environmentally benign.

Preferred copper precursors according to the present invention include Cu-formate and Cu-neodecanoate. Molecular copper precursors that are useful for aqueous-based compositions include: Cu-nitrate and amine complexes thereof; Cu-carboxylates including Cu-formate and Cu-acetate; and Cu-beta-diketonates such as Cu-hexafluoroacetylacetonate and copper salts such as Cu-chloride.

Molecular copper precursors generally useful for organic based formulations include: Cu-carboxylates and Cu-fluorocarboxylates such as Cu-ethylhexanoate; Cu-neodecanoate; Cu-methacrylate; Cu-trifluoroacetate; Cu-hexanoate and copper beta-diketonates such as cyclooctadiene Cu-hexafluoroacetylacetonate and copper salts such as Cu-chloride.

Among the foregoing, Cu-formate is particularly preferred as it is highly soluble in water and results in the in-situ formation of formic acid, which is an effective reducing agent.

Copper precursors useful in this invention can also be categorized as copper I and copper II compounds. They can be categorized as inorganic, metal organic, and organometallic. They can also be categorized as copper hydrides, copper amides, copper alkenes, copper allyls, copper carbonyls, copper metallocenes, copper cyclopentadienyls, copper arenes, copper carbonates, copper hydroxides, copper carboxylates, copper oxides, organo copper, copper beta-diketonates, copper alkoxides, copper beta-ketoiminates, copper halides, copper alkyls. The copper compounds can have neutral donor ligands or not have neutral ligands. Copper I compounds are particularly useful for disproportionation reactions. The disproportionation products are copper metal and a copper II compound. In some cases a neutral ligand is also a product.

In a novel approach, the copper II product can be rapidly converted back to a copper I compound using a reducing agent. Appropriate reducing agents for reducing copper II to copper I are known in the art. Useful reducing agents for copper precursors include ethylene diamine, tetramethylethylenediamine, 3 aminopropanol, mono, di and triethanolamine. Useful reducing agents are described in U.S. Pat. No. 5,378,508, which is incorporated herein by reference in its entirety. The resulting copper I compound reacts further via disproportionation to form more copper and copper II compound. Through this approach with excess reducing agent, copper I compounds can be used to form pure copper metal without any copper II compounds.

The copper compounds can also be used as capping agents to cap copper particles. The copper particles can be nanoparticles. U.S. Pat. No. 6,294,401 by Jacobsen describes capping procedures and is incorporated in its entirety by reference.

As is discussed above, two or more molecular metal precursors can be combined to form metal alloys and/or metal compounds. Preferred combinations of precursors to make alloys based on silver include: Ag-nitrate and Pd-nitrate; Ag-acetate and [Pd(NH$_3$)$_4$](OH)$_2$; Ag-trifluoroacetate and [Pd(NH$_3$)$_4$](OH)$_2$; and Ag-neodecanoate and Pd-neodecanoate. One particularly preferred combination of molecular precursors is Ag-trifluoroacetate and Pd-trifluoroacetate. Other preferred alloys are Ag/Pt and Ag/Cu.

To form alloys, the two (or more) molecular metal precursors should have similar decomposition temperatures to avoid the formation of one of the metal species before the other species. Preferably, the decomposition temperatures of the different molecular precursors are within 50° C., more preferably within 25° C.

In addition to metals, the tape compositions of the present invention can also be formulated to yield metal oxides, including conductive metal oxides insulative metal oxides and dielectrics.

Some applications require the utilization of a transparent or semi-transparent conductive feature. For example, indium tin oxide (ITO) is useful for the formation of transparent conductive features, such as for use in display applications. Antimony tin oxide (ATO) is useful as a color tunable oxide layer that finds use in electrochromic applications.

Such transparent conductive features can also be fabricated according to the present invention. For ITO, useful molecular precursors for indium include: In-nitrate; In-chloride; In-carboxylates such as In-acetate; In-propionates including fluoro, chloro or bromo derivatives thereof; beta diketonates such as In-acetylacetonate, In-hexafluoroacetylacetonate and In-trifluoroacetylacetonate; pyrazolyl borohydrides such as In(pz)$_3$BH; In-alkoxides and In-fluoroalkoxides; and In-amides. Mixed alkoxo In-carboxylates such as indium isopropoxide ethylhexanoate are also useful.

Useful molecular precursors for tin in ITO or ATO include: Sn-halides such as Sn-tetrachloride; Sn-dichloride; Sn-carboxylates such as Sn-acetate or Sn-ethylhexanoate; Sn-alkoxides such as Sn(O$^t$Bu)$_4$; Sn-hydroxycarboxylates such as Sn-glycolate; and beta diketonates such as Sn-hexafluoroacetylacetonate.

Useful molecular precursors for antimony include: Sb-trichloride; antimony carboxylates such as Sb-acetate or Sb-neodecanoate; antimony alkoxides such as Sb-methoxide, Sb-ethoxide, Sb-butoxide;

Resistor Tape Compositions

The present invention is also directed to tape compositions for the fabrication of low-, mid-, and high-ohm resistors. The major classes of conductor component materials for mid to high ohm resistors include metal rutile, pyrochlore, and perovskite phases, many of which contain ruthenium. Examples include RuO$_2$, Pb$_2$Ru$_2$O$_{6-7}$, SrRuO$_3$. Other metallic oxides which behave similarly to these ruthenates may be used. Substitutions for Ru can include Ir, Rh, Os. La and Ta compounds can also be used. Other conductive phases include materials such as carbon, zinc oxide, indium oxide, ITO and conductive glasses. Insulative components of the resistor may be formed from many types of glass materials including, but not limited to, lead borosilicate glass compositions.

The present invention is also directed to novel combinations of precursors that can be converted to a useful resistor at lower reaction temperatures than by using individual precursors. In one embodiment, a mixture of metal oxide precursors is dissolved in an aqueous solution and is adapted to form an amorphous lead zinc aluminum borosilicate glass with a conductive ruthenate phase at 300° C. This formulation can include ruthenium nitrosyl nitrate precursor plus lead acetate precursor to form a lead ruthenate conductive phase with lead acetate, aluminum nitrate, boric acid, zinc acetate and fumed silica nanoparticles forming the glass phase. A preferred combination for an organic based precursor composition includes ruthenium ethylhexanoate with other metal ethylhexanoates for lead, aluminum, zinc, boron and some silica nanoparticles or silane precursor in a solvent such as DMAc or tetrahydrofuran (THF). Precursors for insulative matrix materials include organosilanes and sol-gel type materials as precursors to silica. An insulative matrix can also be derived from polymer precursors such as polyamic acid. Other polymer matrix phases include a wide variety of polymer resins.

The resistor tape compositions can include various metal precursors. The metal precursors can include molecules that can be converted to metal oxides, glasses-metal oxide, metal oxide-polymer, and other combinations. Low-ohm resistors typically include a conductive phase such as silver metal with controlled amounts of an insulative phase such as a glass or metal oxide. Typically, the low-ohm resistor compositions include at least 50 volume percent of, an insulative phase. High-ohm resistors typically include a conductive oxide phase (e.g., a ruthenate compound) with controlled amounts of an insulative phase. The resistor precursor compositions of the present invention can therefore include molecular precursors to conductive phases and molecular precursors to insulative phases.

Depending on their nature, the molecular precursors to the resistor can react in the following ways:

Hydrolysis/Condensation

Anhydride Elimination

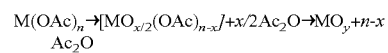

Ether Elimination $$M(OR)_n \rightarrow [MO_x(OR)_{n-x}] + R_2O \rightarrow MO_y + n\text{-}xR_2O$$

Ketone Elimination $$M(OOCR)(R') \rightarrow MO_y + R'RCO$$

Ester Elimination $$M(OR)_n + M'(OAc)_n \rightarrow [MM'O_x(OAc)_{n-x}(OR)_{n-x}] + ROAc$$
$$[MM'O_x(OAc)_{n-x}(OR)_{n-x}] \rightarrow MM'O_y + _{n-x}ROAc$$

Alcohol-Induced Ester Elimination $$M(OAc)_n + HOR \rightarrow [MO_x(OAc)_{n-x}] \rightarrow MO_y$$

Small Molecule-induced Oxidation $$M(OOCR) + Me_3NO \rightarrow MO_y + Me_3N + CO_2$$

Alcohol-Induced Ester Elimination $$MO_2CR + HOR \rightarrow MOH + RCO_2R \text{ (ester)}$$

$$MOH \rightarrow MO_2$$

Ester Elimination $$MO_2CR + MOR \rightarrow MOM + RCO_2R \text{ (ester)}$$

Condensation Polymerization $$MOR + H_2O \rightarrow (M_aO_b)OH + HOR$$
$$(M_aO_b)OH + (M_aO_b)OH \rightarrow [(M_aO_b)O(M_aO_b)O]$$

A particularly preferred approach is ester elimination.

Preferred precursors to conductive phases in tape compositions for resistor applications are described above with respect to metal phases and include metal alkoxides, carboxylates, acetylacetonates, and others. Ruthenates are typically used in resistor formulations for their temperature stability over a useful range of temperatures. Particularly preferred ruthenate precursors are ruthenium compounds such as Ru-nitrosylnitrate, Ru-ethylhexanoate and other ruthenium resinate materials. Other preferred combinations are any of the ruthenium compounds with: lead precursors such as Pb-acetate, Pb-nitrate or Pb-ethylhexanoate; bismuth precursors such as Bi-nitrate, Bi-carboxylates or Bi-beta-diketonates; and strontium precursors such as Sr-nitrate or Sr-carboxylates.

Other precursors to conductive, non-ruthenate materials can be used such as precursors to $IrO_2$, $SnO_2$, $In_2O_3$, $LaB_6$, $TiSi_2$ or TaN. Precursors to insulative phases include precursors to PbO, $B_2O_3$, $SiO_2$ and $Al_2O_3$. Such precursors can include boric acid, Si-alkoxides, Al-nitrate, Al-ethylhexanoate or other Al-carboxylates. The ratio of the insulative phase to the conductive phase can be adjusted to obtain a resistor having the desired properties.

Other preferred conductive phase precursors for low-ohm resistors include metals such as silver, metal ruthenates, and other conducting metal, metal oxide, nitride, carbide, boride and silicide compounds. Particularly preferred precursors are Ag-trifluoroacetate, Ag-neodecanoate, tetraamine palladium hydroxide, Pd-neodecanoate and Pd-trifluoroacetate.

Although the resistors can be derived from only molecular precursors, the resistor tape compositions can also include powders of conductor precursor and powders of insulator or powders of insulator and molecular precursors to conductive phases. Preferred conductor powders include metals and metal ruthenates such as strontium, bismuth and lead ruthenate. Preferred insulator powders include lead borosilicate glasses and other borosilicate glasses. Preferred molecular precursors to insulative phases include metal alkoxides and carboxylates.

The resistor tape compositions can include powders of conductors and powders of insulators. Preferred conductor powders include ruthenium-based metal oxides. Preferred insulator powders can include low melting glasses such as glasses having a melting point of not greater than about 500° C., more preferably not greater than about 400° C. It is preferred that the powders have a small particle size.

The conductor phase of the resistor can include a metal or a metal-containing compound such as a metal oxide, metal nitride, metal carbide, metal boride, metal oxycarbide, metal oxynitride, metal sulfide, metal oxysulfide, metal silicide or metal germanide. The conductor phase can also include carbon such as graphitic carbon. Preferred conductor metals include silver, copper, nickel. Preferred metal oxides include $RuO_2$, $SrRuO_3$, $Bi_xRu_yO_z$, and other Ru-based mixed metal oxides.

The insulator phase can include a glass. It can also include a ceramic or glass ceramic. The glass can be silica, a lead-based glass, lead borosilicate, lead aluminum borosilicate glass or a silver based glass.

Preferred processing temperatures for resistor tape compositions are not greater than about 900° C., more preferably not greater than about 500° C., more preferably not greater than about 400° C., even more preferably not greater than about 300° C. The preferred processing times are not greater than about 5 minutes, more preferably not greater than about one minute.

The resistor compositions can also combine conductor nanoparticles with glass precursor materials. The resistor compositions can also combine ruthenate precursor and/or particles with a sol-gel precursor to a silica or multi-component glass phase. The resistor composition can also include precursors compatible with organic solvents such as metal ethylhexanoate type precursors. The resistor compositions can be a combination of powder and precursor in aqueous or organic carriers.

The resistor composition can include a metal or metal alloy which exhibits good TCR characteristics with or without some insulating or semiconductive phase such as $SiO_2$, $ZrO_2$, $Al_2O_3$, $TiO_2$, ZnO or $SnO_2$ that limits the connectivity and current carrying area of the resistor. For example, Ag/Pd alloys can be produced having a temperature coefficient of resistance (TCR) of not greater than 100 ppm/° C. It is also possible to produce alloys such as Ni/Cr and other common resistor alloys under the correct processing conditions, such as by using a forming gas.

The present invention includes resistor tape compositions that are a combination of precursor and particles with a carrier. The tape composition can include one or more precursors and vehicle. The tape composition can include precursor, vehicle, and particles. The tape composition can include precursor, vehicle and polymer precursor. The tape composition can include polymer, precursor and vehicle. The tape composition can include glass and metal oxide particles. The tape composition can include glass and metal oxide particles and a precursor. The tape composition can include glass and metal particles. The tape composition can include glass and metal oxide particles and a precursor. The glass particles can be a conductive glass, for example a AgI doped $AgPO_3$ glass. The tape composition can use a precursor as a carrier material for particles to increase ceramic yield.

The present invention also provides combinations of conductive metal and metal oxide particles in a matrix derived from a low melting glass. The present invention also provides combinations of insulating particles in a matrix of conductive metal derived from particles and precursor. The present invention also provides combinations of composite particles, or composite and single phase particles, or composite particles and precursor, or composite particles and single-phase particles and precursor in a matrix derived from a polymeric precursor or resin.

Preferred conductor particles or phases include conductive metals, metal oxides, or conductive low melting point glasses such as AgI doped silver phosphate glass. Preferred insulator glass compositions include lead borosilicate and bismuth borosilicate. Preferred insulator particles include many metal oxides with insulative properties. The tape composition can include precursor to conductor and insulator. The tape composition can include a precursor to conductor with insulating particles, or precursor to insulator with conductive particles, or a combination of several precursors and particles. The tape composition can include small additions of TCR modifiers.

Preferred average particle sizes for the low melting glass particles are not greater than 1 μm, such as not greater than 0.5 μm. A bimodal or trimodal particle size distribution can advantageously be used to increase the packing density of the particles and increase the final density and uniformity of the structure. The preferred morphology for all particles is spherical in order to improve rheology and optimize particle loading in the precursor composition and the density of the processed resistor.

The tape compositions of the present invention can include a variety of material combinations. The resistor composition can be a composite. The composite can be metal-metal, metal-metal oxide, metal-polymer, metal oxide-polymer, metal-glass and other combinations. By way of example, a silver precursor can be combined with a palladium precursor to form a silver-palladium alloy. These tape compositions have applications in the fabrication of surge resistors. The metal-oxide composition can include ruthenium-based mixed metal oxides and various glasses. The metal-polymer resistors can include metal derived from powder and/or precursors, and polymer. The metal can include silver, nickel, copper, and other metals.

The metal-glass compositions can include metals and various glasses. The metals can include silver, copper, nickel, and others. The glasses can include lead-based glasses.

The resistor tape compositions according to the present invention can also utilize particles that result in an advantageous microstructure and promote uniformity of the structure with minimal processing time and temperature. Conductor particles for mid- to high-ohm resistors are traditionally sub-micron in size with a fairly high surface area. Insulative matrix particles have traditionally been larger than the conductive phase, with a mean particle size from about 1 μm to 4 μm. This forms a microstructure where ruthenate particles are segregated at interfaces of glass particles and tend to form conductive chains of conductor particles separated by glass, which has flowed and wetted to the conductor particles. Sub-micron particles may help dispersion of the conductive phase and lower processing temperature and time. The present invention includes the use of sub-micron particles for glass and ruthenate to improve the overall uniformity of a precursor composition. Morphology of particles also plays an important role in the processing characteristics of the precursor. Spherical glass matrix particles with fairly low surface areas and mean particle size of about 1 μm allow higher loading and better rheological characteristics. In one embodiment of the present invention, glass particles of sub-micron size are used, resulting in better uniformity in the precursor. Spherical glass particles with a bimodal size distribution are more desirable than a unimodal size distribution in terms of packing efficiency. It is important that the matrix particles have a low melting temperature, wet the conductor particles, have good TCR characteristics and good stability. An optimal resistor particle can include a composite particle having a microstructure that is already evolved after powder processing.

In one embodiment of the present invention, a tape composition includes a lead borosilicate glass or other low melting glass, or a higher melting temperature glass in a composite particle with a segregated ruthenate phase, for example a particle incorporating separate phases of ruthenate and matrix glass. This composition allows tailoring of bulk properties (i.e., $\rho$, TCR, tolerance, etc.) into a single powder component. Such composite particles will give properties that are less dependent on processing temperature parameters. Composite particles will have an intrinsic microstructure similar to that of the developed microstructure of a thick film resistor, with phase-separated ruthenate regions in a dielectric matrix of glass with ruthenium and other ions diffused into dielectric regions. This could be accomplished by firing the resistor material in bulk and fritting the resultant material into a "resistor" powder. This would allow resistivities indicative of volume loading of resistor and higher processing temperatures.

In another embodiment precursors are combined in a spray pyrolysis process to produce a powder. In this embodiment of the present invention, the composite resistor particles are substantially spherical. This allows a tape composition consisting almost entirely of spherical particles. Ruthenate resistors can also be made with higher conductor loading but without the resultant roughness and porosity usually associated with use of non-spherical particles.

Another advantage of using composite particles is that these particles have qualities more representative of the bulk properties. Processing will typically require less time at a lower temperature to realize the (diffusion induced) necessary properties while retaining a very robust, high performance resistor. Such a composition can be designed to be fired at 500° C. or less. In addition, a much more rapid thermal process could be employed such as an IR furnace or a laser.

In yet another embodiment of the present invention, composite particles are mixed with another resistor powder or with another glass powder to give desired properties at lower temperatures. In the case of using a higher temperature glass composition, a low melting glass or dopant material (PbO, BiO) can be used to bond the "resistor" particles at lower temperatures. Because the resistor particles should exhibit bulk properties by themselves, it is not necessary to achieve a totally dense structure to achieve certain resistance values. Therefore, resistor particles could be partially necked and infiltrated with a low melting glass, polymeric material, or a silanating agent to keep water and other environmental factors from changing the resistor. It is also possible to achieve improved characteristics with a high loading of composite resistor particles in a polymer matrix.

The resistor tape compositions according to the present invention typically include particulates in the form of micron-size particles and/or nanoparticles, unless a precursor is dissolved in a high-viscosity vehicle.

In low ohm resistor compositions, preferred particle compositions include silver, palladium, copper, gold, platinum, nickel, alloys thereof, composites thereof (2 or more separate phases), core-shell structures thereof (coated particles). For low cost resistors, particle compositions can be selected from the group of copper aluminum, tungsten, molybdenum, zinc, nickel, iron, tin, solder, and lead. Transparent conductive particles can also be used, for example particulates of ZnO, $TiO_2$, $In_2O_3$, indium-tin oxide (ITO), antimony-tin oxide (ATO). Other conductive particles such as titanium nitride, various forms of carbon such as graphite and amorphous carbon, and intrinsically conductive polymer particles can also be used.

Other particles that can be used in the present invention belong to the group of glass particles, preferably low melting point glass particles, and even more preferably conductive low melting point glass particles such as silver doped phosphate glasses.

A mixture of a high melting point metal powder such as Cu and a low-melting point metal powder can be formulated into a tape so that the low melting point powder melts and fills up the voids between the high melting point metal particles.

Finally, particulates can also be in the form of solid precursors to a conductive phase, such as $Ag_2O$ nanoparticles.

Most of the subsequent description relating to optimum packing of particles in resistor tape compositions applies directly to dielectric tape compositions as well. The traditional route to high performance resistors is dominated by sintering of ceramic/glass composites at high temperatures, which eliminates porosity and allows for high degrees of crystallization, which yield high performance. When processing at low temperatures sintering will not occur and other methods must be employed to achieve the best performance. The resistivity of a composite also follows a logarithmic mixing rule where the log of the resistivity of the composite is a sum of the resistivities of the phases $(r_i)$ multiplied by their volume fractions $(V_i)$. Thus, air gaps or voids will dramatically reduce the conductivity of the composite. In addition, stress and moisture associated with these voids will reduce stability and reproducibility. This leads to two pursuable routes to obtain reproducible resistor values. One is to maximize the volume fraction of the resistive and insulative phases, and the other is to control the resistivity of the two phases and their morphology after firing. Both are determined by the material properties, the particle size distribution of the two phases, and the firing profile.

The resistor tape compositions of the present invention enable the efficient packing of particles at low firing temperatures, as is discussed below for dielectric precursor compositions.

In resistor tape compositions that include a molecular precursor and powders (nanoparticles and/or micron-size particles), the ratio of precursors to powders is ideally close to that corresponding to the amount needed to fill the spaces between particulates with material derived from the precursors. However, a significant improvement in tolerance can also be obtained for lower levels of molecular precursor. It is preferred that at least about 5 vol. %, more preferably at least about 10 vol. % and even more preferably at least about 15 vol. % of the final resistor is derived from the precursor.

Other resistor tape compositions according to the present invention are preferred for different applications. Typically, the tape composition will take into account the deposition mechanism, the desired performance of the features and the relative cost of the features. For example, simple circuitry on a polymer or other organic substrate designed for a disposable, high-volume application will require a low cost precursor composition but will not require electronic features having superior properties. On the other hand, higher end applications will require electronic features having very good electrical properties and relative cost of the precursor composition will typically not be a significant factor.

Dielectric Tape Compositions

Tape compositions for the transfer and formation of dielectric layers can include molecular precursors with no powder. The dielectric compositions can also include at least one precursor to a dielectric material and at least one precursor to an insulator material.

For dielectric materials, the formation of carbon during the conversion of a molecular precursor should be avoided because it can lead to a high degree of dielectric loss. Many high-k dielectric compositions contain barium. When processed in air, barium precursors are susceptible to formation of barium carbonate. Once barium carbonate is formed, it cannot be converted to an oxide below 1000° C. Therefore, barium carbonate formation should be avoided. It is also known that hydroxyl groups are an important source of loss in dielectric metal oxides and the condensation reactions to convert metal hydroxides to metal oxides are not complete until about 800° C. (for isolated surface hydroxyl groups). The present invention includes precursor compositions that avoid hydrolytic-based chemistry such as sol-gel-based hydrolysis and condensation routes.

For layers with low dielectric loss and high dielectric constant, the incorporation of porosity is detrimental to the performance of these layers as a result of the high internal surface area and the contribution of the dielectric properties of the material trapped inside the pores, especially air. Therefore, porosity should be reduced to a minimum.

The metal oxide phases that lead to the desired dielectric properties also require that the material be highly crystalline. The desired metal oxides do not crystallize until a high temperature and so a method that relies on a low temperature precursor composition that only includes a molecular precursor to the final phase will have both a low material yield and poor crystallinity. Conversely, a composition and method relying on only particulate material will likely provide high porosity if processed below 300° C.

The present invention includes dielectric tape compositions that address these issues and can be converted at low temperatures to form high performance dielectric features. The compositions can include a large volume and mass fraction of highly crystalline, high performance dielectric powder such as $BaTiO_3$ or $BaNd_2Ti_5O_{14}$ that has the desired dielectric constant, has a low temperature coefficient and has a low loss. The tape composition can include a smaller fraction of precursor to another material for which precursors are available that have the following characteristics:

Avoid the intermediate formation of hydroxyl groups.

Have ligands that react preferentially to give a single-phase complex stoichiometry product rather than a mixture of a number of different crystalline phases.

Can be processed to form a crystalline phase at low temperatures.

Have high ceramic yield.

Which result in a good dielectric constant (k), low loss and small temperature coefficient contribution.

An example of such a target phase is $TiO_2$ or $Zr_{0.40}Sn_{0.66}Ti_{0.94}O_2$.

One embodiment of the present invention utilizes novel combinations of molecular precursors that provide lower reaction temperatures than can be obtained through individual precursors. The precursors can include molecules, that can be converted to metal oxides, glass-metal oxide, metal oxide-polymer, and other combinations. The dielectric tape compositions of the present invention can include novel combinations of precursors that provide lower reaction temperatures to form dielectric features than can be obtained through individual precursors. An example of one such combination is Sn-, Zr-, and Ti-oxide precursors.

Depending on their nature, the precursors can react in the following ways:

Hydrolysis/Condensation $$M(OR)_n + H_2O \rightarrow [MO_x(OR)_{n-x}] + MO_y$$

Anhydride Elimination $$M(OAc)_n \rightarrow [MO_{x/2}(OAc)_{n-x}] + x/2 Ac_2O \rightarrow MO_y + n\text{-}x\, Ac_2O$$

Ether Elimination $$M(OR)_n \rightarrow [MO_x(OR)_{n-x}] + R_2O \rightarrow MO_y + n\text{-}xR_2O$$

Ketone Elimination $$M(OOCR)(R') \rightarrow MO_y + R'RCO$$

Ester Elimination $$M(OR)_n + M'(OAc)_n \rightarrow [MM'O_x(OAc)_{n-x}(OR)_{n-x}] + ROAc\ [MM'O_x(OAc)_{n-x}(OR)_{n-x}] \rightarrow MM'O_y + n\text{-}x\, ROAc$$

Alcohol-Induced Ester Elimination $$M(OAc)_n + HOR \rightarrow [MO_x(OAc)_{n-x}] \rightarrow MO_y$$

Small Molecule-Induced Oxidation $$M(OOCR) + Me_3NO \rightarrow MO_y + Me_3N + CO_2$$

Alcohol-Induced Ester Elimination $$MO_2CR + HOR \rightarrow MOH + RCO_2R\ (\text{ester})$$

$$MOH \rightarrow MO_2$$

Ester Elimination $$MO_2CR + MOR \rightarrow MOM + RCO_2R\ (\text{ester})$$

Condensation Polymerization $$MOR + H_2O \rightarrow (M_aO_b)OH + HOR$$
$$(M_aO_b)OH + (M_aO_b)OH \rightarrow [(M_aO_b)O(M_aO_b)O]$$

A particularly preferred approach is ester elimination, including a sol-gel process utilizing alcohol ester elimination. A preferred combination of precursors is Sn-ethylhexanoate, Zr-ethylhexanoate and dimethoxy titanium neodecanoate. These precursors can be advantageously used in an organic based precursor tape formulation. In this case, the presence of metal alkoxides precludes the use of water. The nature and the ratio of the ligands used in these precursors are critical to achieve a low conversion temperature. Generally, small ligands that can escape cleanly without leaving carbon residue during conversion are preferred. For example, this can be achieved by formation of ethers from alkoxide ligands or by formation of anhydrides from carboxylates. Another preferred combination is the use of a mixed ligand system such as a carboxylate and an alkoxide that can be bound to either the same or different metal centers. Upon conversion, the metal oxygen bonds are broken and small molecules are eliminated. A carboxylate to alkoxide ratio of about 1:1 is preferred because of the formation of organic esters at lower temperatures.

In accordance with the forgoing, useful precursors (where metal=Sn, Zr, Ti, Ba, Ca, Nd, Sr, Pb, Mg) include:

1) Metal alkoxides such as Sn-ethoxide, Zr-propoxide, Pb-butoxide, Pb-isopropoxide, Sn-neodecanoate;

2) Metal carboxylates such as metal fluorocarboxylates, metal chlorocarboxylates, metal hydroxocarboxylates-specific examples include Ba-acetate, Sn-ethylhexanoate, and Pb-carboxylates such as Pb-acetate, Pb-trifluoroacetate and Pb-ethylhexanoate;

3) Metal betadiketonates including Pb-betadiketonates such as Pb-acetylacetonate and Pb-hexafluoroacetylacetonate; and 4) Mixed alkoxo metal carboxylates (where metal=Sn, Zr, Ti, Ba, Ca, Nd, Sr, Pb, Mg) are also useful. An example is dimethoxy titanium neodecanoate. Dialkoxo titanium dicarboxylate precursors in the dielectric formulations can also serve as an adhesion promotor.

A dielectric tape composition can include a dielectric powder and a precursor to an insulative phase. Alternatively, the ribbon can include an insulative powder and a precursor to a dielectric phase. Preferred dielectric powders (nanoparticles or micron-size particles) include. $BaTiO_3$, lead magnesium niobate (PMN), lead zirconium titanate (PZT), doped barium titanate (BTO), barium neodymium titanate (BNT), lead tantalate ($Pb_2Ta_2O_7$), and other pyrochlores. These powders can be pre-fired at higher temperatures prior to being incorporated into a tape. Preferred insulative powders include $TiO_2$, $SiO_2$, and insulating glasses. Preferred insulative phase precursors include organic titanates such as titanium bis(ammonium lactato) dihydroxide; mixed alkoxo titanium carboxylates such as dimethoxy titanium bis(neodecanoate) or dibutoxy titanium bis(neodecanoate); silicon alkoxides such as silicon methoxide and silicon ethoxide. Preferred dielectric phase precursors include metal alkoxides, carboxylates and beta-diketonates to form the mixed metal oxide as listed above.

Another consideration when using tape compositions containing dielectric particles that are formulated to be converted at a low temperature is that the particles must possess properties close to the final desired physical properties of the fully processed devices. Optimization of the intrinsic properties of the particles is crucial because recrystallization and annealing of crystal defects during thermal processing is often not possible at processing temperatures of less than 500° C. Maximization of dielectric constant in the final material requires maximization of the dielectric constant of the powders because the composition is subjected to low temperatures for short times, which are insufficient to increase the crystallinity of the high-k powder during processing.

In one embodiment, the tape composition utilizes dielectric powders with dielectric constants (k) preferably greater than 500 and more preferably greater than 1000. The dielectric constant of the powder can be measured as follows: A pellet is pressed from the dry powder and calcined at 400° C. for one hour to drive off water. The pellet is then placed between metal electrodes and the capacitance is measured as a parallel plate capacitor, over the frequency range of 1 kHz to 1 MHz. Based on the geometry and packing density, the logarithmic rule of mixtures is applied, assuming the two phases present are the powder and air, and the dielectric constant of the powder alone is calculated.

In another embodiment, a tape composition utilizes dielectric powders with dielectric constants greater than 2000. Such high dielectric constant can be obtained in a powder in various ways. One way is the use of spray pyrolysis, which allows for the addition of dopant in each individual particle. Another way is the use of annealing of particle beds at elevated temperatures such as 900° C. to 1000° C. to improve particle composition and particle crystallinity followed by milling to break up any soft agglomerations formed during firing. A rotary calcine can be used to anneal and limit particle agglomeration.

In another embodiment, a tape composition includes low loss dielectric powders having a loss of less than 1%, more preferably less than 0.1%, and most preferably less than 0.01%, over the frequency range of 1 kHz to 1 MHz. The dielectric loss can be measured as follows: A pellet is pressed from the dry powder and calcined at 400° C. to drive off surface water. Once the pellet has been dried, it is kept in a dry environment. The pellet is then placed between electrodes and the loss measured as a parallel plate capacitor over the frequency range of 1 kHz to 1 MHz.

In another embodiment, a tape composition utilizes high-k or low loss dielectric powders as described above, where the particles are exposed to a liquid surface modification agent, such as a silanating agent. The purpose of this treatment is the elimination of surface defects such as hydroxyl groups that induce dielectric loss and/or sensitivity to humidity in the final low-fired dielectric layer. The silanating agent can include an organosilane. For example, a surface-modifying agent is exposed as a gas in a confined enclosure to the powder bed and allowed to sit for about 15 minutes at 120° C. for 10 minutes, completing the surface modification.

Useful organosilanes include $R_nSiX_{(4-n)}$, where X is a hydrolysable leaving group such as an amine (e.g., hexamethyldisilazane), halide (e.g., dichlorodimethylsilane), alkoxide (e.g., trimethoxysilane, methacryloxypropyltrimethoxysilane, N-methyl-3-aminopropyltrimethoxysilane), or acyloxy (e.g., acryloxytrimethylsilane).

Hydrolysis and condensation can occur between organosilane and surface hydroxy groups on the dielectric particle surface. Hydrolysis occurs first with the formation of the corresponding silanol followed by condensation with hydroxo groups on the metal oxide surface. As an example:

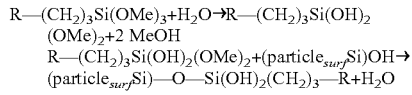

where

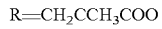

Particularly preferred compositions for high dielectric constant powders are those having the perovskite structure. Examples include metal titanates, metal zirconates, metal niobates, and other mixed metal oxides. Particularly useful is the barium titanate system which can reach a broad range of dielectric performance characteristics by adding small levels of dopant ions. Specific examples include $BaTiO_3$, $PbTiO_3$, $PbZrO_3$, $PbZr_xTi_{1-x}O_3$ and $PbMg_{1/3}Nb_{2/3}O_3$.

Particularly preferred compositions for low loss dielectric constant powders are $Zr_{0.7}Sn_{0.3}TiO_4$, $Zr_{0.4}Sn_{0.66}Ti_{0.94}O_4$, $CaZr_{0.98}Ti_{0.02}O_3$, $SrZr_{0.94}Ti_{0.06}O_3$, $BaNd_2Ti_5O_{14}$, $Pb_2Ta_2O_7$, and various other pyrochlores.

The dielectric tape compositions of the present invention uniquely allow for the use of two or more different particles, such as by mixing $Al_2O_3$ and $TiO_2$ particles, or barium titanate and PZT particles. These compositions will not interdiffuse significantly during firing below 600° C., preserving their unique dielectric properties. These compositions can be tailored to have a very low TCC value combined with very low loss.

Preferred glass compositions are low melting temperature glasses, such as borosilicate glasses doped with lead or bismuth. The preferred average particle size for the glass powder is no larger than the other particles present, and more preferably is less than about half the size of the other particles.

The preferred average particle size of the low melting glass particles is on the order of the size of the dielectric particles, and more preferably is about one-half the size of the dielectric particles, and most preferably is about one quarter the size of the dielectric particles.

A bimodal size distribution of particles, as is discussed above, enhances the packing density and is desired to increase the performance, preferably with the smaller particles being about 10 wt. % of the total mass of powder.

The precursor tape compositions of the present invention can be transferred and converted to a dielectric material at a low temperature. The preferred conversion temperature is less than 900° C. for ceramic substrates. For glass substrates, the preferred conversion temperature is not greater than 600° C. Even more preferred for glass substrates is a conversion temperature of not greater than 500° C., such as not greater than 400° C. The preferred conversion temperature for organic substrates is not greater than 350° C., even more preferably not greater than 300° C., and even more preferably not greater than 200° C.

The present invention provides dielectric tape compositions capable of forming combinations of high-k particles and matrix derived from a precursor or a low melting glass or both. Preferred particles for high-k materials are lead magnesium niobate (PMN, $PbMg_{1/3}Nb_{2/3}O_3$), $PbTiO_3$ (PT), PMN-PT, $PbZr_xTi_{1-x}O$ (PZT), and doped $BaTiO_3$. Preferred particles for low loss applications are barium neodymium titanate (BNT, $BaNd_2Ti_5O_{14}$), zirconium tin titanate (ZST, $Ti_{0.94}Zr_{0.4}Sn_{0.66}O_4$), lead tantalate ($Pb_2Ta_2O_7$). Preferred glass compositions are low melting sealing glasses with a melting point below 500° C., more preferably below 400° C., even more preferably below 300° C. Preferred low melting glass particles for high-k compositions have high dielectric constants, typically in the range from 10 to 40, more preferably higher than 40. Preferred low melting glass particles for high-k compositions have low dielectric loss characteristics, preferably not greater than 2%, more preferably not greater than 1%, even more preferably not greater than 0.1%.

There are essentially two routes to formation of dielectric materials according to the present invention: a precursor plus powders approach, and a powders only approach. Ceramic products that are desirably formed using a precursor plus powder method include: $BaTiO_3$—$PbZr_xTi_{1-x}O_3$, $BaTiO_3$—$TiO_2$, $BaTiO_3$—$TiZr_xSn_{1-x}O_4$, $BaNd_2Ti_5O_{14}$—$TiZr_xSn_{1-x}O_4$. These basic building blocks may be enhanced by the application of surface modification (silanation), or the addition of low melting temperature glass.

The precursor-based approach for dielectrics requires the combination of a dielectric powder with a precursor to a dielectric. The general approach is to first disperse the dielectric powder in a low boiling point solvent. The precursor is then added to the dispersion and most of the solvent is removed, leaving a thick precursor consisting of particles and precursor with a trace amount of solvent.

An approach exploiting low melting glasses (LTG) is desirable for: $BaTiO_3$-LTG, $BaNd_2Ti_5O_{14}$-LTG and $PbMg_{1/3}Nb_{2/3}O_3$-LTG. The glass-based approach combines a low melting point glass with one or more dielectric powders. For this approach to be successful the particle size of the glass phase is critical. If the glass particles are larger than the dielectric powder, they will either pool when melted, forming inhomogeneities, or they will wick into the porous arrangement of dielectric particles leaving behind voids.

The general approach according to the present invention is to coat the powders with a dispersant while in a vehicle then remove the vehicle. The coated powders are then combined in the desired ratio and milled with a solvent and binder system. The desired ratio of glass to particles will vary by application and desired final properties, but will be governed by the following criteria. The dielectric phase is targeted to occupy the majority of the final composite depending on the particle size distribution of the powder. For example, a monomodal powder would be targeted to occupy 63% of the composite. The glass phase is then targeted to occupy the remaining volume, in the example here, 37%. This calculation provides the minimum glass loading and there may be some applications where more glass is used.

The dielectric tape compositions of the present invention are based on optimizing the dielectric performance of a multiphase composite by combining the phases in the best possible way. The traditional route to high performance dielectrics is dominated by sintering of ceramics at high temperatures, which eliminates porosity and allows for high degrees of crystallization, which yield high performance. When processing at low temperatures, sintering will not occur and other methods must be employed to achieve the best performance. One route to accomplish this is to densely pack dielectric powders and fill the remaining voids with another component. This route has been used in polymer thick film by using a polymer to fill the voids. The dielectric constant of a composite follows a logarithmic mixing rule:

$$\log K = \sum_l V_l \log K_l,$$

where the log of the dielectric constant of the composite is a sum of the dielectric constants of the phases ($K_l$) multiplied by their volume fractions ($V_l$). Filling the voids with a low dielectric constant material, for example a polymer, would dramatically reduce the dielectric constant of the composite. For example, if a dielectric powder with a dielectric constant of 5000 is packed 60% dense and the remaining volume is filled with a polymer having a dielectric constant of 4, the resulting dielectric constant of the composite is 289. This equation leads to two pursuable routes to maximizing the dielectric constant. One is to maximize the volume fraction of the high dielectric constant particles, and the other is to increase the dielectric constant of the matrix phase.

The packing of spherical particles has been studied thoroughly and the best packing of monomodal spheres results in 74% efficient space filling, with a random packing resulting in a density of about 63%, or the practical limit for monomodal packing. Pauling's rules for packing of spheres shows that perfect packing results in two different sized interstitial voids throughout the structure. To fill the larger voids with smaller spheres, one would target a radius ratio of small particle to big particle of 0.414. To fill the smaller voids would require a radius ratio of small particle to big particle of 0.225. Using a trimodal distribution of spherical particles in accordance with the present invention and assuming perfect packing of the system, 81% of the space. Naturally, this process could be continued filling the voids between the spheres with smaller and smaller spheres, but there is a diminishing return and physical limits that prohibit packing to 100% density by this approach. With particles in the micron range and traditional processing techniques, a density of 70% would be achievable and anything higher would be a significant advance in the art.

It is an object of the present invention to maximize the dielectric constant of the matrix. Most polymers have dielectric constants ranging from 2 to 10. Most glasses are not much higher, but glasses with high lead or bismuth contents can have dielectric constants upwards of 40. The best way to achieve the high dielectric constant matrix is to use a metal oxide such as barium titanate. To achieve this at low processing temperatures requires a dielectric precursor approach. Metal oxide precursors can form traditional high dielectric constant morphologies at low temperatures. The compositions and methods of the present invention can produce a high ceramic yield and a high degree of crystallinity.

The present invention is also particularly useful for making low loss materials. Some of the major classes of materials that can be utilized or formed by the present invention include:

Ba-Ln-Ti—O (Ln=Nd, Sm), $(Zn,Sn)_x(Ti,Sn)_yO_4$, $Ba_2Ti_9O_{20}$ $Ba_3Ta_2MeO_9$ (Me=Zn or Mg). Specific examples include:

Ba—Pb—Nd—Ti—O, $Ba(Mg_{1/3}Ta_{2/3})O_3$—$BaO$—$Nd_2O_3$-$5TiO_2$ $Ba_{4.5}Nd_9Ti_{18}O_{54}$, with small additions of $Bi_2O$ or bismuth titanate, $ReBa_3Ti_2O_{8.5}$ (Re=Y, Nd, and Sm), $Ba_{3.75}Nd_{9.5}Ti_{18}O_{54}$ with 1.0-4.0 wt. % $Bi_2O_3$ $BaO$-$Ln_2O_3$-$5TiO_2$ (Ln=La, Pr, Nd, Sm), $BaO$—$Nd_2O_3$—$TiO_2$ $Ba_{6-x}(Sm_{1-y}Nd_y)_{8+2x/3}Ti_{18}O_{54}$, (Ba,Pb)O—$Nd_2O_3$—$TiO_2$ (CaO doped) and $Ti_{0.94}Zr_{0.4}Sn_{0.66}O_4$ Another class of materials that can be utilized are the pyrochlores, having the general formula $A_2B_2O_7$, for example $Pb_2Ta_2O_7$. The present invention is useful for making high dielectric constant materials. One family of materials that can be used are those having a perovskite structure. Examples include metal titanates, metal zirconates, metal niobates, and other mixed metal oxides. Of extensive use has been the barium titanate system, which can reach a broad range of dielectric performance characteristics by adding small levels of dopant ions. Specific examples include: $BaTiO_3$, $PbTiO_3$, $PbZrO_3$, $PbZr_xTi_{1-x}O$, $PbMg_{1/3}Nb_{2/3}O_3$.

Solvents for Molecular Precursor

As is discussed above, the precursor compositions can include molecular precursor compounds, optionally dissolved in solvents, as well as other additives. A paste or ink used to form the tape composition typically includes a precursor compound, particles, a vehicle and other additives such as surfactants and rheology additives. These compositions can be used in the fabrication of the ribbon by depositing them on a carrier. In one embodiment, the main role of the solvent is to assist in the deposition of the tape material on the carrier or to otherwise aid in the formation of the ribbon or tape structure. When the ribbon or tape structure is complete, the solvent may be partially or completely removed as part of the tape fabrication process. In cases where the solvent is substantially removed during the ribbon formation process, the tape or the ribbon are labeled as dry tape or as dry ribbon. If all or a portion of the solvent remains in the tape, the tape is often referred to as a wet tape.

The solvent can be water thereby forming a tape derived from an aqueous-based precursor composition. Alternatively, the solvent can be an organic solvent. Particularly preferred organic solvents include N,N,-dimethylacetamide (DMAc), ethanolamine and N-methylpyrrolidone.

The tape compositions of the present invention exploit combinations of solvents and precursors that advantageously provide high solubility of the precursor while still allowing low temperature formation of the final electronic component after transfer and processing.

According to the present invention, the solubility of the molecular precursor in the solvent is preferably at least about 20 weight percent precursor, more preferably at least 40 weight percent precursor, even more preferably at least about 50 weight percent precursor and most preferably at least about 60 weight percent precursor. Such high levels of metal precursor lead to increased metal yield.

In some cases, the solvent is a high melting point solvent, such as one having a melting point of at least about 30° C. and not greater than about 100° C. In this embodiment, the solvent can serve multiple roles and can serve as the binder and/or the vehicle, as discussed below. In this embodiment, a heated precursor tape can be used to deposit the composition while in a flowable state whereby the solvent solidifies upon contacting the substrate. Tape transfer and subsequent processing can then remove the solvent by heating or other means and then convert the material to the final product, thereby retaining resolution. Preferred solvents according to this embodiment are waxes, high molecular weight fatty acids, alcohols, DMAc, water, acetone, N-methyl-2-pyrrolidone, toluene, tetrahydrofuran and the like. Alternatively, the precursor tape may be a liquid at room temperature, preferably a high viscosity liquid. In this case, the substrate can be kept at a lower temperature below the freezing point of the precursor tape, limiting spreading of the tape material after transfer. The solvent can also be a low melting point solvent. A low melting point is required when the precursor tape must remain as a liquid on the substrate until dried. A preferred low melting point solvent according to this embodiment is DMAc.

In addition, the solvent can be a low vapor pressure solvent. A lower vapor pressure advantageously prolongs the work life of the composition in cases where evaporation can lead to problems. A preferred solvent according to this embodiment is terpineol. Other low vapor pressure solvents include diethylene glycol, ethylene glycol, hexylene glycol, N-methyl-2-pyrrolidone, and tri(ethylene glycol) dimethyl ether.

The solvent can also be a high vapor pressure solvent, such as one having a vapor pressure of at least about 1 kPa. A high vapor pressure allows simple removal of the solvent by drying. Other high vapor pressure solvents include acetone, tetrahydrofuran, toluene, xylene, ethanol, methanol, 2-butanone, water, ethers and dimethylsulfoxide.

The solvents can be polar or non-polar. Solvents that are useful according to the present invention include amines, amides, alcohols, water, ketones, unsaturated hydrocarbons, saturated hydrocarbons, mineral acids organic acids and bases, Preferred solvents include alcohols, amines, amides, water, ketone, ether, aldehydes and alkenes. Particularly preferred organic solvents according to the present invention include N,N,-dimethylacetamide (DMAc), diethyleneglycol butylether (DEGBE), ethanolamine, N-methyl pyrrolidone and dimethylsulfoxide.

Vehicles

As is discussed above, a vehicle is a flowable medium that facilitates the deposition of a flowable composition on a substrate. In the context of the present invention, this substrate is the temporary or permanent carrier or backing support for a tape. As is discussed above, this tape composition is formed or manufactured as an intermediate "precursor material" to be transferred to the final substrate. In many compositions for tape manufacture, especially those containing particles, the solvent can also be considered the vehicle. In another embodiment, the metal such as silver can be bound to the vehicle, for example, by synthesizing a silver derivative of terpineol that simultaneously acts as both a precursor to silver and as a vehicle. This improves the metallic yield and reduces the porosity of the conductive feature. In cases where a dry ribbon is produced, the vehicle content is substantially reduced during tape fabrication.

Examples of preferred vehicles are listed in Table 4. Particularly preferred vehicles according to the present invention can include alpha terpineol, toluene and ethylene glycol.

TABLE 4

Organic Vehicles Useful in the Fabrication of Tapes

| Formula/Class | Name |
|---|---|
| Alcohols | 2-Octanol |
| | Benzyl alcohol |
| | 4-hydroxy-3methoxy benzaldehyde |
| | Isodeconol |
| | Butylcarbitol |
| Terpene alcohol | Alpha terpineol |
| | Beta-terpineol |
| | Cineol |
| Esters | 2,2,4 trimethylpentanediol-1,3 monoisobutyrate |
| | Butyl carbitol acetate |
| | Butyl oxalate |
| | Dibutyl phthalate |
| | Dibutyl benzoate |
| | Butyl cellosolve acetate |
| | Ethylene glycol diacetate |
| | N-methyl-2-pyrolidone |
| Ethers | Ethyl Ether |
| | Diethyl ether |
| | Methyl phenyl ether |
| | R-O-AR, R-O-R and AR-O-AR, where R = alkyl, AR = aryl or vinyl |
| | Tetrahydrofuran (THF) |
| Amides | N,N-dimethyl formamide |
| | N,N-dimethyl acetamide |
| Aromatics | Xylenes |
| | Aromasol |
| Substituted aromatics | Nitrobenzene |
| | o-nitrotoluene |
| Terpenes | Alpha-pinene, beta-pinene, dipentene, dipentene oxide |
| Essential Oils | Rosemary, lavender, fennel, sassafras, wintergreen, anise oils, camphor, turpentine |

Polymers

The tape compositions in accordance with the present invention can also include one or more polymers. The polymers can be thermoplastic polymers or thermoset polymers. Thermoplastic polymers are characterized by being fully polymerized. They do not take part in any reactions to further polymerize or cross-link to form a final product. Typically, such thermoplastic polymers are melt-cast, injection molded or dissolved in a solvent. Examples include polyimide films, ABS plastics, vinyl, acrylic, styrene polymers of medium or high molecular weight and the like.

The polymers can also be thermoset polymers, which are characterized by not being fully polymerized or cured. The components that make up thermoset polymers must undergo further reactions to form fully polymerized, cross-linked and dense final products. Thermoset polymers tend to be resistant to solvents, heat, moisture and light.

A typical thermoset polymer mixture initially includes a monomer, resin or low molecular weight polymer. These components require heat, hardeners, light or a combination of the three to fully polymerize. Hardeners are used to speed the polymerization reactions. Some thermoset polymer systems are two part epoxies that are mixed at consumption or are mixed, stored and used as needed.

Specific examples of thermoset polymers include amine or amide-based epoxies such as diethylenetriamine, polyglycoldianine and triethylenetetramine. Other examples include imidazole, aromatic epoxies, brominated epoxies, thermoset PET, phenolic resins such as bisphenol-A, polymide, acrylics, urethanes, and silicones. Hardeners can include isophoronediamine and meta-phenylenediamine.

The polymer can also be a ultraviolet or other light-curable polymer. The polymers in this category are typically UV and light-curable materials that require photoinitiators to initiate the cure. Light energy is absorbed by the photoinitiators in the formulation causing them to fragment into reactive species, which can polymerize or cross-link with other components in the formulation. In acrylate-based adhesives, the reactive species formed in the initiation step are known as free radicals. Another type of photoinitiator, a cationic salt, is used to polymerize epoxy functional resins generating an acid, which reacts to create the cure. Examples of these polymers include cyanoacrylates such as z-cyanoocrylic acid methyl ester with an initiator as well as typical epoxy resin with a cationic salt.

The polymers can also be conductive polymers such as intrinsically conductive polymers. Conductive polymers are disclosed, for example, in U.S. Pat. No. 4,959,430 by Jonas et al., which is incorporated herein by reference in its entirety. Other examples of intrinsically conductive polymers are listed in Table 5 below.

structure, will enable the transfer of tape material resulting in better performance and smaller minimum feature sizes. The addition of precursors that convert to the functional material at low temperatures, can be used to lower the processing temperature after tape transfer. In addition, the paste rheology and paste formulation must meet a number of requirements that are specific to the laser transfer process. The coating has to be optimized to avoid the spreading of material packets during transfer resulting in loss of cohesiveness. This will not only reduce resolution, but will also have a negative impact on the materials performance that can be achieved by post deposition processing. An additional complication, which is inherent to the ribbon approach, is the need for mechanical strength and the requirement for extended shelf life of ribbon. This is due to the large surface area of the coating material and the possible associated evaporation of volatile components in the liquid matrix material. The binder can also be an elastomer, wherein the polymer is above its glass transition temperature and is flexible.

Binders can be used in the tape and ribbon compositions of the present invention to provide mechanical cohesion and strength to the other components including particles precursors, and other functional materials that may be added to the

TABLE 5

Intrinsically Conductive Polymers

| Examples | Class/Monomers | Catalyst/Dopant |
|---|---|---|
| | Polyacetylene | |
| Poly[bis(benzylthio) acetylene] | Phyenyl vinyl sulfoxide | Ti alkylidene |
| Poly[bis(ethylthio)acetylene] | | |
| Poly[bis(methylthio)acetylene] | 1,3,5,7-Cyclooctatetraene | |
| | Polyaniline | |
| Fully reduced | | organic sulfonic acids such as: |
| Half oxidized | | Dinonylnaphthalenedisulfonc acid |
| | | Dinonylnaphthaleneusulfonic acid |
| | | Dodecylbenzenesulfonic acid |
| | | Cond: 2-4 S/cm |
| | Poly(anilinesulfonic acid) | |
| Self-doped state | | |
| | Polypyrrole | |
| | | Organic sulfonic acid |
| | Polythiophene | |
| Poly(thiophine-2.5-diyl) | 2,5-Dibromo-3-alkyl/arylthiophene | |
| Poly(3-alkylthiophene-2.5-diyl) | alkyl = butyl, hexyl, octyl, | |
| alkyl = butyl, hexyl, octyl, | decyl, dodecyl | |
| decyl, dodecyl | aryl = phenyl | |
| Poly(styrenesulfonate)/poly- | Dibromoithiophene | |
| (2,3-dihydrothieno-[3,4-b]-1,4- | Terthiophene | |
| dioxin) | Other substituted thiophenes | |
| | Poly(1,4-phenylenevinylene) (PPV) | |
| | p-Xylylenebis (tetrahydrothiopheniumchloride)) | |
| | Poly(1,4-phenylene sulfide) | |
| | Poly(fluroenyleneethynylene) | |

Binders

The material performance and resolution obtained after transfer both depend critically on the rheology of the tape material at the moment of transfer. The tape precursor material (i.e., that is coated on the carrier) is typically a paste. The ability to incorporate non-agglomerated particles with control over particle size and size distribution, purity, and crystal tape. In one preferred embodiment, the binder is a solid at room temperature, or at the storage temperature, providing the ribbon with its solid and stable "dry" tape like characteristics. During transfer of the material, the binder is heated and becomes flowable, playing a role that is similar to the role of a vehicle in a traditional thick film paste. The binder material may also serve to hold the other components of the layer on the carrier and can play a role in the transfer process, allowing the dry tape to behave as a fluid during transfer, or facilitating the transfer by other specific characteristics it may impart on the ribbon.

Because the binder is designed to remain present in the ribbon or dry tape during transfer of the tape to the substrate, the binder also plays a crucial role before, during, and after the tape transfer process. In one embodiment the binder comprises a lift-off layer at the interface between the carrier and the tape. This lift-off layer will provide adhesion prior to transfer, but will facilitate the delamination during the transfer process. For example, the lift-off layer may vaporize during transfer. In another embodiment, the binder may include an adhesive layer. This layer will facilitate the adhesion of the tape to the substrate after transfer. The binder layer may also include a chemically reactive layer. This layer may react with light radiation, or a chemical that can be applied locally or over a large area to induce or facilitate the transfer of the tape from the carrier to the substrate.

The binder can be a polymer or in some cases can be a precursor or other chemical compound. On a flexible carrier backing, the binder should impart some flexibility to the layer in addition to adherence. The binder can also be altered with a plasticizer to improve its flexibility and impart mechanical robustness to the tape. The binder must melt or soften in some cases to allow transfer. In one embodiment, the binder is a solid at room temperature and when heated to greater than 50° C. the binder melts and flows allowing for ease of transfer and good wetting of the substrate. Then upon cooling to room temperature the binder becomes solid again maintaining the shape of the deposited pattern. In other cases, the binder should react. The binder may need to vaporize upon transfer. The binder may dissolve or decompose during transfer. The binder is preferably stable at room temperature and does not degrade over time.

Preferred binders include waxes, styrene allyl alcohols, poly alkylene carbonates, polyvinyl acetals, cellulose based materials, tetradecanol, trimethylolpropane, and tetramethylbenzene. The preferred binders have good solubility in the solvent used to fabricate the tape and should be processable in the melt form. For example, styrene allyl alcohol is soluble in dimethylacetimide, solid at room temperature and becomes fluid-like upon heating to 80° C. Examples of preferred binders are listed in Table 6.

TABLE 6

Useful Binders for Tape Compositions

| Class | Examples |
|---|---|
| Styrenic | styrene allyl alcohol |
| | polystyrene (PS) |
| | poly alpha methyl styrene (PAMS) |
| | polystyrene-co-maleic anhydride (SMA) |
| Polycarbonates | Polycarbonate |
| | poly propylene carbonate |
| | poly ethylene carbonate |
| Carbohydrates | polysaccharides |
| | sucrose octahydrate |
| | sucrose diacetate |
| Cellulose | methyl cellulose |
| | ethyl cellulose |
| | nitro cellulose |
| Sulfides | phenylsulfone |
| Benzenes | benzophenone |

In some cases the binder may stay in the final electronic device. It is not always necessary to drive off some or all of the binder. In this embodiment, the binder can impart mechanical robustness to the final device. In many cases the binder should depart out of the transferred layer or decompose cleanly after tape transfer, leaving little or no residuals after processing the transferred material. The departure or decomposition can include vaporization, sublimation, unzipping, partial polymer chain breaking, combustion, or other chemical reactions induced by a reactant present on the substrate material, or deposited on top of the material after tape transfer.

In some instances, it is preferred that the binder can be partially or completely removed at a low temperature. According to one preferred embodiment, the binder can be removed at a temperature of not greater than about 200° C., such as not greater than about 150° C. and even not greater than about 125° C., such as not greater than about 100° C.

An example of a precursor as a binder is the use of Ag-trifluoroacetate with DMAc. The DMAc will form adducts with the Ag-trifluoroacetate which then acts as a binder as well as the silver precursor.

In some cases it may be necessary to lower the binder decomposition temperature to achieve high performance at lower processing temperatures. This may be achieved by a variety of routes and the exact method used will be dictated by the exact combination of materials substrate and binder. In recent work by Sterling (Industrial and Engineering Chemistry Research 2001, Vol. 40, No. 8, pp. 2922-1821), it was shown that the decomposition of poly alpha-methylstyrene (PAMS) was dramatically increased by heating in the presence of peroxides, a known source of free radicals. Since styrenic polymers degrade by free radical attacking the chain and causing it to unzip, this method can be employed to reduce the decomposition temperature of the polymer. In one example the addition of lauroyl peroxide to PAMS lowered the onset temperature of degradation by over 200° C., as determined from TGA weight loss. Another method for generation of free radicals is to use a photochemically induced source. For example benzophenone is known for its ability to produce free radicals in a high yield, and is absorbing to UV light in the range of 310 to 380 nm. In one example the addition of benzophenone to PAMS, and exposure to UV light lowered the onset temperature of degradation by over 100° C., as determined by TGA weight loss. Similar methods can be employed to assist in reducing the decomposition temperature of other binder systems.

Other Additives

Other additives can be incorporated into the ink or paste compositions used to fabricate the tape compositions of the present invention. For example, these additives can include surfactants or dispersants. Dispersants are added to improve particle dispersion in the vehicle or solvent and reduce interparticulate attraction within that dispersion. Dispersants are typically two-component structures, namely a polymeric chain and an anchoring group. The anchoring group will lock itself to the particle surface while the polymeric chain prevents agglomeration. It is the particular combination of these, which leads to their effectiveness. The molecular weight of the dispersant is sufficient to provide polymer chains of optimum length to overcome VanderWaals forces of attraction between particles. If the chains are too short, then they will not provide a sufficiently thick barrier to prevent flocculation, which in turn leads to an increase in viscosity. There is generally an optimum chain length over and above which the effectiveness of the stabilizing material ceases to increase. Ideally, the chains should be free to move in the dispersing medium. To achieve this, chains with anchor groups at one end only have shown to be the most effective in providing steric stabilization. An example of a dispersant is SOL- SPERSE 21000 (Avecia Limited). For the paste compositions of the present invention, surfactants should be selected to be compatible with the other components of the paste, particularly the precursors. In one embodiment of the present invention, surfactants can serve multiple functions such as a dispersant and a precursor to a conductive phase. Another example of a surfactant that is used with silver flake is a coupling agent such as Kenrich Titanate, for example as is disclosed in U.S. Pat. No. 4,122,062 by Monte et al., which is incorporated herein by reference in its entirety.

The ink and paste compositions used to fabricate the tape compositions of the present invention can also include rheology modifiers such as additives that have a thickening effect on the liquid vehicle. The advantageous effects of these additives include improved particle dispersion, reduced settling of particles, and reduction or elimination of filter pressing during syringe dispensing or screen-printing. Rheology modifiers can include SOLTHIX 250 (Avecia Limited), styrenes, cellulose materials such as ethyl cellulose, carboxy methylcellulose and nitrocellulose, polycarbonates, fumed silicas such as AEROSIL and CABOSIL, and the like.

Other additives can also be added specifically to be included in the tape in accordance with the present invention. Among these are reducing agents to prevent the undesirable oxidation of metal species. For example, copper and nickel metal have a strong tendency to oxidize. The tape compositions including nickel or copper precursors according to the present invention can include reducing agents as additives to provide reaction conditions for the formation of the metal at the desired temperature rather than the metal oxide. Reducing agents are materials that are oxidized, thereby causing the reduction of another substance. The reducing agent loses one or more electrons and is referred to as having been oxidized. Reducing agents are particularly applicable when using precursor compounds where the ligand is not reducing by itself. Examples of reducing agents include amino alcohols and formic acid. Alternatively, the precursor conversion process can take place under a reducing atmosphere, such as hydrogen or forming gas.

In some cases, the addition of reducing agents results in the formation of the metal even under ambient conditions. The reducing agent can be part of the precursor itself, for example in the case of certain ligands. An example is Cu-formate where the precursor forms copper metal even in ambient air at low temperatures. In addition, the Cu-formate precursor is highly soluble in water, results in a relatively high metallic yield and forms only gaseous byproducts, which are reducing in nature and protect the in-situ formed copper from oxidation. Cu-formate is therefore a preferred precursor for aqueous based tape compositions. Other examples of molecular precursors containing a ligand that is a reducing agent are Ni-acetylacetonate and Ni-formate.

The compositions can also include crystallization inhibitors and a preferred crystallization inhibitor is lactic acid. Such inhibitors reduce the formation of large crystallites, which can be detrimental to conductivity. Other crystallization inhibitors include ethylcellulose and polymers such as styrene allyl alcohol (SAA) and polyvinyl pirolydone (PVP). For example, in some silver tape compositions small additions of lactic acid completely prevent crystallization. In other cases, such as in aqueous based Cu-formate compositions, small amounts of glycerol can act as a crystallization inhibitor. Other compounds useful for reducing crystallization are other polyalcohols such as malto dextrin, sodium carboxymethylcellulose and TRITON X100. In general, solvents with a higher melting point and lower vapor pressure inhibit crystallization of any given compound more than a lower melting point solvent with a higher vapor pressure. In one embodiment, not greater than about 10 weight percent crystallization inhibitor as a percentage of total composition is added, preferably not greater than 5 weight percent and more preferably not greater than 2 weight percent.

The tape can also include an adhesion promoter adapted to improve the adhesion of the feature to the underlying substrate. For example, polyamic acid can improve the adhesion of the composition to a polymer substrate.

Precursor Reaction Temperature Reduction

According to certain embodiments of the present invention, the tape composition can be selected to reduce the conversion temperature required to convert the metal precursor compound to the conductive metal. The precursor converts at a low temperature by itself or in combination with other precursors and provides for a high metal yield. As used herein, the conversion temperature is the temperature at which the metal precursor species contained in the tape composition, including the molecular precursor, is at least 95 percent converted to the pure metal. The conversion temperature is measured using a thermogravimetric analysis (TGA) technique wherein a 50 milligram sample is heated at a rate of 10° C./minute in air and the weight loss is measured.

A preferred approach for reducing the conversion temperature is to bring the precursor into contact with a conversion reaction inducing agent. As used herein, a conversion reaction inducing agent is a chemical compound that effectively reduces the temperature at which the molecular metal precursor compound decomposes to the metal. The conversion reaction inducing agent can either be added into the original precursor formulation or added in a separate step during conversion on the substrate. The former method is preferred. Preferably, the conversion temperature of the metal precursors can be lowered by at least about 25° C., more preferably by at least about 50° C., even more preferably by at least about 100° C. as compared to the dry metal precursor compound.

The reaction inducing agent can be the solvent or vehicle that is used for making the tape composition. For example, the addition of certain alcohols can reduce the conversion temperature of the precursor composition.

Preferred alcohols for use as conversion reaction inducing agents according to certain embodiments include terpineol and diethyleneglycol butylether (DEGBE). It will be appreciated that the alcohol can also be the vehicle, such as in the case of terpineol.

More generally, organic alcohols such as primary and secondary alcohols that can be oxidized to aldehydes or ketones, respectively, can advantageously be used as the conversion reaction inducing agent. Examples are 1-butanol, diethyleneglycol, DEGBE, octanol, and the like. The choice of the alcohol is determined by its reducing capability as well as its boiling point, viscosity and precursor solubilizing capability. It has been discovered that some tertiary alcohols can also lower the conversion temperature of some precursors. For example, alpha-terpineol, which also serves as a vehicle, significantly lowers the conversion temperature of some precursors. The boiling point of the conversion reaction inducing agents is preferably high enough to provide for the preferred ratio of metal ions to inducing agent during conversion to metal. It should also be low enough for the inducing agent to escape the deposit cleanly without unwanted side reactions like decomposition that could lead to carbon residues in the final film. The preferred ratio of metal precursor to inducing agent is stoichiometric for complete reduction. However, in some cases catalytic amounts of the inducing agent are sufficient.

Some solvents, such as DMAc, can serve as both a vehicle and a conversion reaction inducing agent. It can also be regarded as a complexing agent for silver. This means that precursors such as Ag-nitrate that are otherwise not very soluble in organic solvents can be brought into solution by complexing the metal ion with a complexing agent such as DMAc. In this specific case, Ag-nitrate can form a 1:1 adduct with DMAc which is soluble in organic solvents such as N-methylpyrrolidinone (NMP) or DMAc.

Another preferred approach for reducing the conversion temperature of certain precursors is utilizing a palladium compound as a conversion reaction inducing agent. According to this embodiment, a palladium precursor compound is added to the formulation of another precursor such as a silver precursor. With addition of various Pd compounds, the conversion temperature of the silver precursor can be advantageously reduced by at least 25° C. and more preferably by at least 50° C. Preferred palladium precursors according to this embodiment of the present invention include Pd-acetate, Pd-trifluoroacetate, Pd-neodecanoate and tetraamine palladium hydroxide. Pd-acetate and Pd-trifluoroacetate are particularly preferred as conversion reaction inducing agents to reduce the conversion temperature of a silver metal carboxylate compound. Small additions of Pd-acetate to a tape composition that includes Ag-trifluoroacetate in DMAc can lower the decomposition temperature by up to 80° C. Preferred are additions of Pd-acetate in an amount of at least about 1 weight percent, more preferably at least about 2 weight percent. The upper range for this Pd conversion reaction inducing agent is limited by its solubility in the solvent and in one embodiment does not exceed about 10 weight percent. Most preferred is the use of Pd-trifluoroacetate because of its high solubility in organic solvents.

A complete range of Ag/Pd alloys can be formed with a Ag-trifluoroacetate/Pd-trifluoroacetate combination in a solvent such as DMAc. The molecular mixing of the precursors provides preferred conditions for the formation of virtually any Ag/Pd alloy at low temperature. The conversion temperature of the silver precursor when dissolved in DMAc is preferably reduced by at least 80° C. when combined with Pd-trifluoroacetate. Pure Pd-trifluoroacetate dissolved in DMAc can be converted to pure Pd at the same temperature. Similar conversion temperatures for the Ag and Pd precursors are advantageous since it provides optimal conditions for molecular mixing and the formation of Ag/Pd alloys with a homogeneous distribution of Ag and Pd.

Other conversion reaction inducing agents that can lower the conversion temperature for nickel and copper can be used such as amines (ammonia, ethylamine, propylamine), amides (DMAc, dimethylformamide, methylformamide, imidazole, pyridine), aminoalcohols (ethanol amine, diethanolamine and triethanolamine), aldehydes (formaldehyde, benzaldehyde, acetaldehyde); formic acid; thiols such as ethyl thioalcohol, phosphines such as trimethylphosphine or triethylphosphine and phosphides. Still other conversion reaction inducing agents can be selected from boranes and borohydrides such as borane-dimethylamine or borane-trimethylamine. Preferred conversion reaction inducing agents are alcohols and amides Advantageously, DMAc also serves as the solvent for the molecular precursor. Compared to tape compositions that contain other solvents such as water, the precursor conversion temperature is reduced by as much as 60° C. to 70° C. Also preferred is DEGBE, which can reduce the decomposition temperature of a silver precursor dissolved in a solvent such as water by as much as 125° C.

Another factor that has been found to influence the conversion temperature is the ratio of metal precursor to conversion reaction inducing agent. It has been found that the addition of various amounts of DEGBE to a molecular silver precursor such as Ag-trifluoroacetate in DMAc reduces the precursor conversion temperature by up to about 70° C. Most preferred is the addition of stoichiometric amounts of the inducing agent such as DEGBE. Excess amounts of conversion temperature inducing agent are not preferred because it does not lower the temperature any further. In addition, higher amounts of solvent or inducing agents lower the overall concentration of precursor in solution and can negate other solution characteristics such as the tape being in the preferred viscosity and surface tension range. The ratio of inducing agent to metal ion that is reduced to metal during conversion can be expressed as molar ratio of functional group (inducing part in the reducing agent) to metal ion. The ratio is preferably 1, such as in the range from 1.5 to 0.5 and more preferably in the range of about 1.25 to about 0.75 for univalent metal ions such as Ag. For divalent metal ions the ratio is preferably 2, such as in the range from about 3 to 1, and for trivalent metals the ratio is preferably 3, such as in the range from 4.5 to 1.5.

Yet, another preferred approach for reducing the conversion temperature is to catalyze the reactions using particles, particularly nanoparticles. Preferred particles that catalyze the reaction include pure Pd, Ag/Pd alloy particles and other alloys of Pd. Another approach for reducing the conversion temperature is to use gaseous reducing agents such as hydrogen or forming gas.

Yet another preferred approach for reducing the conversion temperature is ester elimination, either solvent assisted or without solvent assist. Solvent assist refers to a process wherein the metal alkoxide is converted to an oxide by eliminating an ester. In one embodiment, a metal carboxylate and metal alkoxide are mixed into the formulation. At the processing temperature, the two precursors react and eliminate an organic ester to form a metal oxide, which decomposes to the corresponding metal at lower temperature than the precursors themselves. This is also useful for Ag and Au where for Au the metal oxide formation is skipped.

Another preferred approach for reducing the conversion temperature is by photochemical reduction. For example, photochemical reduction of Ag can be achieved by using precursors containing silver bonds that can be broken photochemically. Another method is to induce photochemical reduction of silver on prepared surfaces where the surface catalyzes the photochemical reaction.

Another preferred approach for reducing conversion temperature is in-situ precursor generation by reaction of ligands with particles. In general, silver oxide is an ideal starting material and can be incorporated into low (or high) viscosity tapes in the form of nanoparticles. It can react with deprotonateable organic compounds to form the corresponding silver salts. For example, silver oxide can be mixed with a carboxylic acid to form silver carboxylate. Preferred carboxylic acids include acetic acid, neodecanoic acid and trifluoroacetic acid. Other carboxylic acids work as well. For example, DARVAN C (Vanderbilt Chemical) is sometimes included in the formulation as a rheology modifier and can react its carboxylic function with the metal oxide. Small silver particles that are coated with a thin silver oxide layer can also be reacted with these compounds. Another potential benefit is simultaneously gained with regard to rheology in that such a surface modification can lead to improved particle loadings in conductor compositions. Another example is the reaction of CuO coated silver powder with carboxylic acids. This procedure can be applied more generally on other oxides such as copper oxide, palladium oxide and nickel oxide particles as well. Other deprotonateable compounds are halogeno-, hydroxy- and other alkyl and aryl derivatives of carboxylic acids, beta diketones, more acidic alcohols such as phenol, and hydrogentetrafluoroborates.

The molecular precursor preferably provides as high a yield of metal as possible. A preferred ratio of molecular precursor to solvent is that corresponding to greater than 10% mass fraction of metal relative to the total weight of the tape (i.e., all precursor components excluding particles). As an example, at least 10 grams of conductor is preferably contained in 100 grams of precursor solution. More preferably, greater than 20 wt. % of the solution is metal, even more preferably greater than 30 wt. %, even more preferably greater than 40 wt. % and in some cases greater than 50 wt. %.

Another difficulty during dry tape fabrication is that during drying, any precursors present in the liquid can crystallize and form discontinuous inclusions that result in poor connectivity and poor conductivity upon transfer and conversion to tape material. This can be substantially prevented by adding small amounts of a crystallization inhibitor. For example, in some silver precursor formulations small additions of lactic acid completely prevent crystallization. In other cases, such as aqueous copper formate compositions, small amounts of glycerol can act as a crystallization inhibitor. Other compounds useful for reducing crystallization are other polyalcohols such as malto dextrin, sodium carboxymethylcellulose and TRITON X100. In general, solvents with a higher melting point and lower vapor pressure inhibit crystallization of any given compound more than a lower melting point solvent with a higher vapor pressure. In one embodiment, less than about 10 wt. % crystallization inhibitor as a percentage of total solution is added, preferably less than 5 wt. % and more preferably less than 2 wt. %.

Substrates

The tape compositions according to the present invention can be transferred and converted to the electronic feature at low temperatures, thereby enabling the use of a variety of substrates having a relatively low melting or decomposition temperature. During conversion of low viscosity precursor compositions to the electronic feature, the substrate surface that the composition is transferred onto significantly influences how the overall conversion to a final structure occurs.

According to one embodiment of the present invention, the substrate is a polymer substrate. Particular substrates that are useful according to the present invention include polyfluorinated compounds, polyimides, epoxies (including glass-filled epoxy), polycarbonates and many other polymers. Particularly useful substrates include cellulose-based materials such as wood or paper, acetate, polyester, polyethylene, polypropylene, polyvinyl chloride, acrylonitrile, butadiene (ABS), flexible fiber board, non-woven polymeric fabric, cloth, metallic foil, or glass. The substrate can be coated, for example, a dielectric coating on a metallic foil. Although the present invention can be used for such low-temperature substrates, it will be appreciated that traditional substrates such as ceramic substrates can also be used in accordance with the present invention.

In one embodiment, the substrate can be a low temperature co-fire ceramic (LTCC) green tape, for example a duPont No. 951 low temperature co-fire dielectric tape, available from E.I. duPont deNemours, Wilmington, Del. LTCC green tapes typically include glass and ceramic fillers and sinter at relatively low temperatures, enabling air fired resistors and non-refractory metals to be sintered with the tape. Examples of LTCC tapes are disclosed, for example, in U.S. Pat. No. 5,312,674 by Haertling et al. and U.S. Pat. No. 5,028,473 by Vitriol et al., each of which is incorporated herein by reference in its entirety.

The present invention also provides compositions and methods to increase adhesion of the electronic feature. Various substrates have different surface characteristics that result in varying degrees of adhesion. The surface can be modified by hydroxylating or functionalizing the surface to provide reaction sites from the tape compositions. In one embodiment, the surface of a polyfluorinated material is modified by a sodium naphthalenide solution that provides reactive sites for bonding during reaction with the precursor. In another embodiment, a thin layer of metal is sputtered onto the surface to provide for better adhesion of precursor or converted precursor to the substrate. In another embodiment, polyamic acid and the like precursors are added to the tape that then bond with both the conductor and surface to provide adhesion. Preferred amounts of polyamic acid and related compounds are from about 5 to 10 wt. % of the tape composition.

According to a particularly preferred embodiment of the present invention, the substrate onto which the tape composition is deposited and converted to a conductive feature has a softening point of not greater than about 350° C., more preferably not greater than 250° C. and more preferably not greater than about 200° C.

Preferred Tape Compositions

In one embodiment, a dry tape is formulated comprising not greater than 50 vol. % Ag precursors, not greater than 60 vol. % Ag powder, with the balance being a binder. The binder can be a proton conducting polymer. Particularly preferred Ag precursors are silver carboxylates. Specific silver carboxylates include Ag-trifluoroacetate, Ag-acetate, and Ag-neodecanoate.

In another embodiment, the dry tape comprises Cu precursors, Cu powder and binder. Particularly preferred copper precursors are Cu-trifluoroacetate or Cu-neodecanoate.

In another embodiment, the dry tape includes less than 60 vol. % dielectric powder, less than 50 vol. % low melting glass, with the balance being a binder. The dielectric powder can comprise a metal titanate, niobate, tantalate, tungstenate and other compositions with desired combinations of dielectric constant, dielectric loss and temperature coefficient of capacitance.

In another embodiment, the dry tape includes dielectric powder, precursor to dielectric and binder. A low melting glass powder may be included in this embodiment. The dielectric powder and precursor do not have to be the same material and can comprise different dielectric systems.

In another embodiment, the tape comprises a conducting powder, insulating phase and binder. The insulating phase can comprise a low melting glass. The conducting phase can include a metal ruthenate, ruthenium dioxide, or other conducting metal oxides, nitrides, borides, carbides. The insulating phase can include a precursor to an insulator. The precursor can include a metal alkoxide, metal carboxylate, metal acetylacetonate and the like.

In another embodiment, the tape includes Cu precursors, Ag powder, and a binder. Preferred Cu precursors include Cu-trifluoroacetate or Cu-neodecanoate.

In another embodiment, the tape includes Ag and Pd precursors, Cu powder and a binder. Preferred Ag and Pd precursors include metal carboxylates.

The compositions above can include coated particles, such as silver-coated copper powder.

In another embodiment, the tape includes metal-carbon particles and a binder. These compositions are useful for fuel cells and batteries. The tape can also include metal-carbon particles, precursor and a binder. The precursor can provide a metal, metal oxide, or other conducting or catalytically active material. Instead of the metal-carbon powder, metal oxide-carbon particles can also be used.

More generally, the tape can include an electrode material and binder. The tape can also include an electrode material, precursor, and a binder.

In another embodiment, the tape includes phosphor powder and a binder.

A dry tape does not require a backing, or the structural backing can be made from the same low decomposition polymer as the binder. This allows for shrink-wrapping the tape onto various surfaces.

A UV degradable film can be used between the backing and functional layer, wherein a circuit is exposed through masking and then heated and pressed to a surface to form a pattern on a substrate.

The glass particles can be of most any type, with low melting compositions preferred. The type of glass used will be matched to the dielectric powder and application.

In another embodiment, the tape includes Ag precursors, Cu powder, and binder. Preferred Ag precursors are silver carboxylates.

In another embodiment, the tape includes Ag precursors, other metal powder(s) and binder. Preferred Ag precursors are silver carboxylates.

In another embodiment, the tape includes two metal precursors, metal powder and a binder wherein the metal precursors alloy upon processing. One example of this is Ag precursor, plus Pd precursor, plus Ag powder, plus binder.

In another embodiment, the tape includes one or more precursors and a binder. No particulate phases are present.

In another embodiment, the tape includes a precursor to glass, conducting particles, insulating particles, and a binder. Preferred glass precursors are sol gel precursors.

The tape compositions of the present invention can include a molecular precursor formulation and a vehicle and/or a binder, without nanoparticles or micron-size particles. In a preferred embodiment, the tape composition includes a conversion reaction inducing agent, which can be either or both of a powder or molecular precursor or another inorganic or organic agent. In another embodiment, the combination of molecular precursor and solvent is chosen to provide a high solubility of the precursor in the solvent. The tape compositions of the present invention typically combine a precursor formulation and particles together with other additives. In one embodiment, the tape includes metal particles, a molecular precursor and a vehicle and/or a binder. The molecular precursor is preferably a metal organic compound.

In another embodiment, the tape includes conductive micron-size particles, nanoparticles and a vehicle and/or a binder. The nanoparticles can be an inorganic precursor to a conductive phase such as $Ag_2O$ nanoparticles.

In another embodiment, the tape includes micron-size particles, a molecular precursor, nanoparticles, a vehicle, and/or a binder. The precursor is preferably a metal organic compound.

In another embodiment, a tape is formulated including micron-size particles, a molecular precursor, nanoparticles, a vehicle, and a binder. The precursor is preferably a metal organic compound. The nanoparticles are a inorganic precursor to a conductive phase such as $Ag_2O$ nanoparticles. The tape can also include precursor, vehicle, and nanoparticles. The nanoparticles can be selected from silver, copper and other metals, or can be non-conductive nanoparticles such as silica, copper oxide and aluminum oxide.

The tape composition can also include a precursor, a vehicle, and a polymer or polymer precursor, such as in cases where adhesion to a polymeric substrate is desired. The precursor to a polymer can be poly (amic) acid. The polymer can be an epoxy, polyimide, phenolic resin, thermoset polyester, polyacrylate and the like. The tape compositions can include a low curing polymer, such as one that cures at less than 200° C., more preferably less than 150° C., or a UV curable polymer.

The tape compositions can also include carbon, a molecular precursor, a vehicle, and a binder. The compositions can include particulate carbon, such as conductive graphitic carbon. One preferred combination is conductive carbon with molecular precursors to silver metal.

The tape compositions can also include a conductive polymer, molecular precursor and a vehicle or binder. The polymer can be conductive for both electrons and protons. As is discussed in detail above, electrically conductive polymers can be selected from polyacetylene, polyaniline, polyphenylene, polypyrrole, polythiophene, polyethylenedioxythiophene and poly (paraphenylene vinylene). Protonic conductive polymers include those with sulfonates or phosphates, for example sulfonated polyaniline.

The tape composition can also include conductive nanoparticles and a vehicle and or a binder. The tape composition can include conductive nanoparticles, a vehicle or binder and polymer precursor.

In tapes that include a molecular precursor composition and powders (nanoparticles and/or micron-size particles), the ratio of precursors to powders is preferably close to that corresponding to the amount needed to fill the spaces between particulates with material derived from the precursors. However, a significant improvement in conductivity can also be obtained for lower levels of molecular precursor. It is preferred that at least about 5 vol. %, more preferably at least about 10 vol. %, even more preferably at least about 15 vol. %, and even more preferably at least 20 vol. % of the final conductor be derived from precursor.

Other specific tape compositions according to the present invention are preferred for different applications. Typically, the tape formulation will take into account the deposition mechanism, the desired performance of the features and the relative cost of the features. For example, simple circuitry on a polymer or other organic substrate designed for a disposable, high-volume application will require a low cost tape composition but will not require electronic features having superior properties. On the other hand, higher end applications such as for repair of electronic circuitry will require electronic features having very good electrical properties and relative cost of the tape composition will typically not be a significant factor.

A dry tape composition according to the present invention will often contain a solid phase made up of particulates, including particulates that are a precursor to a conductive phase such as silver oxide, silver nitrate particles, Ag-trifluoroacetate crystallites, conductive micron-size particles and nanoparticles of the conductive phase, and a binder. Alternatively, a tape can also include a more liquid phase made up of a vehicle and a precursor formulation. For dry tapes, the particulate fraction is typically less than 80 vol. % of the total dry tape volume. More typically less than 60 vol. % of the total tape volume. The precursor fraction of the tape composition, both present in the form of precursor particles and molecular precursor dissolved in the solvents and/or dissolved in the vehicle, is typically expressed as a weight percent of the total tape weight and is typically less than 80 wt. % of the total weight of tape material. In tape formulations that have a significant loading of conductive particles, the precursor fraction is typically less than 40 wt. %.

In one embodiment, the dry tape composition includes up to about 40 vol. % carbon and from about 10 to about 30 wt. % of a molecular precursor, with the balance being binder and other additives. In another embodiment, the tape composition includes up to about 30 vol. % carbon and up to about 20 vol. % metal nanoparticles, with the balance being binder and other additives.

According to another embodiment, the dry tape composition includes up to about 40 vol. % metal nanoparticles and from about 10 to about 30 wt. % of a molecular precursor, wherein the balance is binder and other additives.

According to another embodiment, the tape composition includes up to about 40 vol. % micron-size metal particles and from about 5 to about 25 wt. % of a molecular precursor with the balance being vehicle, binder and other additives.

According to yet another embodiment, the tape composition includes up to about 40 vol. % micron-size metal particles, with the balance being a vehicle containing a precursor to a conductive polymer.

In one embodiment a transparent conductor tape formulation includes between 10 and about 30 vol. % micron size particles selected from the group of ITO, ATO, ZnO, $SnO_2$, and between 5 and 20 vol. % Ag nanoparticles, and between 0 and 20 wt. % precursor to Ag with the balance being solvents, binder, and other additives.

In another embodiment a transparent conductor tape formulation includes between 20 and about 40 vol. % micron-size particles selected from the group of ITO, ATO, ZnO, $SnO_2$, and between 5 and 30 wt. % precursor to Ag, with the balance being solvents, binder, and other additives.

In yet another embodiment of a transparent conductor tape formulation, the tape contains between 20 and about 40 vol. % micron-size particles selected from the group of ITO, ATO, ZnO, $SnO_2$, and up to 15 vol. % conductive glass particles such as silver phosphate glass, and between 0 and 20 wt. % precursor to Ag with the balance being solvents, binder, and other additives.

For low cost applications, the tape composition can include materials such as particulate carbon, as is discussed above. A low cost conductor tape composition according to one embodiment includes between 20 and 60 vol. % micron-size particles selected from the group of amorphous carbon, carbon graphite, iron, nickel, tungsten, molybdenum, and between 0 and 15 vol. % nanoparticles selected from the group of Ag, carbon, intrinsically conductive polymer, Fe, Cu, Mo, W, and between 0 and 30 wt. % precursor to a metal such as Ag, with the balance being solvents, binder, and other additives.

In another embodiment, a LTCC tape includes a LTCC paste composition and 10 vol. % to 60 vol. % binder, more preferably 20 vol. % to 40 vol. % binder in the tape.

In another embodiment of a low cost conductor tape, the tape includes between 20 and 50 vol. % micron-size particles selected from the group of amorphous carbon, graphite, iron, nickel, tungsten, molybdenum, and between 20 and 50 wt. percent precursor to an intrinsically conductive polymer, with the balance being solvents, binder, and other additives.

Tape and Ribbon Structure

The tape can comprise a single layer that is homogeneous in composition. The tape can include two or more layers with different compositions. For example, one layer may be a release layer and the other a functional layer. Other examples include a functional layer combined with an adhesion layer, or a sealant layer. The layers can include two different materials, either powders, precursors or mixtures or these components. The layers can include gradient structures where the composition varies in some direction through the tape. The tape can include multiple layers, which will transfer as a whole and form a functional device. One or more of the layers of the tape may be patterned.

More than one functional layer may be combined in a single tape to produce a functional component. For example a tape can include a layer of metal precursor, or precursor and particles, or conductive polymer, followed by a layer of dielectric composition, and yet another conductor layer. This can enable the production of a parallel plate capacitor layered structure with a single tape transfer. In another example, the tape can include an anode layer, an electrolyte layer, and a cathode layer, forming a functional battery that may be transferred as a whole. The tape can be an electrode for a fuel cell or a supercapacitor.

The top layer of the tape may be an adhesion-promoting layer. For example, the top layer can be a polyamic acid layer, which will promote adhesion to polyimide substrates.

The tapes of the present invention can be fabricated by a variety of approaches. A tape can be a uniform coating of a single or multiple layer, or a detailed printed pattern of a single or multiple layers or a combination thereof. Printing can be used to fabricate both uniform coatings and patterns. The printing methods include relief (letterpress, flexographic, all others with transfer from a raised surface), Intaglio (gravure, all other with transfer from a sunken surface), screen printing (passing flowable material through openings in stencils or screens), lithography (exploiting differences in surface characteristics to repel or attract ink), or electrostatic printing (exploiting a charged area on a special drum). Large area coatings can be applied using coating methods such as spin, settling, blading, roller bar, spray, slot die, reverse roll coat, dip coat and curtain coating. Other printing methods include ink jet printing. A preferred method is the use of a paste that is deposited into a thin uniform layer. Following deposition of the tape material, the tape can be partially or completely dried by evaporating the higher vapor pressure components. This results in a tape material than is described as a dry tape.

For example, SAA can be dissolved in DMAc. A precursor such as Ag-trifluoroacetate is separately dissolved in DMAc and both DMAc solutions are combined. A surfactant is added and mixed. Add powder and mix, three-roll milling may be used to get a more uniform paste. Paste is then rollercated onto backing and air dried. Oven drying at about 70° C. can also be used if time is critical.

According to one embodiment, film thicknesses can range from about 10 μm to 50 μm or more. Different coating techniques can yield thinner tapes, such as down to about 2 μm. The carrier backing material can be selected from a broad range of materials, as is discussed below. In one preferred embodiment, a thin foil of polyester film (e.g., MYLAR available from E.I duPont deNemours, Wilmington, Del.) is used as the carrier material.

In one embodiment, the tape layer is formed with a bar wire-cator wherein a wire-wrapped bar is mechanically drawn across a substrate spreading a fluid or paste in a uniform layer. In another embodiment, the tape layer can be formed by screen printing a pattern or area onto a rigid or flexible backing. This enables the patterning of a tape. In another embodiment, the tape layer can be formed by a continuous process such as a roll coating device using a slot-die, gravure or reverse roll coating. These techniques can also allow some level of patterning of the tape. In another embodiment, the tape layer can be formed by a spray like process, such as ink-jet, aerosol jet or spraying a pattern or area. It will be appreciated that to access spray methods, a solution may need to be diluted to allow for the deposition.

In one embodiment, the tape material can be converted to a functional material on the backing or carrier prior to transferring it to the substrate. In one preferred embodiment, a fully converted functional device or circuit is first formed on a high temperature backing such as a high-melting-point metal backing and is then transferred to a low-temperature substrate such as a polymer substrate.

In one embodiment, SAA is added to a paste composition which ins then formed into a dry ribbon equivalent of a LTCC paste that can be used for patterning or repair of printed green tape. A particularly advantageous approach is to combine a spool of this ribbon into an inspection station to allow for repairs to be made as the repairs are detected.

The tape compositions of the present invention can be deposited or transferred to a substrate using a variety of methods and tools. As used herein, a tape transfer tool is a device that transfers the tape from a carrier to a substrate. In one embodiment, this transfer can occur as discrete dots cut out of the continuous ribbon like a "cookie punch". Alternatively, larger parts such as uniform patterns or intricate patterns of a ribbon can also be transferred. A complete pattern can be transferred in parallel (akin to stencil transfer) or discrete dots of material can be transferred sequentially to form a pattern (akin to ink jet printing). Combinations of parallel and sequential transfer are also possible, for example, entire discrete devices or components such as resistors or electrodes can be transferred one at a time to form a complete circuit one component at a time.

In one preferred embodiment of discrete and sequential transfer, a direct write technique is used called matrix assisted pulsed laser evaporation (MAPLE). This method is disclosed in U.S. Pat. No. 6,177,151 by Chrisey et al., the disclosure of which is incorporated herein by reference in its entirety. This technique uses a focused ultraviolet laser pulse to transfer material from a coating on a transparent carrier onto a substrate. The laser impacts the material to be transferred from the back at the carrier/material interface through the transparent carrier. The material is designed to absorb the laser energy causing local evaporation at the interface and propulsion of a discrete packet of material towards the substrate. By using a sequence of laser pulses while moving one of or both the carrier and the substrate relative to the laser beam, a desired pattern can be directly written. Feature sizes of 20 µm can be deposited. When laser trimming is utilized in conjunction with laser deposition, feature sizes below 10 µm can be obtained. Minimum feature size is ultimately limited by the diffraction limit of the laser wavelength employed and the quality of the optical components.

In another embodiment of the present invention, tape transfer occurs by applying a mechanical force to the back of the carrier supporting the tape. This force can be in the form of a shock wave, propelling the tape or parts thereof to the substrate. In another embodiment, when the tape is in immediate contact with the substrate, this force can be applied from either side and will result in increased pressure, resulting in adhesion of the ribbon to the surface, followed by transfer when the support carrier is moved away from the substrate. In yet another embodiment, local heating can be used to induce a transfer by softening the binder, a release layer, an adhesion layer, or the activation of a chemical or physical reaction such as evaporation, resulting in tape transfer and adhesion to the substrate material. This local heating can be accomplished by thermal conduction using contact by a heated transfer pattern or stencil. Heating and pressing can also be combined in a process typically referred to as hot pressing. Heating can also be accomplished by local radiation. The substrate can also be heated. A chemical route can also be used to induce a transfer. A chemical agent can be deposited onto the ribbon or on the substrate prior to transfer. This chemical can act as an adhesion layer between the ribbon and the substrate where transfer is desired. Alternatively, the chemical can interact with the binder or other components in the tape material to induce the transfer, for example by softening the binder material. In another embodiment, UV light can be used to degrade an adhesion layer on the ribbon allowing the tape to be released from the backing and transfer to the substrate. All transfer mechanisms can be employed to transfer discrete dots as well as larger areas, such as interconnects and electrodes, as is discussed above.

Mechanical pressure and heating can be applied in various ways. A stencil can be pressed down on a ribbon positioned over the substrate. A reel-to-reel approach is also possible. The reel can be patterned or locally heated to induce the tape transfer as the substrate and ribbon are in contact with the rollers.

The carrier material can be organic or inorganic. Preferred organic carriers include polyimide, polyester (e.g., MYLAR), PET, acetates, cellulose and paper. Preferred inorganic substrates include metal foils such as tantalum or aluminum, copper, silver, molybdenum, tungsten, etc. The carrier can be rigid or flexible and a preferred carrier is flexible. The carrier can be flat or conformal to the substrate, the preferred carrier is flat. The thickness of the carrier will be necessitated by the transfer method, with thinner carriers preferred. In cases where the tape itself is rigid and mechanically strong, no carrier may be needed at all to form a transferable tape product. In one embodiment, a flexible carrier allows for the tape to be spooled for storage or delivery. Spoolable tapes require that the layer of material will adhere to the tape but not the back side of the tape once spooled. In another embodiment, the carrier may also be cut into sheets instead of spooled. The carrier may also be removed to allow the tape to be wound upon itself. A protective layer may be applied on top of the tape or ribbon. This protective layer or coating can be peeled off prior to tape transfer to ensure the stability of the tape during storage. In one embodiment, the protective layer is used to prevent the evaporation of various volatile components present in the tape. In another embodiment the protective layer forms a barrier for an adhesive layer. After peeling off the protective layer, the tape will adhere or glue itself to the substrate and subsequently delaminate from the carrier. The protective layer may be composed of a material similar to the carrier material.

One method of tape formulation is a modification of a precursor-containing paste wherein the paste is thinned with a binder-containing solution or emulsion and mixed by shearing, such as in a three roll mill. In this embodiment, the binder solution is preferably selected to contain a relatively low vapor pressure organic solvent such as terpineol or butyl carbitol and may also include other organic plasticizers. It is important in this case that the LTCC carrier liquid is compatible with the binder solution. The resulting paste can be thinned to achieve a viscosity and flow properties that are amenable to casting films on a roll coater. Once the film is cast to a specified thickness, typically in the range from about 0.5 µm to 100 µm, the film is then dried. The dried film must exhibit good plasticity so that it may be deposited on a flexible backing and stored on a spool without cracking. The tape can then be transferred to a LTCC green tape substrate. In one preferred embodiment the tape composition is placed in direct contact with a LTCC dielectric tape and a laser is used to transfer the tape composition, avoiding excessive heating of the green tape.

Another preferred method of tape formulation is to fabricate LTCC type material from the various paste components. Typical components of this composition include powder which may consist of one or several types of metal and metal oxide or glass powders, dispersant, binder and carrier. The component powders may first be dispersed in a high vapor pressure solvent to coat the particles with polymer. The high vapor pressure solvent may then be dried and the powder may be combined with a solution or emulsion of binder in a low vapor pressure solvent such as terpineol, butyl carbitol, or other organic solvents. Once all the components are combined and mixed, the material must be sheared in a three-roll mill to achieve a good mixture with minimal agglomeration. This can be checked with a fineness of grind gauge. The resulting paste can be thinned to achieve a viscosity and flow properties which are amenable to the casting method. Once the film is cast to a specified thickness in the range of from about 0.5 µm to 100 µm, the film is then dried. The dried film must exhibit good plasticity so that it may be deposited on a flexible backing and stored on a spool without cracking.

A preferred method for making a resistor tape involves mixing a conductive metal oxide, primarily from the ruthenate family and usually of submicron size with a low melting glass powder in the size range of 1 to 10 µm. It is important that the conductive particles be well dispersed, so it may be necessary to incorporate a dispersant such as Menhaden fish oil. This can be accomplished by dispersing the particles in a relatively high vapor pressure solvent with the fish oil, then drying. This process is most beneficial for the small particles in the mixture, which are more prone to agglomeration. The powder components should include conductive and resistive phase, with some metal oxides to act as TCR modifiers. Once the submicron sized powders are coated, the components powders should be mixed into a carrier solution or emulsion that contains the binder and possibly plasticizers for the binder. The mixture must then be milled in a three-roll mill and may be diluted to achieve a specific viscosity. Ratios and types of powders used may vary depending on the type of resistor that is needed.

A preferred method for making a low fire dielectric tape involves combining powders with a high dielectric constant with powders of low melting glass to bind the fired material together. The high-k powder is preferably very crystalline with a larger size distribution than that of the glass and The high-k powder should also be present as a majority volume percentage of the component inorganic powders. These powders can be dispersed very similarly to the above resistor example and incorporated into a binder-containing liquid. The components should be mixed with a three-roll mill until agglomerates are broken down. The paste may then be adjusted to the appropriate viscosity for a given deposition method, deposited onto a flexible backing, and dried.

A preferred method for making conductor ribbons which fire at low temperature involves the incorporation of a molecular precursor to a conductive metal. The precursor may be combined in a solution or as an insoluble powder. The precursor is mixed with a solvent or carrier liquid and also with a metal powder and binder solution or emulsion. Once all the components are combined and mixed, the material must be sheared in a three-roll mill to achieve a good mixture with minimal agglomeration. This can be checked with a fineness of grind gauge. The resulting paste can be thinned to achieve a viscosity and flow properties that are amenable to casting films on a roll coater. Once the film is cast to a specified thickness, typically in the range from about 0.5 µm to 100 µm, the film is then dried. The dried film must exhibit good plasticity so that it may be deposited on a flexible backing and stored on a spool without cracking.

Another preferred method for making conductor ribbons which fire at low temperature is to employ a metal containing precursor solution as previously mentioned which can be dried to an uncrystallized film having properties which will allow it to be transferred from a rigid or flexible backing and then treated to convert the deposit to a metallic film. Solvents and additives which inhibit crystallization may be employed. Binders and plasticizers may also be necessary additives to yield a flexible tape.

Articles of Manufacture

The tapes and methods of the present invention provide the means to produce a variety of articles.

Printed circuits comprising conductor features of substantially pure metal on an organic substrate can be fabricated. According to one embodiment of the present invention, the circuit can have minimum feature sizes of not greater than 500 µm, more preferably not greater than 200 µm, more preferably not greater than 100 µm, more preferably not greater than 75 µm, more preferably not greater than 50 µm, even more preferably not greater that 25 µm and even more preferably not greater than about 10 µm.

According to another embodiment of the present invention, the circuit can include a conductive feature. The resistivity of the conductive feature is preferably is not greater than about 200× the bulk resistivity of the metal (e.g., silver), more preferably not greater than about 100× the bulk resistivity, even more preferably is not greater than 20× bulk resistivity, more preferably not greater than 10× bulk resistivity, even more preferably not greater than 6× bulk resistivity, such as not greater than 4× bulk resistivity and even not greater than 2× the bulk resistivity.

According to another embodiment of the present invention, the circuit can be formed by processing at temperatures of not greater than 500° C., more preferably not greater than 400° C., and even more preferably not greater than 300° C., even more preferably not greater than 200° C. In one embodiment, the processing temperature is not greater than 150° C., such as not greater than 125° C. and even not greater than 100° C.

According to another embodiment of the present invention, the circuit can be formed by processing for times less than 10 minutes, more preferably less than 5 minutes, and even more preferably less than 1 minute.

The circuit can be formed from a particle-free tape. The tape can include a precursor that when converted provides a functional material.

The circuit can be formed from a tape comprising nanoparticles. The nanoparticles can comprise conductors such as metal, insulators such as metal oxides and transparent conductors such as indium tin oxide.

The circuit can be formed on a substrate that is not flat. For example, a chip can be connected to an antenna by forming a path in three dimensions to connect the two components.

According to another embodiment of the present invention, the circuit can be provided on a substrate that has multiple material surfaces exposed. As an example, the conductor can pass from a metal surface, to silicon dioxide, to an epoxy, to a substrate material, to a contact metal.

The deposited material can be connected to a battery or fuel cell or be part of a battery or fuel cell. The current collector of a battery or fuel cell may be formed from a tape.

The circuit can contain only a conductor as in redistribution schemes. The circuit can contain conductor and resistor elements as in resistor networks. The circuit can contain conductor, resistor, and dielectric elements.

The circuit can be printed on a substrate that is transparent or reflective. As an example, the circuit can be formed on glass for displays.

The circuit can be processed using a laser. The deposited material can be sintered using a laser. The laser may be used to pattern the deposit.

The invention can be used to fabricate thin form batteries of most any desired shape. This includes the ability to form the battery in the form of a tape and then transferring it from the ribbon in one step.

The conductor can be processed by UV curing such as where a precursor sensitive to UV light is used.

The present invention can be used to fabricate various articles including sensors, electronic paper, interconnects as a replacement for wire bonding in smart cards and RF tags. Antennas including a conductor with a resistivity not greater than 5× the bulk resistivity of the bulk conductor material can be fabricated. The antenna can be a fractal or can be loaded with resistive, inductive, or capacitive elements. The articles can include disposable cell phones or a game in a magazine.

The invention can be used to form various types of electrodes. The electrode can include a conductor with a resistivity of the metal not more than 10× the bulk conductor resistivity. The electrode can be in a battery, sensor, display, supercapacitor, fuel cell, or solar cell.

A method for the repair of a feature by tape printing is also provided, including the steps of: tape printing a material onto a repair region and heating the material to a temperature sufficient to convert the material to substantially pure conductor. The repaired feature can be a ball grid array (BGA), un-fired or fired low-temperature co-fired materials (LTCC) pattern. The repair can be carried out prior to processing of the part. The repair can be made to a metallic conductor. The feature to be repaired can be formed by screen-printing or photopatterning of a particle-containing composition. Laser trimming can be used to further define the repair region. The repair region can be recessed in the substrate. The repair region can be a three-dimensional structure. The repaired feature can have a minimum feature size of not greater than 250 µm, more preferably not greater than 100 µm, and even more preferably not greater than 50 µm. The feature to be repaired can be formed by chemical vapor deposition, evaporation, or sputtering.

In one embodiment, a tape can provide a valuable method for the repair of a screen printed LTCC green tape. One of the major problems for the LTCC industry is misprints in a layer of the laminate stack. Inspection stations are a requirement to spot these errors prior to lamination and firing, and the usual approach is to reprint the entire sheet that has a problem. One reason for this is the lack of a method to repair the green tape. Described herein are methods for making a dry tape equivalent of a LTCC paste. This tape can be used in conjunction with an inspection station to transfer material to the damaged regions.

The tapes and methods can be used to print various materials, including conductors, on woven and non-woven fabric. The fabric can be electrically conducting or insulating. The fabric can include carbon, or intrinsically conductive polymer fibers. The fabric can also include PET, nylon, DACRON, TENCEL, KEVLAR, glass fibers, or natural fibers such as hemp, paper, or papyrus. The fabric can comprise fibers that are electronic components such as conductors, resistors, dielectrics, piezo-electrics, piezo-resistors, batteries, fuel cells, supercapacitors, solar cells, sensors, and actuators.

Conductor features can be derived from a tape comprising a polymer. The polymer can be proton conducting. The polymer can be a hydrophobic and proton-conducting polymer, specifically a sulfonated perfluorohydrocarbon polymer such as NAFION (E.I. duPont de Nemours, Wilmington, Del.).

The tape printed conductor feature can comprise substantially pure metal and/or carbon. The conductor can be printed on a porous substrate, proton conducting substrate, or porous electrically conducting substrate.

Process Flows

Various process flows can be used to form products using the present invention.

A laser can be used to locally heat regions of the tape while the tape is in contact with a target substrate thereby transferring the layer to the target surface. After transfer, the target surface can be heated to convert precursor, if present, to remove binder, or to sinter particles.

A tape and support can be wrapped over or around a non-flat surface and then heated to conform the tape to the surface. Further heating or other means can be used to transfer the layer to the target surface.

The tape and support can be pressed onto a target substrate, patterned, and the undesired regions removed. The transferred pattern can be laser processed once transferred.

A pattern can be printed onto a backing, pre-processed thermally, and then transferred to a target substrate.

A tape can be pressed onto a target substrate, where the target substrate has patterned adhesive. The material sticks to the patterned adhesive and the remainder of the material is removed.

The tape can be pressed onto a target substrate, an ink jet printer can be used to pattern and dissolve desired portions of the tape, and the rest of the material removed. Other dispense and printing methods can be used to add the solvent including pen, screen, roll printers. The added liquid can also serve to react with the tape and bond it to the substrate.

A tape can be fabricated, the tape layer can be patterned to modify the tape layer in desired locations, and transfer can be accomplished by pressing or other means described herein.

More generally, the tape can be processed at least partially before transfer such that the transferred material is partly or fully functional before transfer. In cases where high temperature processing is desired prior to transfer the carrier can be a high temperature substrate such as metal foil, for example molybdenum foil.

The methods described here accomplish the transfer of a dry packet or parcel or unit of material from one surface to another. The transfer can also occur with conversion to a soft material during transfer with subsequent conversion to solid after deposition on the substrate.

The material can be transferred from the tape by thermal pressing. In one embodiment, the tape has a pattern corresponding to a circuit and is transferred by thermal pressing (heating while pressing).

The present invention solves a number of important problems. It allows deposition onto thermally sensitive substrates. Materials can be processed on a more thermally robust backing or carrier layer and then transferred to the less thermally robust target substrate.

The present invention allows deposition onto mechanically sensitive substrates. Materials can be processed on a more mechanically robust backing or carrier layer and then transferred to the less robust target substrate.

The present invention allows patterning and layering to be coupled. A layered tape can be formed, patterned and then transferred, thereby transferring a patterned, layered structure to a surface.

The present invention allows for layered devices to be formed on a tape exploiting mass production methods for patterning of layers and subsequently transferring small regions intact.

The present invention allows printing and coating on non-flat surface through shrink wrap like support layers. The support and tape are wrapped around the non-flat substrate and the tape is subsequently transferred, and processed.

In most conventional technologies, devices must be formed on the target substrate. In the present invention, devices can be at least partially preformed on the carrier and then transferred to the target substrate.

The carrier layer and the devices formed on the carrier layer can also be used as a permanent assembly. In this embodiment, the carrier and tape can be laminated on top of the substrate material, to form a permanent laminated circuit assembly.

The present invention allows processing polymer thick film materials, pastes for LTCC and related applications.

The present invention provides high speeds of printing by providing pre-patterned features on the carrier that can be transferred to the target substrate.

The work life of the tapes is advantageously long compared to thick film pastes and inks.

The present invention provides several novel process flows that enable the deposition and formation of conductive features at relatively low temperatures.

An optional first step, prior to tape transfer, is surface modification of the substrate. The surface modification can be applied to the entire substrate or can be applied in the form of a pattern, such as by using photolithography. The surface modification can include increasing or decreasing the hydrophilicity of the substrate surface by chemical treatment. For example, a silanating agent can be used on the surface of a glass substrate to increase the adhesion and/or to control spreading of the tape composition through modification of the surface tension and/or wetting angle. The surface modification can also include the use of a laser to clean the substrate. The surface can also be subjected to mechanical modification by contacting with another type of surface. The substrate can also be modified by corona treatment.

For the deposition of organic-based tape compositions, the activation energy of the substrate surface can be modified. For example, a line of polyimide can be printed prior to tape transfer, such as a silver metal tape transfer, to prevent infiltration of the tape material into a porous substrate, such as paper. In another example, a primer material may be printed onto a substrate to locally etch or chemically modify the substrate, thereby inhibiting the spreading, of the tape material being transferred in the following deposition step.

The next step is the transfer of the tape composition from the carrier to the substrate. As is discussed above, the deposition can be carried out by laser transfer, pressing, heat pressing and a variety of other transfer techniques. In one embodiment, a first tape transfer step provides the tape composition including a molecular precursor while a second transfer step provides a reducing agent or other co-reactant that converts the precursor. Another method for depositing the material is using multi-pass tape transfers to build the thickness of the deposit.

In one embodiment, a laser can be used to simultaneously (1) transfer material from a ribbon to a surface, (2) react the precursor material, if the formulation comprises a precursor, in the tape, (3) densify the particles, if the tape comprises particles, and densify the reacted precursor or densify the combination of particles and reacted material and (4) provide adhesion to the substrate. A ribbon material is placed in contact with a substrate with the tape side in contact with the substrate and the backing material exposed. Optionally, the ribbon and substrate are pressed together with sufficient force to eliminate the presence of a gas such as air between the layers and provide direct contact of substantially all of the tape with the substrate. A laser is directed onto the backing of the ribbon and passes through the backing to strike the tape. Both continuous wave and pulsed lasers can be used. Visible and ultraviolet wavelengths can be exploited. The laser beam is translated relative to the substrate to directly write a pattern. In a particularly preferred embodiment, the laser beam is manipulated to provide a beam at the interface of the tape and the backing that has a width of less than 200 µm, more preferably less than 100 µm, even more preferably less than 75 µm, even more preferably less than 50 µm and even more preferably less than 25 µm. This provides transferred conductor patterns with minimum feature sizes of less than 200 µm, more preferably less than 100 µm, even more preferably less than 75 µm, even more preferably less than 50 µm and even more preferably less than 25 µm. In one embodiment, the process is carried out without damage to the substrate. The material that is transferred is laser densified to provide a higher density than can be obtained by conventional thermal processing. In one embodiment, the product material is substantially dense. In another embodiment, the product material is greater than 50% dense by volume. In another embodiment, the material is greater than 75% dense. Particularly preferred materials to form as products include silver and copper. Preferred tape compositions comprise either precursor without any particles, particles without precursors, nanoparticles without precursors, precursor and particles, precursors and nanoparticles. In one embodiment, the binder is substantially removed by laser heating. In another embodiment, the binder remains in the final product material.

A third optional step is the modification of the properties of the deposited tape material. This can include freezing, melting and otherwise modifying the tape material properties, with or without chemical reactions or removal of material from the transferred tape material. For example, a tape composition including a thermoset polymer can be deposited and immediately exposed to a light source such as an ultraviolet lamp to polymerize and thicken the tape material. Depending on the nature of the thermoset polymer, other modification means can be used such as heat lamps or lasers.

A fourth optional step is drying or subliming the transferred tape composition by heating or irradiating. In this step, material is removed from the transferred composition or chemical reactions occur in the material. An example of a method for processing the deposited material is using a UV, IR, laser or a conventional light source. In one embodiment, the transferred tape is dried before processing in the subsequent step. In another embodiment, a precursor is contacted with a conversion reaction inducing agent before the tape material is dried. In another embodiment, the transferred tape material is contacted with a gaseous reducing agent such as hydrogen.

It is also preferred that the binder contained in the tape material be removed before precursor decomposition reactions and other reactions, in order to reduce porosity in the electronic feature. In a preferred embodiment, the binder is removed at a temperature of not greater than 300° C., such as not greater than 200° C., more preferably not greater than 150° C. and even more preferably not greater than 125° C.

A fifth step is increasing the temperature of the transferred material. An example of one method is to process the transferred tape material with specific temperature/time profiles. Heating rates can preferably be greater than about 10° C./min, more preferably greater than 100° C./min and even more preferably greater than 1000° C./min. The temperature of the transferred material can be raised using hot gas or by contact with a heated substrate. This temperature increase may result in further evaporation of solvents and other species. A laser, such as an IR laser, can also be used for heating. IR lamps or a belt furnace can also be utilized. It may also be desirable to control the cooling rate of the deposited feature. The heating step can also coincide with the activation of a reducing agent present in the transferred tape material. The action of such reducing agent could include removal of the surface oxide particles such as copper particles or nickel particles.

A sixth step is reacting the molecular precursors, if such precursors are present in the transferred tape material composition. In one embodiment, the transferred tape material is reacted using various gases to assist in the conversion of the transferred tape material to the targeted electronic material or feature. For example, hydrogen, nitrogen, and reducing gases can be used to assist the reaction. Copper, nickel, and other metals that oxidize when exposed to oxygen require the presence of reducing atmospheres. It has been found that the transferred tape material compositions of the present invention can advantageously provide very short reaction times when processed with light (e.g., a laser) that heats the materials. This is a result of the high chemical reaction rates when sufficiently high temperatures are provided for a specific precursor and the ability of light to rapidly heat the materials over time scales of milliseconds or even less. In the case of transferred tape material compositions including particles, phases having a low melting or softening point allow short processing times.

The transferred tape material compositions of the present invention comprising particles, particles and molecular precursors and precursors without particles can all be processed for very short times and still provide useful materials. Short heating times can advantageously prevent damage to the underlying substrate. Preferred thermal processing times for deposits having a thickness on the order of about 10 μm are not greater than about 100 milliseconds, more preferably not greater than about 10 milliseconds, and even more preferably not greater than about 1 millisecond. The short heating times can be provided using laser (pulsed or continuous, wave), lamps, or other radiation. Particularly preferred are scanning lasers with controlled dwell times. When processing with belt and box furnaces or lamps, the hold time is preferably less than 60 seconds, more preferably less than 30 seconds, and even more preferably less than 10 seconds. The heating time can even be less than 1 second when processed with these heat sources, and even less than 0.1 second, while providing conductive materials that are useful in a variety of applications. It will be appreciated that short heating times may not be beneficial if the solvent or other constituents boil rapidly and form porosity or other defects in the feature.

According to one embodiment, the deposited transferred tape materials can be substantially fully converted at temperatures of not greater than 400° C., more preferably not greater than 300° C., more preferably not greater than 250° C., and even more preferably less than 200° C.

An optional seventh step is densifying of the particles or the material derived from the tape. The densification can be carried out using furnaces, light sources such as heat lamps and/or lasers. In one embodiment, the use of a laser advantageously provides very short densifying times and in one embodiment the time is not greater than 1 second, more preferably not greater than 0.1 seconds and even more preferably not greater than 0.01 seconds. Laser types include pulsed and continuous wave. In one embodiment, the laser pulse length is tailored to provide a depth of heating that is equal to the thickness of the material to be densified. The components in the transferred tape material can be fully or partially reacted before contact with laser light. The components can be reacted by exposure to the laser light and then densified. In addition, other components in the transferred tape material composition (e.g., glasses) can melt and flow under these conditions.

Selective laser sintering can also be used to selectively melt a low melting phase in the tape composition. Selective laser sintering was developed as a method for solid freeform fabrication of three-dimensional parts. One process involves spreading a layer of powder evenly over an area. A laser is then used to selectively melt the powder in a pattern that is representative of one layer of the desired part. The melted region becomes a solid layer while the untreated powder provides support for subsequent layers. A second layer of powder is then spread over the entire area and the laser used to melt the second layer. The process continues, building the part layer by layer until the final shape is complete. While the process really involves selective laser melting, it has been dubbed selective laser sintering as ceramic parts can be built by this method. Although the selective laser sintering process is traditionally used with only one material, the various combinations of ceramic powder and a low melting glass as described in the present invention allow for new applications for laser melting. The tape composition has transferred a mixture of ceramic oxide powder and glass, a laser may be employed to densify the structure by melting the glass phase. The proper balance of oxide powder to glass must be achieved along with the proper size distribution of both particulate phases. For high-k dielectric applications the glass content would ideally be minimized so that the high-k performance of the dielectric powder is maximized. For high-ohm resistors the glass phase may be the majority of the composition so that the conduction between the conductive oxide particles is limited by the insulating glass phase. As the glass phase is melted it wets the oxide powder and assists in densification. The laser energy can be coupled into the glass directly and other times it is desired to couple the laser energy with the oxide powder and achieve melting of the glass indirectly.

In an optional eighth step, the feature can be post-treated. For example, the crystallinity of the phases can be increased by laser processing. The post-treatment can also include cleaning and/or encapsulation of the electronic features, or other modification such as silanation of a dielectric material.

Surface modification can also be performed to remove hydroxyl groups. Surface modification of the porosity in dielectric layers can lead to dramatically reduced dielectric loss and decreased sensitivity to humidity. In one embodiment, a porous dielectric layer is formed according to the previous steps 1, through 8. The dielectric is then exposed to a liquid surface modification agent such as a silanating agent. The silanating agent can include hexamethyldisilazane. For example, a surface modifying agent can be poured onto the fired dielectric layer and allowed to sit for about 15 minutes. The dielectric layer is then dried in an oven at 120° C. for 10 minutes, completing the surface modification.

The exposure time for the surface modifying agent is preferably not greater than 20 minutes, more preferably not greater than 10 minutes, with the temperature preferably about room temperature. The drying profile to remove excess surface modifying agent is preferably about 120° C. for 15 minutes.

Useful organosilanes include: $R_nSiX_{(4-n)}$ where X is a hydrolysable leaving group, such as X=amine (e.g., hexamethyldisilazane), halide (e.g., dichlorodimethylsilane), alkoxide (e.g., trimethoxysilane, Methacryloxypropyltrimethoxysilane, N-methyl-3-aminopropyltrimethoxysilane), and acyloxy (e.g., acryloxytrimethylsilane).

Hydrolysis and condensation occur between organosilane and surface hydroxy groups on the dielectric layer surface. Hydrolysis occurs first with the formation of the corresponding silanol followed by condensation with hydroxo groups on the metal oxide surface. As an example:

$$R-(CH_2)_3Si(OMe)_3+H_2O \rightarrow R-(CH_2)_3Si(OH)_2(OMe)_2+2\,MeOH$$
$$R-(CH_2)_3Si(OH)_2(OMe)_2+(Layer_{surf}Si)OH \rightarrow (Layer_{surf}Si)-O-Si(OH)_2(CH_2)_3-R+H_2O,$$

where 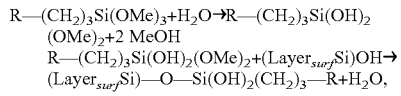

It will be appreciated from the foregoing discussion that two or more of the latter process steps (drying, heating, reacting and sintering) can be combined into a single process step.

The compositions and methods of the present invention produce features that have good adhesion to the substrates on which they are formed. For example, the conductive features will adhere to the substrate with a peel strength of at least 10 newtons/cm. Adhesion can be measured using the scotch-tape test, wherein scotch-tape is applied to the feature and is pulled perpendicular to the plane of the trace and the substrate. This applies a force of about 10 N/cm. A passing measure is when little or no residue from the feature remains on the tape.

The foregoing process steps can be combined in several preferred combinations. For example, one preferred process flow includes the steps of forming a structure by screen printing, photopatterning, thin film or wet subtractive methods; identifying locations requiring the addition of material using optical detection and alignment, adding material by direct-write deposition using transfer of tape material; and processing to form the final product. In a specific embodiment, a circuit is prepared by screen-printing and then completed or repaired by laser transfer of tape material.

In another embodiment, features larger than approximately 100 μm are first deposited by screen-printing. Features having a size of less than 100 μm are then deposited by a direct deposition method using transfer of tape material, such as laser transfer of tape material.

In yet another embodiment, a transferred tape material composition is deposited, dried, reacted at less than about 300° C., more preferably at less than about 250° C., and is then laser sintered.

In yet another embodiment, a transferred tape material composition is deposited, dried, and reacted with a total reaction time of less than about 100 seconds, more preferably less than about 10 seconds and even more preferably less than about 1 second.

In yet another embodiment, a transferred tape material composition is deposited, dried, and reacted, wherein the total time for the deposition, drying and reaction is preferably less than about 60 seconds, more preferably less than about 10 seconds and even more preferably less than about 1 second.

In yet another embodiment, a polyimide surface is first modified to promote adhesion of the tape material. The tape is transferred, and then dried and converted at a temperature of less than 300° C., more preferably at less than about 250° C. and even more preferably not greater than about 200° C. In one embodiment, the tape is converted at not greater than about 150° C., such as not greater than about 125° C.

In yet another embodiment, a tape material is transferred, dried and reacted at less than 300° C., and is then laser sintered.

In yet another embodiment, a transferred tape material composition is deposited, dried, and reacted at less than 300° C., more preferably at less than about 250° C., such as not greater than about 200° C. to provide a conductive feature having a resistivity that is not greater than 10 times the bulk resistivity of the metal, preferably not greater than 6 times the bulk resistivity, more preferably not greater than 4 times the bulk resistivity and most preferably not greater than 2 times the bulk resistivity of the metal. In one embodiment, the conductive feature includes silver and the resistivity of the feature is not more than 10,000 times the bulk resistivity of silver (1.59 μΩ-cm), more preferably not more than 1000 times and even more preferably not more than 100 times the bulk resistivity of silver.

The product compositions derived from the tapes of the present invention can include a variety of material combinations. In one embodiment, a conductive feature comprises silver and/or copper. In a preferred embodiment, the feature includes discrete regions of copper metal that are derived from particles, preferably particles having an average size of not greater than 1 μm. According to this embodiment, the copper metal is dispersed in a matrix of silver that is derived from a molecular precursor. The silver and copper are not substantially interdiffused as when derived from high fire compositions. In one embodiment, the feature includes about 85 vol. % copper and 15 vol. % silver. In another embodiment, the silver derived from the precursor also includes an amount of copper, palladium, platinum or some other metal that provides resistance to electromigration or powder solderability.

In another embodiment, the conductive feature includes silver and palladium. In a preferred embodiment, the feature includes regions of substantially pure dispersed silver in a matrix of silver-palladium that provides resistance to solder leaching. In a particularly preferred embodiment, the silver-palladium is derived from precursors and the overall feature includes less than about 2 vol. % palladium, with less than 1 vol. % palladium even more preferred. In another embodiment, the palladium is replaced with another metal derived from a precursor to provide a silver matrix that includes an amount of copper, platinum or some other metal that provides resistance to electromigration or solder leaching.

In yet another embodiment, the feature comprises silver or copper derived from a precursor and an insulating phase. The insulating phase is preferably a glass or metal oxide. Preferred glasses are aluminum borosilicates, lead borosilicates and the like. Preferred metal oxides are silica, titania, alumina, and other simple and complex metal oxides. The insulating phase can be derived from particles or precursors. This embodiment is particularly useful for the production of low ohm resistors.

In an embodiment preferred for transparent and conducting materials, zinc oxide, antimony tin oxide (ATO), indium tin oxide (ITO) and mixtures of these are contained in a feature. In a preferred embodiment, the feature comprises a small amount of metal to improve the conductivity while only slightly degrading conductivity by choosing processing conditions to provide metal regions less than about 100 nanometers in size.

The conductor composition can also be a composite of dissimilar materials. The composite can include metal-metal oxide, metal-polymer, metal-glass, carbon-metal, and other combinations. The conductor composition can also include solder-like compositions. The composition can include silver, lead, tin, indium, copper, and other elements.

The conductors formed by the present invention have combinations of various features that have not been attained using other tapes compositions.

The present invention is particularly useful for fabrication of conductors with resistivities that are not greater than 20 times the resistivity of the substantially pure bulk conductor, more preferably not greater than 10 times the substantially pure bulk conductor, even more preferably not greater than 5 times and most preferably not greater than 3 times that of the substantially pure bulk conductor. High conductivity can be provided through tapes comprising silver, copper, platinum, palladium, gold, nickel or copper.

The layers of the present invention can advantageously combine the attributes of being white in color for aesthetic purposes while having a sheet resistivity lower than 100,000 ohms/square, more preferably lower than 10,000 ohms/square and even more preferably less than 1000 ohms/square. Preferred compositions according to this embodiment include zinc oxide.

The silver-palladium compositions of the present invention can also provide resistance to solder leaching. In one embodiment, the compositions provide resistance to 3 dips in standard 60/40 lead-tin solder at its melting point.

The conductors formed by the present invention have combinations of various features that have not been attained using other compositions such as thick film paste deposited by screen-printing. After firing the formulations of the present invention will yield solids that may or may not be porous with specific bulk resistivity values. As a background, bulk resistivity values of a number of fully dense solids are provided in Table 7.

TABLE 7

Bulk Resistivity Values for Various Materials

| Material | Bulk Resistivity (micro-Ω cm) |
|---|---|
| silver (Ag - thick film material fired at 850° C.) | 1.59 |
| Copper (Cu) | 1.68 |
| gold (Au) | 2.24 |
| aluminum (Al) | 2.65 |
| Ferro CN33-246 (Ag + low melting glass, fired at 450° C.) | 2.7–3.2 |
| SMP Ag flake + precursor formulation, 250° C. | 4.5 |
| molybdenum (Mo) | 5.2 |
| tungsten (W) | 5.65 |
| zinc (Zn) | 5.92 |
| nickel (Ni) | 6.84 |
| iron (Fe) | 9.71 |
| palladium (Pd) | 10.54 |
| platinum (Pt) | 10.6 |

TABLE 7-continued

Bulk Resistivity Values for Various Materials

| Material | Bulk Resistivity (micro-Ω cm) |
|---|---|
| tin (Sn) | 11 |
| Solder (Pb—Sn; 50:50) | 15 |
| Lead (Pb) | 20.64 |
| Titanium nitrate (TiN transparent conductor) | 20 |
| polymer thick film (state of the art Ag filled polymer, 150° C.) | 18–50 |
| polymer thick film (Cu filled polymer) | 75–300 |
| ITO indium tin oxide ($In_2O_3$:Sn) | 100 |
| zinc oxide (ZnO doped-undoped) | 120–450 |
| Carbon (C-graphite) | 1375 |
| doped silver phosphate glass, 330° C. soft point | 3000 |
| ruthenium oxide $RuO_2$ type conductive oxides | 5000–10,000 |
| intrinsically conductive polymer | 1,000,000 |

The present invention is particularly useful for fabrication of conductors with resistivities that are not greater than 20 times the resistivity of the substantially pure bulk conductor, more preferably not greater than 10 times the substantially pure bulk conductor, even more preferably not greater than 5 times and most preferably not greater than 3 times that of the substantially pure bulk conductor. High conductivity can be provided through ribbon compositions including silver, copper, platinum, palladium, gold, nickel or copper.

A ribbon composition including up to about 50 vol. % micron-size metal particles and from about 5 to about 25 wt. % of a molecular precursor with the balance being vehicle, binder and other additives, will yield a bulk conductivity in the range from 1 to 5 times the bulk metal conductivity after firing at between 200° C. and 300° C.

A tape composition including up to about 50 vol. % micron-size metal particles, with the balance being a vehicle or binder containing a precursor to a conductive polymer, will yield bulk conductivity in the range from 5 to 50 times the bulk conductivity of the metal phase after firing at between 100° C. and 200° C.

The layers of the present invention can advantageously combine the attributes of being white in color for aesthetic purposes or semi-transparent while having a sheet resistivity lower than 100,000 ohms/square, more preferably lower than 10,000 ohms/square and even more preferably less than 1000 ohms/square. Preferred compositions according to this embodiment include zinc oxide.

A transparent conductor tape formulation containing about 40 vol. % micron-size particles selected from the group of ITO, ATO, ZnO, $SnO_2$, and about 15 vol. % Ag nanoparticles, and between 0 and 30 wt. % precursor to Ag with the balance being solvents, vehicle, binder and other additives, will after transfer of the tape material to the substrate and subsequent firing yield between 250° C. and 400° C. bulk conductivity in the range from 200 to 1000 micro-ohm-centimeter.

According to one embodiment, a transparent conductor tape formulation is provided including up to about 50 vol. % micron-size particles selected from the group of ITO, ATO, ZnO, $SnO_2$, and between 5 and 25 weight percent precursor to Ag, with the balance being solvents, vehicle, binder and other additives. After the transferred tape material at between 150° C. and 300° C., this formulation yields conductivity in the range from 200 to 5000 micro-ohm-centimeter.

According to another embodiment, a transparent conductor formulation is provided including up to about 45 vol. % micron-size particles selected from the group of ITO, ATO, ZnO, $SnO_2$, and up to 20 vol. % conductive glass particles such as silver phosphate glass, and between 0 and 30 wt. % precursor to Ag with the balance being solvents, vehicle and other additives. After firing at between 300° C. and 500° C., this formulation will yield bulk conductivity in the range from 200 to 1000 micro-ohm-centimeter.

According to another embodiment, a low cost conductor tape is provided that includes between 20 and 40 vol. % micron-size particles selected from the group of amorphous carbon, carbon graphite, iron, nickel, tungsten, molybdenum, and between 0 and 15 vol. % nanoparticles selected from the group of Ag, carbon, intrinsically conductive polymer, Fe, Cu, Mo, W, and between 0 and 25 wt. % precursor to a metal such as Ag, with the balance being solvents, vehicle, binder and other additives. Firing at between 250° C. and 400° C. after transfer can yield a bulk conductivity in the range from 40 to 4000 micro-ohm-centimeter.

According to another embodiment, a low cost conductor tape including between 20 and 40 vol. % micron-size particles selected from the group of amorphous carbon, graphite, Iron, nickel, tungsten, molybdenum, and between 10 and 50 wt. % precursor to an intrinsically conductive polymer, with the balance being solvents, vehicle and other additives is provided. After tape transfer and firing at between 100° C. and 200° C., the composition will yield a bulk conductivity in the range from 1,000 to 10,000 micro-ohm-centimeter.

The silver-palladium tape compositions of the present invention can also provide a conductive feature having resistance to solder leaching. In one embodiment, the compositions provide resistance to 3 dips in standard 60/40 lead-tin solder at its melting point.

The dielectric tape compositions of the present invention can provide dielectric features having novel combinations of high performance in terms of dielectric constant, while being formed at a low processing temperature.

In one embodiment for a high-k dielectric, a dielectric constant of 700 and a loss of 6% is achieved for a material processed at 600° C. for 12 minutes. In another embodiment for a high-k dielectric, a dielectric constant of 200 and a loss of 2% is achieved for a material processed at 550° C. for 15 minutes. In another embodiment for a high-k dielectric, a dielectric constant of 100 and a loss of 12% is achieved for a material processed at 350° C. for 30 minutes.

In one embodiment for a low loss dielectric, a dielectric constant of 300 is achieved with a low loss of 0.9% for a material processed at 400° C. for 30 minutes.

In another embodiment illustrating the importance of surface modification to reduce loss, a dielectric constant of 17 is obtained with a loss of 0.2% for a material processed at 450° C. for 30 minutes. In another embodiment illustrating the importance of surface modification to reduce loss, a dielectric constant of 13 is obtained with a loss of 0.7% for a material processed at 350° C. for 30 minutes. Both of these examples were treated after firing with a surface modification.

By way of example, a porous layer of dielectric composite consisting of $BaTiO_3$ particles and a ZST matrix has a loss of 5%. The layer was exposed to a silanating agent for 15 minutes, then oven dried at 120° C. for 15 minutes. The measured loss was reduced to 0.7%.

In accordance with the foregoing processes, the present invention enables the formation of features for devices and components having small feature size. For example, the method of the present invention can be used to fabricate features having an average width of not greater than about 500 µm, more preferably not greater than about 200 µm, even more preferably not greater than 100 µm and even more preferably not greater than 25 µm. The precursor compositions according to the present invention also enable the deposition of thinner layers than what is state of the art for thick film pastes. Dielectric layers with thickness of not greater than 20 µm can be readily deposited, more preferably not greater than 15 µm, or even more preferably not greater than 10 µm, while maintaining resistance to dielectric breakdown in the range of several kV/cm. In general terms, the capacitance of a capacitor embedded in a multilayer package is related to the dielectric constant of a dielectric material and the thickness of the dielectric layer according to the following equation:

$$C=(eNAk)/t$$

where C is the capacitance of the multilayer capacitor; e is a constant; N is the number of active layers in the case of multilayered ceramic package; k is the dielectric constant of the dielectric material obtained after deposition and processing of the dielectric precursor. A is the area of the electrodes which is often small to save "real estate cost", and t is the thickness or distance between the capacitor plates.

This equation illustrates that if the value of A is constant, the capacitance can be improved by increasing either the number of active layers N or the ratio of K/t. Hence, the importance of using high-k compositions, and applying this dielectric precursor in very thin layers, as enabled by the present invention.

The present invention is particularly useful for fabrication of capacitors or dielectric layers that can be fired below 500° C., more preferably below 400° C., more preferably below 350° C., and even more preferably below 250° C. The present invention enables the production of highly pure dielectric features with low porosity, or fully dense composite layers with a dielectric constant of up to 500, more preferably up to 750, even more preferably up to 1000. The present invention further enables the deposition of very thin dielectric layers, such as not greater than 20 µm, more preferably thinner than 15 µm, and even more preferably thinner than 10 µm while having a typical surface roughness not greater than 10% of the full layer thickness and a typical breakdown voltage of at least 500 kV/cm for a 5 mm² device.

The present invention also enables the production of highly pure dielectric features with low porosity, or fully dense composite layers with a dielectric loss of not greater than 1%, more preferably not greater than 0.1%, even more preferably not greater than 0.05%. The dielectric constants are up to 700 at 1 MHz when processed at 600° C. The porosity is not greater than 20% when processed at 600° C. The surface roughness is not greater than 5% of the thickness of the layer.

The layer thickness is not greater than 1 µm for dielectrics made from pure precursors. Screen printed dielectric layers are typically about 12 µm thick.

The loss can be as low as 0.2% for dielectrics processed at 450° C. and surface modified.

The layers of the present invention can combine the attributes of being flexible, being compatible with a wide variety of electrode materials, including polymer thick film materials.

The dielectric layer can be a composite layer. The composite can include metal oxide/glass, metal oxide/polymer, and metal oxide 1/metal oxide 2. For example, the low temperature processing allows the formulation of composite dielectric layer including $Al_2O_3$ and $TiO_2$ particles. This composition can be tailored to have a very low TCC value combined with very low loss for low fire microwave applications. In a preferred embodiment, the dielectric metal oxide is PMN and the preferred glass is a lead based borosilicate glass. In another preferred embodiment, the dielectric derived from particles is doped $BaTiO_3$, and the dielectric derived from precursors is ZST.

The glass-metal oxide compositions can include powders of each material or various combinations of powders and precursors. For example, the dielectric composite could be a combination of dielectric particles, dielectric precursor, and a low melting temperature glass.

The compositions and methods of the present invention provide final microstructures including phases of dielectric and glass that are not interdiffused. They also provide compositions where the two dielectric phases are not interdiffused. For example, the composite could include $BaTiO_3$ particles that are connected through a network of $TiO_2$ derived from precursor. This structure would be impossible to achieve through traditional sintering routes where the phases would interdiffuse.

The porosity of the composite dielectric structures derived from the compositions and methods of the present invention is preferably not greater than 25%, more preferably not greater than 10%, even more preferably not greater than 5%, and most preferably not greater than 2%.

The low temperature processing further allows the combination of dielectric and magnetic materials into one composite phase. For example, a mixed phase including Ni—Zn ferrite and $BaTiO_3$ can be prepared by using particles of both phases and a low melting point glass and firing at 600° C. This low firing temperature avoids the problems that are typically associated with sintering, such as thermal mismatch during cooling, and solid-state diffusion, which causes interdiffusion of the two very different functional phases. The composite materials can have tailored dielectric and magnetic properties and be deposited on low temperature substrates including semiconductor chip components, microwave components, organic substrates, polymer substrates and glass substrates.

The present invention also provides high performance dielectric layers containing no polymer that are in contact with either a polymeric substrate, or a thin metal layer that is directly in contact with a polymeric substrate. This is a result of the low processing temperatures coupled with the high performance.

The compositions and methods of the present invention advantageously allow the fabrication of a variety of dielectric structures. The dielectric can form a portion of a loaded antenna. The dielectric can be placed under the conductor in an antenna. The dielectric can be used in a capacitor or sensor. The dielectric layer can also be used in organic and inorganic EL displays.

The present invention provides a method for creating unique microstructures of dielectric materials.

The compositions and methods of the present invention can be used to fabricate dielectric and capacitive layers for RF tags and smart cards. The compositions and methods provide the ability to print disposable electronics such games in magazines.

The precursor compositions and processes of the present invention can be used to fabricate microelectronic components such as decoupling capacitors deposited directly onto the semiconductor chip.

Another technology where the deposition of electronic powders according to the present invention provides significant advantages is for flat panel displays, such as plasma display panels. High resolution dispensing of low fire dielectric layers is a particularly useful method for forming the capacitive layers for a plasma display panel. Typically, a dielectric precursor is printed onto a glass substrate and is fired in air at from about 450° C. to 600° C. The present invention offers much lower firing temperatures.

Tape transfer offers many advantages over the precursor techniques including faster production time and the flexibility to produce prototypes and low-volume production applications. The deposited features will have high resolution and dimensional stability, and will have a high density.

The present invention is also applicable to inductor-based devices including transformers, power converters and phase shifters. Examples of such devices are illustrated in: U.S. Pat. Nos. 5,312,674 by Haertling et al.; U.S. Pat. No. 5,604,673 by Washburn et al.; and U.S. Pat. No. 5,828,271 by Stitzer. Each of the foregoing U.S. Patents is incorporated herein by reference in their entirety.

Further, the use of hollow particles leads to layers with lower dielectric constants. A particularly useful material for this application is alumina, where the hollowness reduces the dielectric constant and increases the buoyancy thereby reducing stratification, and has low loss due to the intrinsic characteristics of alumina at high frequencies. Further, very high thermal conductivity is not required and therefore silica is often used in this application.

The present invention can be used in circuitry for a disposable calculator, sensors including conductor features of pure metal on an organic, semiconductor, or glass substrates for solar cell technology, disposable cell phone, game in a magazine, electronic paper, where the paper is in a magazine The present invention can also be used to transfer dielectric materials onto substrates that are not flat. For example, these can include helmets, windshields, electronic components, electronic packaging, visors, etc.

The present invention allows transfer of electronic materials on substrates that have multiple material surfaces exposed. These exposed materials can include Si, $SiO_2$, silicon nitride, polymers, polyimides, epoxies, etc.

According to another embodiment of the present invention, the circuit can contain various combinations of circuit elements, some or all of which can be formed by direct writing. The circuit can include only a conductor. The circuit can include conductor and resistor elements as in resistor networks. The circuit can include conductor, resistor and dielectric elements.

According to another embodiment of the present invention, the circuit can be transferred to a substrate that is transparent or reflective.

The present invention can be used to form the dielectric substrate for directly written antennae. The antenna can be a fractal antenna. The antenna can be a loaded antenna comprising resistive, inductive, or capacitive elements.

In addition to circulators in microwave devices, the composite and functionally graded composites that are described herein have numerous other applications in the area of miniaturization of hybrid microwave circuits. For example, graded dielectric constants in the plane can be used for impedance transformers by relying on the graded dielectric constant rather than tapered geometry to change intrinsic impedance along the length of the line. This will reduce size and has the potential to reduce losses associated with the geometrical aspects and related resonance effects.

In another embodiment of the present invention, conducting or ceramic structures of one composition in a medium of a different composition can be provided. By building some type of resonance into the structure, novel properties can be obtained.

In one particular implementation of these resonant structures, miniature microwave filters with very specific performance can be constructed by imbedding a conductive resonant structure into a high-k medium. For example, imbedding a conductive resonator structure into a dielectric with a relative dielectric constant of 10,000 will enable a size reduction by a factor of 100.

This technique will enable the fabrication of devices with highly customized filter characteristics, while the reduction in device footprint, especially in the 1 GHz range where current component sizes are of the order of several centimeters, will allow for direct integration versatility onto monolithic microwave integrated chips.

The present invention allows direct transfer of multiple types of materials in a multilayer fashion with micron-scale spatial resolution within the layers. One implementation of this capability results in a photonic bandgap material consisting of stacked layers of dielectric rods. Each layer in the stack is rotated 90 degrees relative to adjacent layers, forming what is commonly known as a Lincoln log structure. While such structures can be obtained using photolithographic techniques, the present invention allows the structures to be made from new materials, with fewer steps, and at significantly lower costs.

In one embodiment of the present invention for low ohm resistors, the feature includes silver derived from a precursor and an insulating phase. The insulating phase is preferably a glass or metal oxide. Preferred glasses are aluminum borosilicates, lead borosilicates and the like. Preferred metal oxides are silica, titania, alumina, and other simple and complex metal oxides. In one embodiment the insulating phase is derived from particles. In another embodiment, it is derived from precursors. In yet another embodiment, the insulative phase is derived from nanoparticles.

In one embodiment, the substrate is not planar and a non-contact transfer approach is used. Examples of surfaces that are non-planar include windshields, electronic components, electronic packaging and visors.

The tape compositions and methods provide the ability to make disposable electronics such as for games included in magazines. The precursor compositions can advantageously be deposited and reacted on cellulose-based materials such as paper or cardboard. The cellulose-based material can be coated if necessary to prevent bleeding of the precursor composition into the substrate. For example, the cellulose-based material can be coated with a UV curable polymer.

The low-ohm resistors formed in accordance with the present invention have combinations of various features that have not been attained using other high viscosity precursor compositions. After firing, tape compositions of the present invention will yield solids that may or may not be porous with specific bulk resistivity values. As a background, bulk resistivity values of a number of fully dense solids are provided in Table 6 above:

A low cost resistor precursor including between 20 and 40 vol. % micron-size particles selected from the group of amorphous carbon, carbon graphite, iron, nickel, tungsten, molybdenum, and between 0 and 15 vol. % nanoparticles selected from the group of Ag, carbon, intrinsically conductive polymer, Fe, Cu, Mo, W, and between 0 and 15 wt. % precursor to a metal such as Ag, with the balance being solvents, vehicle and other additives, will, after firing at between 250° C. and 400° C., yield a bulk conductivity in the range from 50 to 4000 micro-ohm-centimeter.

A low cost resistor precursor including between 20 and 40 vol. % micron-size particles selected from the group of amorphous carbon, graphite, iron, nickel, tungsten, molybdenum, and between 10 wt. % and 30 wt. % precursor to a intrinsically conductive polymer, with the balance being solvents, vehicle and other additives, will, after firing at between 100° C. and 200° C., yield a bulk conductivity is in the range from 1,000 to 10,000 micro-ohm-centimeter.

The compositions and methods of the present invention advantageously allow the fabrication of various unique structures.

In one embodiment, the average thickness of the deposited feature is greater than about 0.1 μm, more preferably is greater than about 0.5 μm, even more preferably is greater than about 1 μm, and even more preferably is greater than about 5 μm but less than 20 μm. These thicknesses can be obtained by single tape deposition or deposition of discrete units of material by depositing more than a single layer. A single layer can be deposited and dried, followed by repetitions of this cycle.

The compositions and methods of the present invention can also be used to form dots, squares and other isolated regions of material. The regions can have a feature size of less than 250 μm, more preferably less than 100 μm, and more preferably less than 50 μm in the largest dimension. These features can be deposited by tape transfer of individual parcels of tape material or multiple parcels of material deposited at the same location with or without thermal processing in between deposition of individual parcels or periods of multiple parcel deposition. In one embodiment, the surface tension of the transferred tape material on the substrate material is chosen to provide poor wetting of the surface so that the transferred tape material contracts onto itself after printing. This provides a method for producing deposits with sizes equal to or smaller than the individual parcel diameter.

The compositions and methods of the present invention can also be used to form lines. In one embodiment, the lines can advantageously have an average width of not greater than 250 μm, more preferably not greater than 100 μm, and more preferably not greater than 50 μm, even more preferably no greater than 25 μm, even more preferably no greater than 10 μm.

The tape compositions and methods of the present invention can advantageously be used in a variety of applications.

For example, the compositions and methods of the present invention can be used to fabricate transparent antennas for RF (radio frequency) tags and smart cards. This is enabled by compositions comprising a transparent conductive metal oxide such as ITO. In another embodiment, the compositions can include some metal to enhance conductivity. In one embodiment, the antenna comprises a material with a sheet resistivity of from about 10 to 100,000 ohms/square. In another embodiment, the antenna comprises a conductor with a resistivity that is not greater than three times the resistivity of substantially pure silver. High conductivity traces are required for inductively coupled antennas whereas metal oxides can be used for electrostatic (capacitively coupled) antennas.

The compositions can also serve as solder replacements. Such compositions can include silver, lead or tin.

The compositions and methods can be utilized to provide connection between chips and other components in smart cards and RF tags.

In one embodiment, the surface to be printed onto is not planar and a non-contact printing approach is used. The non-contact printing approach can be tape transfer or another technique providing deposition of discrete units of fluid onto the surface. Examples of surfaces that are non-planar include in windshields, electronic components, electronic packaging and visors.

The compositions and methods provide the ability to print disposable electronics such as for games included in magazines. The compositions can advantageously be deposited and reacted on cellulose-based materials such as paper or cardboard. The cellulose-based material can be coated if necessary to prevent bleeding of the transferred tape composition into the substrate. For example, the cellulose-based material could be coated with a UV curable polymer.

The compositions and methods can be used to form under bump metallization, redistribution patterns and basic circuit components.

The tapes and processes of the present invention can also be used to fabricate microelectronic components such as multi-chip modules, particularly for prototype designs or low-volume production Another technology where the transfer of electronic features according to the present invention provide significant advantages, is for flat panel displays, such as plasma display panels. Transfer of electronic powders is a particularly useful method for forming the electrodes for a plasma display panel. The electronic powders and deposition method according to the present invention can advantageously be used to form the electrodes and resistors, as well as the bus lines and barrier ribs, for the plasma display panel. Typically, a metal paste is printed onto a glass substrate and is fired in air at from about 450° C. to 600° C.

Another type of flat panel display is a field emission display (FED). The transfer method of the present invention can advantageously be used to deposit the microtip emitters of such a display. More specifically, a tape transfer process can be used to accurately and uniformly create the microtip emitters on the backside of the display panel.

Yet another type of display technology is the polymer light emitting diode based technology. Tape and tape transfer technology of the present invention can be used advantageously to directly deposit these devices onto a substrate.

Another type of electronic powder to which the present invention is applicable is transparent electrode powder, particularly indium-tin oxide, referred to as ITO. Such materials are used as electrodes in display applications, particularly for thin-film electroluminescent (TFEL) displays. The electrode patterns of ITO can advantageously be deposited using the transfer method of the present invention.

The present invention is also applicable to inductor-based devices including transformers, power converters and phase shifters. Examples of such devices are illustrated in: U.S. Pat. Nos. 5,312,674 by Haertling et al.; U.S. Pat. No. 5,604,673 by Washburn et al.; and U.S. Pat. No. 5,828,271 by Stitzer. Each of the foregoing U.S. patents is incorporated herein by reference in their entirety. In such devices, the inductor is commonly formed as a spiral coil of an electrically conductive trace, typically using a thick-film paste method. To provide the most advantageous properties, the metallized layer, which is typically silver, must have a fine pitch (line spacing). The output current can be greatly increased by decreasing the line width and decreasing the distance between lines. The tape transfer process of the present invention is particularly advantageous for forming such devices, particularly when used in a low-temperature cofired ceramic package (LTCC).

The present invention can also be used to fabricate antennas such as antennas used for cellular telephones. Examples of microstrip antennas are illustrated in: U.S. Pat. No. 5,121,127 by Toriyama; U.S. Pat. No. 5,444,453 by Lalezari; U.S. Pat. No. 5,767,810 by Hagiwara et al.; and U.S. Pat. No. 5,781,158 by Ko et al. Each of these U.S. patents is incorporated herein by reference in their entirety. The methodology of the present invention can be used to form the conductors, resistors, inductors and other components of an antenna assembly.

Additional applications enabled by the tape compositions and transfer methods of the present invention include low cost or disposable electronic devices such as electronic displays, electrochromic, electrophoretic and light-emitting polymer-based displays. Other applications include circuits imbedded in a wide variety of devices such as low cost or disposable light-emitting diodes, solar cells, portable computers, pagers, cell phones and a wide variety of internet compatible devices such as personal organizers and web-enabled cellular phones. The present invention also enables a wide variety of security and authentication applications. For example, with the advent and growth of desktop publishing and color-photocopiers, the opportunities for document and coupon fraud have increased dramatically. The present invention has utility in a variety of areas including coupon redemption, inventory security, currency security, compact disk security and driver's license and passport security. The present invention can also be utilized as an effective alternative to magnetic strips. Presently, magnetic strips include identification numbers such as credit card numbers that are programmed at the manufacturer. These strips are prone to failure and are subject to fraud because they are easily copied or modified. To overcome these shortcomings, circuits can be printed on the substrate and encoded with specific consumer information. Thus, the present invention can be used to improve the security of credit cards, ATM cards and any other tracking card, which uses magnetic strips as a security measure.

Metal-carbon composite powders can also be used to form electrically conductive traces. Such electrical conductive traces can advantageously be deposited using a tape transfer method into intricate patterns without the necessity of forming individual screens for each pattern. The tapes can be used to fabricate the electrodes and gas diffusion layers of fuel cells.

The compositions and methods of the present invention can also produce conductive patterns that can be used in flat panel displays. The conductive materials used for electrodes in display devices have traditionally been manufactured by commercial deposition processes such as etching, evaporation, and sputtering onto a substrate. In electronic displays it is often necessary to utilize a transparent electrode to ensure that the display images can be viewed. Indium tin oxide (ITO), deposited by means of vacuum-deposition or a sputtering process, has found widespread acceptance for this application. U.S. Pat. No. 5,421,926 by Yukinobu et al. discloses a process for printing ITO inks. For rear electrodes (i.e., the electrodes other than those through which the display is viewed) it is often not necessary to utilize transparent conductors. Rear electrodes can therefore be formed from conventional materials and by conventional processes. Again, the rear electrodes have traditionally been formed using costly sputtering or vacuum deposition methods. The compositions according to the present invention allow the direct transfer of metal electrodes onto low temperature substrates such as plastics. For example, a silver tape composition can be transferred and heated at 150° C. to form 150 µm by 150 µm square electrodes with excellent adhesion and sheet resistivity values of less than 1 ohms per square.

In one embodiment, the precursor compositions are used to interconnect electrical elements on a substrate, such as non-linear elements. Non-linear elements are defined herein as electronic devices that exhibit nonlinear responses in relationship to a stimulus. For example a diode is known to exhibit a nonlinear output-current/input-voltage response. An electroluminescent pixel is known to exhibit a non-linear light-output/applied-voltage response. Nonlinear devices also include but are not limited to transistors such as TFTs and OFETs, emissive pixels such as electroluminescent pixels, plasma display pixels, field emission display (FED) pixels and organic light emitting device (OLED) pixels, non emissive pixels such as reflective pixels including electrochromic material, rotatable microencapsulated microspheres, liquid crystals, photovoltaic elements, and a wide range of sensors such as humidity sensors.

Nonlinear elements, which facilitate matrix addressing, are an essential part of many display systems. For a display of M×N pixels, it is desirable to use a multiplexed addressing scheme whereby M column electrodes and N row electrodes are patterned orthogonally with respect to each other. Such a scheme requires only M+N address lines (as opposed to M×N lines for a direct-address system requiring a separate address line for each pixel). The use of matrix addressing results in significant savings in terms of power consumption and cost of manufacture. As a practical matter, the feasibility of using matrix addressing usually hinges upon the presence of a nonlinearity in an associated device. The nonlinearity eliminates crosstalk between electrodes and provides a thresholding function. A traditional way of introducing nonlinearity into displays has been to use a backplane having devices that exhibit a nonlinear current/voltage relationship. Examples of such devices include thin-film transistors (TFT) and metal-insulator-metal (MIM) diodes. While these devices achieve the desired result, they involve thin-film processes, which suffer from high production costs as well as relatively poor manufacturing yields.

The present invention allows the direct transfer of the conductive components of nonlinear devices including the source the drain and the gate. These nonlinear devices may include directly transferred organic materials such as organic field effect transistors (OFET) or organic thin film transistors (OTFT), directly printed inorganic materials and hybrid organic/inorganic devices such as a polymer based field effect transistor with an inorganic gate dielectric. Direct transferring of these conductive materials will enable low cost manufacturing of large area flat displays.

The compositions and methods of the present invention produce conductive patterns that can be used in flat panel displays to form the address lines or data lines. The lines may be made from transparent conducting polymers, transparent conductors such as ITO, metals or other suitable conductors. The present invention provides ways to form address and data lines. The tape compositions of the present invention allow transferring on large area flexible substrates such as plastic substrates and paper substrates, which are particularly useful for large area flexible displays. Address lines may additionally be insulated with an appropriate insulator such as a non-conducting polymer or other suitable insulator. Alternatively, an appropriate insulator may be formed so that there is electrical isolation between row conducting lines, between row and column address lines, between column address lines or for other purposes. These lines can be transferred with a thickness of about one μm and a line width of 100 μm. These data lines can be transferred continuously on large substrates with an uninterrupted length of several meters. The deposited lines can be heated to 200° C. to form metal lines with a bulk conductivity that is not less than 10 percent of the conductivity of the equivalent pure metal.

Flat panel displays may incorporate emissive or reflective pixels. Some examples of emissive pixels include electroluminescent pixels, photoluminescent pixels such as plasma display pixels, field emission display (FED) pixels and organic light emitting device (OLED) pixels. Reflective pixels include contrast media that can be altered using an electric field. Contrast media may be electrochromic material, rotatable microencapsulated microspheres, polymer dispersed liquid crystals (PDLCs), polymer stabilized liquid crystals, surface stabilized liquid crystals, smectic liquid crystals, ferroelectric material, or other contrast media well known in art. Many of these contrast media utilize particle-based non-emissive systems. Examples of particle-based non-emissive systems include encapsulated electrophoretic displays (in which particles migrate within a dielectric fluid under the influence of an electric field); electrically or magnetically driven rotating-ball displays as disclosed in U.S. Pat. Nos. 5,604,027 and 4,419,383, which are incorporated herein by reference in their entirety; and encapsulated displays based on micromagnetic or electrostatic particles as disclosed in U.S. Pat. Nos. 4,211,668, 5,057,363 and 3,683,382; which are incorporated herein by reference in their entirety. A preferred particle non-emissive system is based on discrete, microencapsulated electrophoretic elements, examples of which are disclosed in U.S. Pat. No. 5,930,026 by Jacobson et al. which is incorporated herein by reference in its entirety.

In one embodiment, the present invention relates to transferring conductive features, such as electrical interconnects and electrodes for addressable, reusable, paper-like visual displays. Examples of paper-like visual displays include "gyricon" (or twisting particle) displays and forms of electronic paper such as particulate electrophoretic displays (available from E-ink Corporation, Cambridge, Mass.). A gyricon display is an addressable display made up of optically anisotropic particles, with each particle being selectively rotatable to present a desired face to an observer. For example, a gyricon display can incorporate "balls" where each ball has two distinct hemispheres, one black and the other white. Each hemisphere has a distinct electrical characteristic (e.g., zeta potential with respect to a dielectric fluid) so that the ball is electrically as well as optically anisotropic. The balls are electrically dipolar in the presence of a dielectric fluid and are subject to rotation. A ball can be selectively rotated within its respective fluid-filled cavity by application of an electric field, so as to present either its black or white hemisphere to an observer viewing the surface of the sheet.

In another embodiment, the present invention relates to electrical interconnects and electrodes for organic light emitting displays (OLEDs). Examples of OLED's are illustrated in U.S. Pat. No. 6,402,579 by Pichler et al., U.S. Pat. No. 6,433,358 by Beierlein and U.S. Pat. No. 6,410,201 by Wolk. Each of these U.S. patents is incorporated herein by reference in its entirety. Organic light emitting displays are emissive displays consisting of a transparent substrate coated with a transparent conducting material (e.g., ITO), one or more organic layers and a cathode made by evaporating or sputtering a metal of low work function characteristics (e.g., calcium or magnesium). The organic layer materials are chosen so as to provide charge injection and transport from both electrodes into the electroluminescent organic layer (EL), where the charges recombine to emit light. There may be one or more organic hole transport layers (HTL) between the transparent conducting material and the EL, as well as one or more electron injection and transporting layers between the cathode and the EL. The tape compositions according to the present invention allow the direct deposition of metal electrodes onto low temperature substrates such as flexible large area plastic substrates that are particularly preferred for OLEDs. For example, a metal tape composition can be transferred and heated at 150° C. to form a 150 μm by 150 μm square electrode with excellent adhesion and a sheet resistivity value of less than 1 ohm per square. The compositions and deposition methods of the present invention also enable transferring of row and column address lines for OLEDs. These lines can be made with a thickness of about one µm and a line width of 100 µm. These data lines can be transferred continuously on large substrates with an uninterrupted length of several meters. The transferred lines can be heated to 150° C. and form metal lines with a bulk conductivity that is no less than 5 percent of the conductivity of the equivalent pure metal.

In one embodiment, the present invention relates to electrical interconnects and electrodes for liquid crystal displays (LCDs), including passive-matrix and active-matrix. Particular examples of LCDs include twisted nematic (TN), supertwisted nematic (STN), double supertwisted nematic (DSTN), retardation film supertwisted nematic (RFSTN), ferroelectric (FLCD), guest-host (GHLCD), polymer-dispersed (PD), polymer network (PN).

Thin film transistors (TFTs) are well known in the art, and are of considerable commercial importance. Amorphous silicon-based thin film transistors are used in active matrix liquid crystal displays. One advantage of thin film transistors is that they are inexpensive to make, both in terms of the materials and the techniques used to make them. In addition to making the individual TFTs as inexpensively as possible, it is also desirable to inexpensively make the integrated circuit devices that utilize TFTs. Accordingly, inexpensive methods for fabricating integrated circuits with TFTs, such as those of the present invention, are an enabling technology for printed logic.

For many applications, inorganic interconnects are not adequately conductive to achieve the desired switching speeds of an integrated circuit due to high RC time constants. Transferred pure metals, as enabled by the tape compositions of the present invention, achieve the required performance. A metal interconnect transferred by using a silver tape composition as disclosed in the present invention will result in a reduction of the resistance (R) and an associated reduction in the time constant (RC) by a factor of 100,000, more preferably by 1,000,000, as compared to current conductive polymer interconnect material used to connect polymer transistors.

Field-effect transistors (FETs), with organic semiconductors as active materials, are the key switching components in contemplated organic control, memory, or logic circuits, also referred to as plastic-based circuits. An expected advantage of such plastic electronics is the ability to fabricate them more easily than traditional silicon-based devices. Plastic electronics thus provide a cost advantage in cases where it is not necessary to attain the performance level and device density provided by silicon-based devices. For example, organic semiconductors are expected to be much more readily printable than vapor-deposited inorganics, and are also expected to be less sensitive to air than recently proposed solution-deposited inorganic semiconductor materials. For these reasons, there have been significant efforts expended in the area of organic semiconductor materials and devices.

Organic thin film transistors (TFTs) are expected to become key components in the plastic circuitry used in display drivers of portable computers and pagers, and memory elements of transaction cards and identification tags. A typical organic TFT circuit contains a source electrode, a drain electrode, a gate electrode, a gate dielectric, an interlayer dielectric, electrical interconnects, a substrate, and semiconductor material. The tape compositions of the present invention can be used to deposit all the components of this circuit, with the exception of the semiconductor material.

One of the most significant factors in bringing organic TFT circuits into commercial use is the ability to deposit all the components on a substrate quickly, easily and inexpensively as compared with silicon technology (i.e., by reel-to-reel printing).

The tape compositions of the present invention are particularly useful for the direct transfer of electrical connectors as well as antennae of smart tags, smart labels, and a wide range of identification devices such as radio frequency identification (RFID) tags. In a broad sense, the conductive tape compositions can be utilized for electrical connection of semiconductor radio frequency transceiver devices to antenna structures and particularly to radio frequency identification device assemblies. A radio frequency identification device ("RFID") by definition is an automatic identification and data capture system comprising readers and tags. Data is transferred using electric fields or modulated inductive or radiating electromagnetic carriers. RFID devices are becoming more prevalent in such configurations as, for example, smart cards, smart labels, security badges, and livestock tags.

The tape compositions of the present invention also enable the low cost, high volume, highly customizable production of electronic labels. Such labels can be formed in various sizes and shapes for collecting, processing, displaying and/or transmitting information related to an item in human or machine readable form. The tape compositions of the present invention can be used to transfer the conductive features required to form the logic circuits, electronic interconnections, antennae, and display features in electronic labels. The electronic labels can be an integral part of a larger printed item such as a lottery ticket structure with circuit elements disclosed in a pattern as disclosed in U.S. Pat. No. 5,599,046.

In another embodiment of the present invention, the conductive patterns made in accordance with the present invention can be used as electronic circuits for making photovoltaic panels. Currently, conventional screen-printing is used in mass scale production of solar cells. Typically, the top contact pattern of a solar cell consists of a set of parallel narrow finger lines and wide collector lines deposited essentially at a right angle to the finger lines on a semiconductor substrate or wafer. Such front contact formation of crystalline solar cells is performed with standard screen-printing techniques. Direct transferring of these contacts with the tape compositions of the present invention provides the advantages of production simplicity, automation, and low production cost.

Low series resistance and low metal coverage (low front surface shadowing) are basic requirements for the front surface metallization in solar cells. Minimum metallization widths of 100 to 150 µm are obtained, using conventional screen-printing. This causes a relatively high shading of the front solar cell surface. In order to decrease the shading, a large distance between the contact lines, i.e., 2 to 3 mm is required. On the other hand, this implies the use of a highly doped, conductive emitter layer. However, the heavy emitter doping induces a poor response to short wavelength light. Narrower conductive lines can be deposited using the tape composition and transferring methods of the present invention. The conductive tape compositions of the present invention enable the direct transfer of finer features down to 20 µm. The tape compositions of the present invention further enable the depositing of pure metals with resistivity values of the transferred features as low as 2 times bulk resistivity after processing at temperatures as low as 200° C.

The low processing and direct transfer deposition capabilities according to the present invention are particularly enabling for large area solar cell manufacturing on organic and flexible substrates. This is particularly useful in manufacturing novel solar cell technologies based on organic photovoltaic materials such as organic semiconductors and dye sensitized solar cell technology as disclosed in U.S. Pat. No. 5,463,057 by Graetzel et al. The tape compositions according to the present invention can be directly transferred and heated to yield a bulk conductivity that is no less than 10 percent of the conductivity of the equivalent pure metal, and achieved by heating the transferred features at temperatures below 200° C. on polymer substrates such as plexiglass (PMMA).

Another embodiment of the present invention enables the production of an electronic circuit for making printed wiring board (PWBs) and printed circuit boards (PCBs). In conventional subtractive processes used to make printed-wiring boards, wiring patterns are formed by preparing pattern films. The pattern films are prepared by means of a laser plotter in accordance with wiring pattern data outputted from a CAD (computer-aided design system), and are etched on copper foil by using a resist ink or a dry film resist.

In such conventional processes, it is necessary to first form a pattern film, and to prepare a printing plate in the case when a photo-resist ink is used, or to take the steps of lamination, exposure and development in the case when a dry film resist is used.

Such methods can be said to be methods in which the digitized wiring data are returned to an analog image-forming step. Screen-printing has a limited work size because of the printing precision of the printing plate. The dry film process is a photographic process and, although it provides high precision, it requires many steps, resulting in a high cost especially for the manufacture of small lots.

The tape composition and transferring methods of the present invention offer solutions to overcome the limitations of the current PWB formation process. For example, they do not generate any waste. The transferring methods of the present invention are a single step direct deposition process and are compatible with small-batch and rapid turn around production runs. For example, a copper tape composition can be directly transferred onto FR4 (a polymer impregnated fiberglass) to form interconnection circuitry. These features are formed by heating the transferred copper precursor in an $N_2$ ambient at 150° C. to form copper lines with a line width of not greater than 100 μm, a line thickness of not greater than 5 μm, and a bulk conductivity that is not less than 10 percent of the conductivity of the pure copper metal.

Patterned electrodes obtained by one embodiment of the present invention can also be used for screening electromagnetic radiation or earthing electric charges, in making touch screens, radio frequency identification tags, electrochromic windows and in imaging systems, e.g., silver halide photography or electrophotography. A device such as the electronic book described in U.S. Pat. No. 6,124,851 can be formed using the compositions of the present invention.

The tape compositions and ribbon structures of the present invention are also applicable to the fabrication of fuel cell components. Fuel cells are devices that are capable of generating electrical power when fed with a source of oxygen such as air and gaseous fuels such as hydrogen or liquid fuels such as methanol. The main functional component of a fuel cell is a membrane electrode assembly (MEA). The MEA comprises a polymer membrane sandwiched between a cathode electrode and an anode electrode. The cathode and anode are in turn each covered with gas diffusion layers. The cathode and anode electrodes in most cases comprise electrocatalyst materials, typically platinum in the form of either platinum particles or platinum dispersed on supports such as carbon for the cathode and platinum-ruthenium alloy for the anode, either unsupported or supported on carbon. The cathode and anode layers also comprise one or more proton conducting polymers, such as fluoropolymers with sulfonic acid groups, electrically conducting materials such as carbons, and porosity to allow gas transport. It is advantageous to be able to control the distribution of these different materials in the cathode and anode layers in all directions, tranversely and perpendicular to the membrane. Further, low cost methods are need to allow fabrication of cathodes and anodes.

The ribbons and deposition methods using ribbons described in this application are advantageous for fabrication of cathodes and anodes in MEAs. In one embodiment the ribbons of this application can be used to deposit cathodes and anodes onto membranes providing uniform distribution of the component materials across the area of the membrane. In another embodiment, the cathode and anode materials are deposited onto gas diffusion layers (GDL) that are later laminated to the membrane. The tape can be used to transfer electrocatalyst, that has already been preformed in a previous steps, onto a membrane or GDL. The tape can also be used to transfer platinum precursors onto the membrane or GDL. The precursors can then be reacted on the membrane or GDL to form electrocatalyst. The tape can also be used to transfer platinum precursors combined with electrocatalyst powders onto the membrane or GDL. The precursors can then be reacted on the membrane or GDL to form additional electrocatalyst or modify the pre-existing electrocatalyst. In another embodiment, the ability to transfer patterns of tape material from the backing can be used to provide a patterned electrocatalyst layer on a membrane or GDL. The tape can be transferred digitally, discrete portions at a time at discrete locations, using various means such as mechanical pressure to provide higher concentrations of electrocatalyst in chosen locations on the membrane while leaving lower concentrations elsewhere on the membrane. This allows tailoring the electrocatalyst concentration on the membrane to match the gas flow fields when operated as a fuel cell. In another embodiment, the ability to use various backing materials for the tapes allows processing of the tape at higher temperatures than could be used on the MEA membrane material. The pre-processed tape can then be transferred either fully or as a pattern onto the membrane or GDL. The ability to use more than one tape with different compositions allows the formation of gradients in concentration of electrocatalyst, proton conducting polymer, electrically conducting materials such as carbon, and porosity. The gradients can be in any direction including perpendicular to the membrane and GDL or in the direction parallel to the membrane, or both. In one embodiment, separate tapes of electrocatalysts, proton conducting polymer, and carbon are used. These tapes are used to separately deposit the materials onto the membrane or GDL in a manner to give controlled concentrations of these materials corresponding to patterns of these materials. The distributions of these materials may match or may be different from each other. In another embodiment, the tape comprises electrocatalyst, proton conducting polymer and electrically conducting carbon.

Fuel cell structures such as MEA's and methods for their manufacture are described in more detail in U.S. Pat. No. 5,415,888 by Banerjee et al., U.S. Pat. No. 5,846,670 by Watanabe et al., U.S. Pat. No. 5,843,519 by Tada, U.S. Pat. No. 5,728,485 by Watanabe et al., U.S. Pat. No. 5,723,173 by Fukuoka et al., U.S. Pat. No. 5,672,439 by Wilkinson et al. and U.S. Pat. No. 4,931,168 by Watanabe et al. Each of the foregoing patents is incorporated herein by reference in its entirety. These patents describe various MEA structures and methods of fabrication along with materials used in MEAs. In one embodiment, the tape approaches described in this application, when used with the methods, materials and structures disclosed in these patents, provide novel methods of making cathodes and anodes for MEAs.

Other methods for the fabrication of MEA's and related fuel cell components are disclosed in U.S. Pat. No. 5,211,984 by Wilson (decal transfer), U.S. Pat. No. 5,738,905 by Bevers (electrostatic printing and decal transfer), U.S. Pat. No. 6,197,147 by Bonsel et al. (continuous laminating), U.S. Pat. No. 4,826,554 by McIntyre et al., (laminating) and U.S. Pat. No. 4,383,010 by Spaepen (dry rolling). Each of these U.S. Patents is incorporated herein by reference in its entirety.

EXAMPLES

Example 1

A resistor ribbon was fabricated from a paste containing 6.3 wt. % ruthenium oxide, 49.2 wt. % low melting glass powder, 0.1 wt. % Menhaden fish oil, 14.3 wt. % SAA-100 binder, 14.3 wt. % DMAc and 15.8 wt. % alpha-terpineol. The ribbon was made by casting a layer with a Meyer rod (metering rod) with a mechanical drive system onto a corona treated MYLAR backing (a polyester film available from E.I. duPont deNemours, Wilmington, Del.) and drying. The material on the MYLAR backing along with a KAPTON (polyimide film available from E.I. duPont deNemours, Wilmington, Del.) and glass substrate was heated uniformly by contact with a warm surface to 80° C. and transferred by means of mechanical pressure from a stylus. A pattern was formed corresponding to the path followed by the stylus.

Example 2

A conductor ribbon was fabricated from a paste made from 51.8 wt. % silver particles, 14.3 wt. % silver trifluoroacetate, 6.2 wt. % poly(propylene carbonate), and 27.7 wt. % DMAc was cast with a Meyer rod and mechanical drive system onto corona treated MYLAR and dried on a backing. The material on the backing along with the substrate (KAPTON and glass) was heated uniformly by contact with a warm surface to 80° C. and transferred by means of mechanical pressure from a stylus. A pattern was formed corresponding to the path followed by the stylus. Heating of the transferred material provided a conducting pattern.

Example 3

A resistor ribbon was fabricated from a paste containing 7.5 wt. % ruthenium oxide, 47.7 wt. % glass powder, 0.1 wt. % Menhaden fish oil, 13.9 wt. % DMAc, 13.9 wt. % SAA-100 (styrene allyl alcohol) binder, and 16.9 wt. % alpha-terpineol was cast with a Meyer rod and mechanical drive and dried on a corona treated MYLAR backing. The material on the backing along with the substrate (KAPTON and glass) was heated uniformly to 90° C. by contact with a warm surface. The tape was contacted with a patterned rubber template and transferred by means of mechanical pressure from the template. A pattern was formed corresponding to the pattern on the rubber template.

Example 4

A conductor tape formulation was fabricated from 47 wt. % silver powder, 15 wt. % silver trifluoroacetate in DMAc, 16.5 wt. % styrene allyl alcohol in DMAc, and a nonionic silicone polyether surfactant (Q2-5211 available from Dow Corning, Midland, Mich.). The material was cast with a Meyer rod and mechanical drive system onto corona treated MYLAR and dried. The tape thickness was 5 μm to 7 μm. The powder to precursor ratio was 3:1 by weight. The tape could be transferred to a KAPTON surface, and the transferred material could be oven treated at 350° C. for 10 minutes to provide a material with 3 to 4 times the bulk Ag resistivity (1.6 μ ohm-cm).

Example 5

A conductor tape was fabricated with 30 wt. % silver powder, 40 wt. % of a 75 wt. % silver trifluoroacetate in DMAc, 30 wt. % at a 50 wt. % styrene allyl alcohol in DMAc and 0.1 wt. % Q2-5211 surfactant. The tape thickness was 5 to 7 μm. The powder to precursor ratio was 1:1. The material could be transferred to a KAPTON surface, oven treated at 350° C. for 10 minutes, to provide 3 to 4 times the bulk resistivity of silver.

Example 6

A dielectric tape composition was fabricated from 46.8 wt. % lead magnesium niobate powder, 16.1 wt. % low temperature glass powder, 27.2 wt. % of a 50 wt. % styrene allyl alcohol in DMAc, 0.5 wt. % surfactant, and 9.5 wt. % terpineol. The material was cast onto corona treated MYLAR with a Meyer rod and mechanical drive system. The tape thickness was 10 to 15 μm. Dielectric tapes were also prepared with different common high dielectric constant powders such as barium titanate.

Example 7

Pastes were formulated with manganese oxide on carbon catalyst powder. A representative example of a formulation is 33 wt. % electrocatalyst powder, 28 wt. % SAA, 39 wt % dimethyl acetamide (DMAc). Components were combined and dispersed with an ultrasonic horn, then deposited onto a MYLAR backing with a Meyer rod and mechanical drive device to push the Meyer rod at a constant rate and pressure. The dry tape thickness was 8 to 12 μm and the ribbon was flexible and robust.

Example 8

A resistor ribbon was formed from 6.3 wt. % $RuO_2$ powder, 49.2 wt. % low temperature glass powder, 28.6 wt. % of 50 wt. % styrene allyl alcohol in DMAc, and 9.5 wt. % terpineol. This paste was deposited onto corona treated MYLAR with a Meyer rod employing a mechanical drive. The tape thickness was 10 to 15 μm and the ribbon was flexible and robust.

Example 9

A conductor tape was formed from a mixture of 15.3 wt. % Styrene allyl alcohol, 19.8 wt. % DMAc, 13.7 wt. % silver trifluoroacetate and 51.1 wt. % copper powder. The tape thickness was 6 to 12 μm.

Example 10

Resistor paste compositions were formulated by dispersing $RuO_2$ nanoparticles in cyclohexane with Menhaden fish oil. The nanoparticles were then dried and combined with a low melting lead borosilicate glass, having a melting temperature of about 460° C., into a carrier solution of alpha-terpineol and ethyl cellulose binder. These components were milled in a three-roll mill and made into a resistor paste composition. The paste was then separated into several aliquots and diluted with different levels of binder solution. The levels were designed so as to produce dry ribbons with no SAA, 20 vol. % and 40 vol. % SAA. The binder solution consisted of a 45 wt. % solution of SAA in butanol.

Samples with these different binder loadings were then screen printed onto silver-platinum electrodes on 96% alumina substrates and processed at temperatures ranging from 350° C. to 600° C., the preferred process temperature being 550° C. It was shown that samples with higher binder loadings produced working resistors although actual solids yield was compromised as compared to samples with minimal binder content resulting in higher sheet resistance. Excess binder did not seem to compromise print definition, but in the case of 40 vol. % loadings, did increase shrinkage of the resistor.

Example 11

A resistor paste composition was formulated with 11.3 wt. % $RuO_2$, 0.2 wt. % Menhaden fish oil, 10.2 wt. % SAA, 10.2 wt. % DMAc, 50.0 wt. % low melting temperature glass, 17.7 wt. % alpha-terpineol, and 0.5 wt % ethyl cellulose. This formulation was designed to produce a dry ribbon with about 45 vol. % binder and a fired resistor with 20 vol. % $RuO_2$.

The paste composition was doctor bladed onto glass slides to make three lines. The material was then dried in air, then at 75° C. for 45 minutes in a convection oven. The resistor lines were fired at 550° C. for 12 minutes with a programmed ramp of 15° C./min. Ramp down was much slower.

When the samples were fired, electrodes were painted to make defined resistors (3 per slide, ¾ inch long) and samples were measured with a multimeter (Keithley Instruments, Cleveland Ohio) and cross-sectional area was measured in three places for each resistor with a laser profilometer. Measured shrinkage from dried state to fired state was 58.6% as measured in one specific place on one line before and after firing. Fired lines were glassy looking but very rough. Average thickness of the lines was about 12 μm to 14 μm. Average sheet resistance for 9 samples was 138 ohms/square averaging to 13 μm thickness.

Example 12

A conductor tape was fabricated from 31.6 grams silver flake, 12.9 grams silver oxalate, 12.8 grams N,N-dimethylacetamide, 4.27 grams alpha-terpineol, 7.67 grams polypropylene carbonate and 30.69 grams acetonitrile. Tapes were fabricated using #3, #4 and #6 bar wire-cators (BYK-Gardner, Columbia, Md.). Tapes were cast onto corona treated polyester having a thickness of 3 mils. Ribbons were dry and could be handled 20 minutes after fabrication. The fabricated ribbon could be rolled, flexed and handled without flaking of the tape material.

Example 13

A conductor tape was fabricated with 32.3 grams silver flake, 13.3 grams silver oxalate, 13.1 grams dimethylacetamide, 4.4 grams alpha-terpineol, 10.5 grams polyethylene carbonate and 26.5 grams dimethyl sulfoxide. Tapes were fabricated using a #5 bar wire-cator (BYK-Gardner). Tapes were cast onto corona treated polyester having a thickness of 3 mils. Ribbons were dry and could be handled several hours after fabrication. The fabricated ribbon could be rolled, flexed and handled without flaking of the tape material.

Example 14

A conductor tape was fabricated with 9.9 grams polypropylene carbonate, 39.8 grams acetonitrile, 35.6 grams silver flake, 1.1 grams silver flake (Degussa S7000-24), 6.9 grams silver nitrite and 6.7 grams alpha-terpineol. The tape was cast on a corona treated polyester film having a thickness of 3 mils to form a ribbon structure and also on glass slides. The coating was performed by hand using a large hard rubber spatula. The slides were exposed to a 750 watt UV light source for 30 minutes after which x-ray diffraction (XRD) and scanning electron microscopy (SEM) were performed. XRD with SEM indicated that the material was composed of silver in polymer matrix. The fabricated ribbon could be rolled, flexed and handled without flaking of the tape material.

Example 15

A conductor tape was fabricated with 10 grams polypropylene carbonate, 40 grams acetonitrile, 34.4 grams silver flake, 9.5 grams silver oxalate, 1.4 grams DMAc, and 4.7 grams alpha-terpineol. The tape was cast on a corona treated polyester film having a thickness of 3 mils to form a ribbon structure and also on glass slides. Coating was performed by hand using a large hard rubber spatula. The slides were exposed to a 750 watt UV light source for 30 minutes after which XRD and SEM was performed. XRD with SEM indicated that the material was composed of silver in polymer matrix. The fabricated ribbon could be rolled, flexed and handled without flaking of the tape material Example 16

A conductor tape was fabricated with 10.1 grams polypropylene carbonate, 40.4 grams acetonitrile, 36 grams silver flake, 6.8 grams silver nitrite and 6.7 grams alpha-terpineol. The tape was cast on a corona treated polyester film having a thickness of 3 mils to form a ribbon structure and also on glass slides. The coating was performed by hand using a large hard rubber spatula. The slides were exposed to a 750 watt UV light source for 30 minutes after which XRD and SEM was performed. XRD with SEM indicated that the material was composed of silver in polymer matrix. The fabricated ribbon could be rolled, flexed and handled without flaking of the tape material.

Example 17

Conductor tapes were fabricated with 15 grams silver trifluoroacetate, 47 grams silver powder, 21.5 grams DMAc, and 16.5 grams SAA. The tapes were fabricated using a reverse-roll coating process. The coatings were applied to a corona treated polyester film having a thickness of 3 mils to form a ribbon structure and the coatings had a thickness of 6 μm and 12 μm. The fabricated ribbon could be rolled, flexed and handled without flaking of the tape material.

Example 18

In one embodiment, the present invention relates to formulations that can be used to make highly conductive features below 200° C. on organic substrates. As an example, a formulation comprising 1.5 grams DMAc, 5.08 grams terpineol, 37.52 grams silver flake, 7.22 grams silver trifluoroacetate and 0.25 grams palladium trifluoroacetate was made. When heated to 185° C. for 60 minutes, the formulation produced features that had a bulk resistivity of 2.9 times the bulk resistivity of pure silver.

Example 19

As another example, a formulation comprising 8.1 grams alpha-terpineol, 78.2 grams silver flake, 3.4 grams DMAc, 9.6 grams silver trifluoroacetate and 0.5 grams palladium triflruoroacetate was made. When heated to 150° C. for 4 hours, this formulation produced features that had a bulk resistivity of 8.2 times the bulk resistivity of pure silver.

Example 20

A precursor composition was formulated by combining 0.26 grams palladium trifluoroacetate, 7.2 grams silver trifluoroacetate, 37.49 grams silver flake and 5.08 grams terpineol. This composition was fired at 185° C. for 30 minutes to yield a resistivity of 11.4 times the bulk resistivity of pure silver.

Example 21

A precursor composition was formulated by combining 1.5 grams dimethylacetimide, 5.08 grams terpineol, 37.52 grams silver flake, 7.22 grams silver trifluoroacetate and 0.25 grams palladium trifluoroacetate. This mixture was heated to 185° C. for 60 minutes to yield a resistivity of 2.9 times the bulk resistivity of pure silver.

Example 22

A paste composition was formulated by combining 0.24 grams palladium trifluoroacetate, 7.3 grams silver trifluoroacetate, 37.5 grams silver flake, 5.13 grams terpineol and 1.55 grams N-methyl-pyrolidone. This composition was heated at 185° C. for 60 minutes to yield a resistivity of 2.3 times the bulk resistivity of pure silver.

Example 23

A paste composition was formulated by combining 5.74 grams silver neodecanoate, 1.66 grams DMAc, 3.8 grams terpineol, 0.58 grams palladium trifluoroacetate and 37.37 grams silver flake. This composition was heated to 185° C. for 60 minutes to yield a resistivity of 11.9 times the bulk resistivity of pure silver.

Example 24

A paste composition was formulated by combining 35 grams silver flake, 7.55 grams silver (I) oxide and 5.35 grams terpineol. This mixture was heated to 185° C. for 60 minutes to yield a resistivity of 2.4 times the bulk resistivity of pure silver.

Example 25

A paste composition was formulated by combining 35.03 grams silver flake, 6.26 grams silver nitrite and 6.51 grams terpineol. This composition was heated to 185° C. for 60 minutes to yield a resistivity of 2.1 times the bulk resistivity of pure silver.

Example 26

A silver nanoparticle composition was formulated comprising 16.6 grams silver nanoparticles, 41.7 grams water and 41.7 grams ethylene glycol. This composition was deposited using an ink-jet and, when heated to 100° C. on paper and KAPTON-HN, formed conductive traces that were phase pure silver by XRD. This is an example of a purely particle based composition that can be deposited onto low temperature substrates such as MYLAR, paper and others.

Example 27

A silver nanoparticle composition was formulated comprising 46.7 silver nanoparticles, 17.8 grams water, 17.8 grams Ag-trifluoroacetate and 17.8 grams ethylene glycol. This composition, when deposited and heated, formed phase pure silver by XRD that was highly conductive.

Example 28

A silver nanoparticle composition was formulated comprising 35 grams ethyl alcohol and 65 grams silver nanoparticles. This composition, when heated on a glass slide at 70° C. for 4 hours, produced traces that were conductive, phase pure silver by XRD, and had a bulk resistivity of 100 times that of bulk silver. This composition produced traces that were phase pure silver by XRD. This illustrates an example of an ultra low temperature silver composition.

Example 29

A conductor ribbon structure was fabricated from a precursor composition comprised of 49.5 grams silver flake, 26 grams DMAc, 14 grams styrene allyl alcohol, 0.63 grams palladium acetate, 4.39 grams alpha-terpineol and 5.64 grams silver trifluoroacetate. When cast as a tape and dried, the material had a final composition that was 20% by weight styrene allyl alcohol. The fabricated tape could be rolled, flexed and handled without flaking of the coated material. The transferred material could also be heated below 200° C. to provide a conductor with a resistivity of not greater than 100× the bulk resistivity of silver.

A tape can be cast by taking an existing formulation and adding the proper amount of binder to the paste. For example a paste comprising 1.5 grams DMAc, 5.08 grams terpineol, 37.52 grams silver flake, 7.22 grams silver trifluoroacetate and 0.25 grams palladium trifluoroacetate, can be modified by adding a 50/50 weight percent solution of N,N-dimethylacetamide and styrene allyl alcohol such that the final dried tape has a 20% by weight styrene allyl alcohol. This mixture could then be coated onto a substrate and dried to remove the solvents. The tape could be transferred to a substrate and the transferred material could be heated below 200° C. to provide a conductor with a resistivity of not greater than 100× the bulk resistivity of silver.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for the fabrication of a conductive electronic feature on a substrate, comprising the steps of:
    (a) providing a substrate;
    (b) providing a ribbon structure comprising a tape composition on a carrier, said tape composition comprising a molecular precursor compound of a metal;
    (c) transferring said tape composition from said carrier to said substrate in a pattern of features; and
    (d) heating said transferred tape composition to a temperature of not greater than about 200° C. to convert said tape composition to a conductive feature having a resistivity of not greater than 100 times the resistivity of said metal.

2. A method as recited in claim 1, wherein said conductive feature has a minimum feature size of not greater than 100 µm.

3. A method as recited in claim 1, wherein said conductive feature has a minimum feature size of not greater than 75 µm.

4. A method as recited in claim 1, wherein said conductive feature has a minimum feature size of not greater than 50 µm.

5. A method as recited in claim 1, wherein said conductive feature has a minimum feature size of not greater than 25 µm.

6. A method as recited in claim 1, wherein said conductive feature has a minimum feature size of not greater than 10 µm.

7. A method as recited in claim 1, wherein said tape composition comprises polymer or polymer precursor, metal particles, and metal compound.

8. A method as recited in claim 1, wherein said conductor tape composition comprises metal particles.

9. A method as recited in claim 1, wherein said tape composition comprises silver particles.

10. A method as recited in claim 1, wherein said tape composition comprises copper particles.

11. A method as recited in claim 1, wherein said substrate is a polymer substrate.

12. A method as recited in claim 1, wherein said substrate is selected from the group consisting of polyfluorinated compounds, polyimides, epoxies, polycarbonate, cellulose-based materials, acetate, polyester, polyethylene, polypropylene, polyvinyl chloride, acrylonitrile, butadiene (ABS), flexible fiber board, non-woven polymeric fabric and cloth.

13. A method as recited in claim 1, wherein said substrate is a glass.

14. A method as recited in claim 1, wherein said molecular precursor compound is a silver compound.

15. A method as recited in claim 1, wherein said molecular precursor compound is a copper compound.

16. A method as recited in claim 1, wherein said transfer step comprises using pressure to initiate transfer.

17. A method as recited in claim 1, wherein said transfer step comprises melting a binder in said tape composition to initiate transfer.

18. A method as recited in claim 1, wherein said transfer step comprises a chemical reaction within said ribbon structure to initiate transfer.

19. A method as recited in claim 1, wherein said transfer step comprises generating a vapor phase within said ribbon structure to initiate transfer.

20. A method as recited in claim 1, wherein said transfer step comprises using mechanical force to initiate transfer.

21. A method as recited in claim 1, wherein said transfer step comprises using heat to initiate transfer.

22. A method as recited in claim 1, wherein a combination of physical and thermal forces are used to initiate transfer.

23. A method as recited in claim 1, wherein said conductive feature comprises a polymer and metal.

24. A method as recited in claim 23, wherein said polymer comprises polyimide.

25. A method as recited in claim 1, wherein said conductive feature comprises substantially pure metal.

26. A method as recited in claim 1, wherein said heating step comprises heating to a temperature of not greater than about 175° C.

27. A method as recited in claim 1, wherein said heating step comprises heating to a temperature of not greater than about 150° C.

28. A method as recited in claim 1, wherein said heating step comprises heating to a temperature of not greater than about 125° C.

29. A method as recited in claim 1, wherein said conductive feature has a resistivity of not greater than about 50 times the resistivity of bulk silver.

30. A method as recited in claim 1, wherein said conductive feature has a resistivity of not greater than about 10 times the resistivity of bulk silver.

31. A method as recited in claim 1, wherein said conductive feature has a resistivity of not greater than about 5 times the resistivity of bulk silver.

32. A method as recited in claim 1, wherein said conductive feature is patterned on said substrate to form a printed circuit board.

33. A method as recited in claim 1, wherein said conductive feature is patterned on said substrate to form bus lines for a flat panel display.

34. A method as recited in claim 1, wherein said conductive feature is patterned on said substrate to form under bump metallization.

35. A method for the fabrication of a conductive electronic feature on a substrate, comprising the steps of:
   (a) providing a substrate;
   (b) providing a ribbon structure comprising a tape composition on a carrier, said tape composition comprising a molecular precursor compound to a metal;
   (c) transferring said tape composition from said carrier of said substrate in a pattern of features; and
   (d) heating said transferred tape composition to a temperature of not greater than about 175° C. to convert said tape composition to a conductive feature having a resistivity of not greater than 10 times the resistivity of said metal.

36. A method for the fabrication of a conductive electronic feature on a substrate, comprising the steps of:
   (a) providing a substrate;
   (b) providing a ribbon structure comprising a tape composition on a carrier, said tape composition comprising a molecular precursor compound to a metal;
   (c) transferring said tape composition from said carrier of said substrate in a pattern of features; and
   (d) heating said transferred tape composition to a temperature of not greater than about 200° C. to convert said tape composition to a conductive feature having a resistivity of not greater than 6 times the resistivity of said metal.

37. A method as recited in claim 36, wherein said heating step comprises heating to a temperature of not greater than about 175° C.

* * * * *